(12) United States Patent
Matsumura et al.

(10) Patent No.: US 11,066,537 B2
(45) Date of Patent: *Jul. 20, 2021

(54) COMPOSITION, FILM, INFRARED CUT FILTER, SOLID IMAGE PICKUP ELEMENT, INFRARED SENSOR, CAMERA MODULE, AND NOVEL COMPOUND

(71) Applicant: FUJIFILM Corporation, Tokyo (JP)

(72) Inventors: Tokihiko Matsumura, Shizuoka (JP); Suguru Samejima, Shizuoka (JP); Shunsuke Kitajima, Shizuoka (JP); Kazutaka Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/554,359

(22) Filed: Aug. 28, 2019

(65) Prior Publication Data

US 2019/0382555 A1  Dec. 19, 2019

Related U.S. Application Data

(63) Continuation of application No. PCT/JP2018/004067, filed on Feb. 6, 2018.

(30) Foreign Application Priority Data

Mar. 2, 2017 (JP) .............................. JP2017-039706

(51) Int. Cl.
*C08K 5/3415* (2006.01)
*H04N 5/33* (2006.01)
(Continued)

(52) U.S. Cl.
CPC ............ *C08K 5/3415* (2013.01); *G02B 5/208* (2013.01); *H04N 5/33* (2013.01); *C08L 67/02* (2013.01);
(Continued)

(58) Field of Classification Search
CPC ........ C08K 5/3415; G02B 5/208; H04N 5/33; C08L 67/02; C08L 2203/16; C08L 2203/20
(Continued)

(56) References Cited

U.S. PATENT DOCUMENTS

2007/0212498 A1  9/2007  Fukushige et al.
2015/0185383 A1*  7/2015  Katoh .................... G02B 5/206
428/323

(Continued)

FOREIGN PATENT DOCUMENTS

CN  101025443 A  8/2007
CN  101154038 A  4/2008
(Continued)

OTHER PUBLICATIONS

JP 2014-240371 A, Tokiyoshi et al., Dec. 2014 (English Translation).*
(Continued)

*Primary Examiner* — William K Cheung
(74) *Attorney, Agent, or Firm* — Birch, Stewart, Kolasch & Birch, LLP

(57) ABSTRACT

A composition includes: a compound represented by Formula (1); and at least one selected from the group consisting of a curable compound and a resin. Provided are a film that is formed using the composition, an infrared cut filter, a solid image pickup element, an infrared sensor, and a camera module. Further, provided is a compound represented by Formula (1). $R^1$ and $R^2$ each independently represent a group represented by the following Formula (2) and having a SP value of 12.2 $(cal/cm^3)^{1/2}$ or higher as a whole.

(Continued)

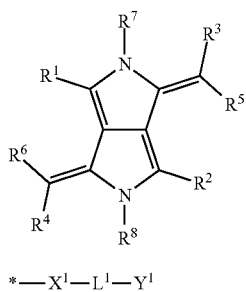

(1)

*—X¹—L¹—Y¹   (2)

17 Claims, 1 Drawing Sheet

(51) Int. Cl.
    *C08L 67/02*     (2006.01)
    *G02B 5/20*     (2006.01)

(52) U.S. Cl.
    CPC ....... *C08L 2203/16* (2013.01); *C08L 2203/20* (2013.01)

(58) Field of Classification Search
    USPC ........................................................ 524/105
    See application file for complete search history.

(56) References Cited

U.S. PATENT DOCUMENTS

| | | |
|---|---|---|
| 2016/0011336 A1 | 1/2016 | Takakuwa et al. |
| 2017/0038507 A1 | 2/2017 | Norizuki et al. |
| 2017/0137444 A1 | 5/2017 | Sasaki et al. |
| 2018/0017720 A1 | 1/2018 | Arimura et al. |
| 2018/0017722 A1 | 1/2018 | Arimura et al. |
| 2018/0136379 A1 | 5/2018 | Takashita et al. |

FOREIGN PATENT DOCUMENTS

| | | | |
|---|---|---|---|
| CN | 104662453 A | | 5/2015 |
| CN | 105051576 A | | 11/2015 |
| CN | 106461830 A | | 2/2017 |
| JP | 2011-246649 A | | 12/2011 |
| JP | 2014-240371 A | * | 12/2014 |
| JP | 2016-166284 A | | 9/2016 |
| WO | WO 2015/166873 A1 | | 11/2015 |
| WO | WO 2016/031810 A1 | | 3/2016 |
| WO | WO 2016/035695 A1 | * | 3/2016 |
| WO | WO 2016/158818 A1 | | 10/2016 |
| WO | WO 2016/158819 A1 | | 10/2016 |
| WO | WO 2017/018004 A1 | | 2/2017 |

OTHER PUBLICATIONS

Japanese Office Action for corresponding Japanese Application No. 2019-502836, dated Jan. 14, 2020, with English translation.
International Preliminary Report on Patentability and Written Opinion of the International Searching Authority(Forms PCT/IB/326, PCT/IB/373 and PCT/ISA/237), dated Sep. 12, 2019, for International Application No. PCT/JP2018/004067, with an English Translation.
International Search Report (PCT/ISA/210), dated Mar. 27, 2018, for International Application No. PCT/JP2018/004067, with an English translation.
Chinese Office Action and Search Report for corresponding Chinese Application No. 201860014563.X, dated Feb. 3, 2021, with English translation of the Office Action.

* cited by examiner

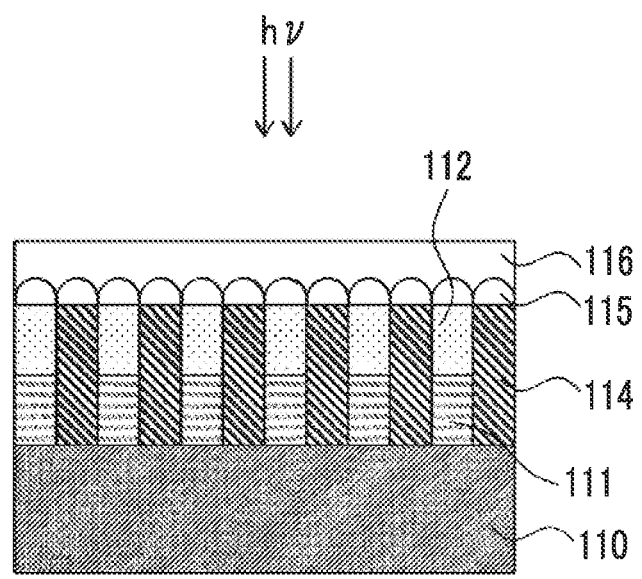

COMPOSITION, FILM, INFRARED CUT FILTER, SOLID IMAGE PICKUP ELEMENT, INFRARED SENSOR, CAMERA MODULE, AND NOVEL COMPOUND

CROSS-REFERENCE TO RELATED APPLICATIONS

This application is a Continuation of International Application No. PCT/JP2018/004067 filed on Feb. 6, 2018, which claims priority to Japanese Patent Application No. 2017-039706 filed on Mar. 2, 2017. The entire contents of these applications are incorporated herein by reference.

BACKGROUND OF THE INVENTION

1. Field of the Invention

The present disclosure relates to a composition, a film, an infrared cut filter, a solid image pickup element, an infrared sensor, a camera module, and a novel compound. The present disclosure relates to a composition, a film, an infrared cut filter, a solid image pickup element, an infrared sensor, a camera module, and a novel compound.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, visibility may be corrected using an infrared cut filter.

In addition, JP2011-246649A discloses a pigment dispersion including a pigment (A) and a pigment derivative (B), in which the pigment derivative (B) includes a compound represented by the following Formula (1).

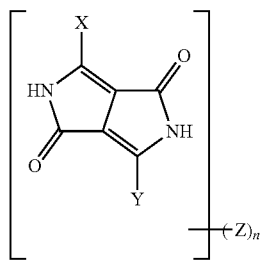

(In Formula (I), X and Y each independently represent an aromatic group which may have a substituent, an alkyl group having 1 to 5 carbon atoms which may have a substituent, an alkoxy group having 1 to 5 carbon atoms which may have a substituent, or an alkylthio group having 1 to 5 carbon atoms which may have a substituent; Z represents a sulfo group, a sulfonamide group, a sulfonate group, a phthalimidomethyl group, a dialkylaminoalkyl group having 3 to 7 carbon atoms, a hydroxyl group, a carboxy group, or a carboxylate group; and n represents 0.01 to 10)

SUMMARY OF THE INVENTION

In the related art, an infrared cut filter has been used as a flat film. Recently, it has also been considered to form a pattern on an infrared cut filter. For example, the use of a laminate in which each pixel (for example, a red pixel, a blue pixel, or a green pixel) of a color filter is formed on a pattern of an infrared cut filter has been considered.

JP2011-246649A neither describes nor implies formation of a pattern using a composition including an infrared absorbing colorant.

However, according to an investigation by the present inventors, it was found that, in a composition including an infrared absorbing colorant of the related art, the dispersibility of the infrared absorbing colorant is insufficient in many cases.

An object that is achieved by one embodiment of the present invention is to provide a composition having excellent dispersibility.

In addition, another object that is achieved by another embodiment of the present invention is to provide a film that is formed using the composition, an infrared cut filter, a solid image pickup element, an infrared sensor, and a camera module.

Further, still another object that is achieved by still another embodiment of the present invention is to provide a compound that is suitably used as an infrared absorbing colorant and has excellent dispersibility.

Means for achieving the objects include the following aspects.

<1> A composition comprising:
a compound represented by the following Formula (1); and at least one selected from the group consisting of a curable compound and a resin,

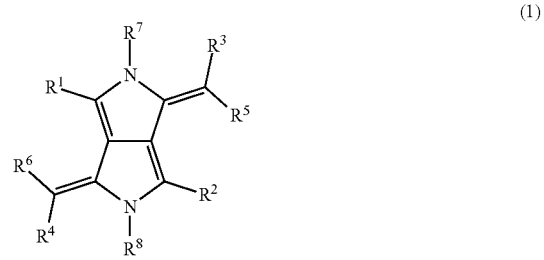

in Formula (1), $R^1$ and $R^2$ each independently represent a group represented by the following Formula (2) and having a solubility parameter of 12.2 $(cal/cm^3)^{1/2}$ or higher as a whole, $R^3$ to $R^6$ each independently represent a cyano group, an acyl group, an alkoxycarbonyl group, an alkyl group, an arylsulfinyl group, or a heteroaryl group, $R^7$ and $R^8$ each independently represent a hydrogen atom, an alkyl group, an aryl group, a heteroaryl group, $-BR^9R^{10}$, or a metal atom, at least one of $R^7$ or $R^8$ and at least one of $R^1$, . . . , or $R^4$ may form a covalent bond or a coordinate bond, $R^9$ and $R^{10}$ each independently represent a hydrogen atom, a halogen atom, an alkyl group, an aryl group, a heteroaryl group, an alkoxy group, an aryloxy group, or a heteroaryloxy group, and $R^9$ and $R^{10}$ may be bonded to each other to form a ring, and $$*-X^1-L^1-Y^1 \quad (2)$$

in Formula (2), $X^1$ represents a m-phenylene group, a p-phenylene group, a divalent fused polycyclic aromatic ring group in which two or more aromatic rings are fused, or a divalent heteroaromatic ring group, $L^1$ represents a single bond or a divalent linking group, $Y^1$ represents a polar group, and * represents a linking site to a pyrrolopyrrole ring in Formula (1).

<2> The composition according to <1>,
in which $Y^1$ represents a group having at least one structure selected from the group consisting of an N-substituted imide structure, an acid anhydride structure, a cyano group, an alkylsulfone group, an arylsulfone group, an alkylsulfoxide group, an arylsulfoxide group, an N-disubstituted sulfonamide group, and an N-disubstituted amide group.

<3> The composition according to <1> or <2>, further comprising:
a colorant derivative other than the compound represented by Formula (1).

<4> The composition according to any one of <1> to <3>, in which a viscosity at 25° C. is 1 mPa·s to 100 mPa·s.

<5> The composition according to any one of <1> to <4>, in which the compound represented by Formula (1) is in the form of particles.

<6> The composition according to <5>,
in which a volume average particle size of the compound represented by Formula (1) is 5 nm to 500 nm.

<7> The composition according to any one of <1> to <6>, comprising:
a resin having a polyester chain as the resin.

<8> The composition according to any one of <1> to <7>, comprising:
an alkali-soluble resin as the resin.

<9> The composition according to any one of <1> to <8>, comprising:
the curable compound.

<10> The composition according to <9>, further comprising:
a polymerization initiator.

<11> A film which is formed using the composition according to any one of <1> to <10>.

<12> A film that is formed by curing the composition according to <9> or <10>.

<13> An infrared cut filter comprising:
the film according to <11> or <12>.

<14> A solid image pickup element comprising:
the film according to <11> or <12>.

<15> An infrared sensor comprising:
the film according to <11> or <12>.

<16> A camera module comprising:
a solid image pickup element; and
the infrared cut filter according to <13>.

<17> A compound represented by the following Formula (1),

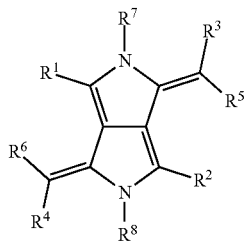

(1)

in Formula (1), $R^1$ and $R^2$ each independently represent a group represented by the following Formula (2) and having a solubility parameter of 12.2 $(cal/cm^3)^{1/2}$ or higher as a whole, $R^3$ to $R^6$ each independently represent a cyano group, an acyl group, an alkoxycarbonyl group, an alkyl group, an arylsulfinyl group, or a heteroaryl group, $R^7$ and $R^8$ each independently represent a hydrogen atom, an alkyl group, an aryl group, a heteroaryl group, $—BR^9R^{10}$, or a metal atom, at least one of $R^2$ or $R^8$ and at least one of $R^1$, ..., or $R^4$ may form a covalent bond or a coordinate bond, $R^9$ and $R^{10}$ each independently represent a hydrogen atom, a halogen atom, an alkyl group, an aryl group, a heteroaryl group, an alkoxy group, an aryloxy group, or a heteroaryloxy group, and $R^9$ and $R^{10}$ may be bonded to each other to form a ring, and

(2)

in Formula (2), $X^1$ represents a m-phenylene group, a p-phenylene group, a divalent fused polycyclic aromatic ring group in which two or more aromatic rings are fused, or a divalent heteroaromatic ring group, $L^1$ represents a single bond or a divalent linking group, $Y^1$ represents a polar group, and * represents a linking site to a pyrrolopyrrole ring in Formula (1).

One embodiment of the present invention can provide a composition having excellent dispersibility.

In addition, another embodiment of the present invention can provide a film that is formed using the composition, an infrared cut filter, a solid image pickup element, an infrared sensor, and a camera module.

Further, still another embodiment of the present invention is to provide a compound that is suitably used as an infrared absorbing colorant and has excellent dispersibility.

BRIEF DESCRIPTION OF THE DRAWINGS

FIG. 1 is a schematic diagram showing an embodiment of an infrared sensor according to the present disclosure.

DESCRIPTION OF THE PREFERRED EMBODIMENTS

Hereinafter, the details of the present disclosure will be described.

In this specification, "total solid content" denotes the total mass of all the components of a composition excluding a solvent. In addition, "solid content" refers to a component excluding a solvent as described above and, for example, may be solid or liquid at 25° C.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light generally used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, in a chemical formula, Me represents a methyl group, Et represents an ethyl group, Pr represents a propyl group, Bu represents a butyl group, Ac represents an acetyl group, Bn represents a benzyl group, and Ph represents a phenyl group.

In this specification, the term "step" denotes not only an individual step but also a step which is not clearly distinguishable from another step as long as an effect expected from the step can be achieved.

In addition, in the present disclosure, "mass %" has the same definition as "wt %", and "part(s) by mass" has the same definition as "part(s) by weight".

Further, in the present disclosure, a combination of two or more preferable aspects is a more preferable aspect.

In this specification, a weight-average molecular weight and a number-average molecular weight are defined as values in terms of polystyrene measured by gel permeation chromatography (GPC).

<Composition>

A composition according to an embodiment of the present disclosure comprises: a compound represented by the following Formula (1); and at least one selected from the group consisting of a curable compound and a resin.

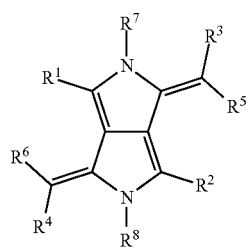
(1)

In Formula (1), $R^1$ and $R^2$ each independently represent a group represented by the following Formula (2) and having a solubility parameter of 12.2 $(cal/cm^3)^{1/2}$ or higher as a whole, $R^3$ to $R^6$ each independently represent a cyano group, an acyl group, an alkoxycarbonyl group, an alkyl group, an arylsulfinyl group, or a heteroaryl group, $R^7$ and $R^8$ each independently represent a hydrogen atom, an alkyl group, an aryl group, a heteroaryl group, $-BR^9R^{10}$, or a metal atom, at least one of $R^7$ or $R^8$ and at least one of $R^1, \ldots,$ or $R^4$ may form a covalent bond or a coordinate bond, $R^9$ and $R^{10}$ each independently represent a hydrogen atom, a halogen atom, an alkyl group, an aryl group, a heteroaryl group, an alkoxy group, an aryloxy group, or a heteroaryloxy group, and $R^9$ and $R^{10}$ may be bonded to each other to form a ring.

(2)

In Formula (2), $X^1$ represents a m-phenylene group, a p-phenylene group, a divalent fused polycyclic aromatic ring group in which two or more aromatic rings are fused, or a divalent heteroaromatic ring group, $L^1$ represents a single bond or a divalent linking group, $Y^1$ represents a polar group, and * represents a linking site to a pyrrolopyrrole ring in Formula (1).

The present inventors conducted an investigation on the composition including a pyrrolopyrrole compound and found that the dispersibility of the pyrrolopyrrole compound is improved by adding a well-known dispersant or adding a well-known dispersant and a well-known dispersing auxiliary agent (synergist). However, a sufficient result was not able to be obtained.

As a result of a thorough investigation by the present inventors, it was found that a composition having excellent dispersibility can be provided with the above-described configuration.

The action mechanism of the excellent effect is not clear but is presumed to be as follows.

It is presumed that, by introducing the group represented by Formula (2) and having a SP value of 12.2 $(cal/cm^3)^{1/2}$ or higher as a whole into the positions of $R^1$ and $R^2$ of the pyrrolopyrrole ring in Formula (1), the interactivity between the pyrrolopyrrole compound and the dispersant can be improved, the aggregation of the pyrrolopyrrole compound can be suppressed, and the dispersibility in the curable compound or the resin is excellent.

Hereinafter, each of the components of the composition according to the embodiment of the present disclosure will be described.

(Compound Represented by Formula (1))

The composition according to the embodiment of the present disclosure comprises the compound represented by Formula (1).

The compound represented by Formula (1) is a compound having a pyrrolopyrrole ring structure and is suitably used as an infrared absorbing colorant.

In addition, the compound represented by Formula (1) includes the group represented by Formula (2) and having a solubility parameter (also referred to as "SP value") of 12.2 $(cal/cm^3)^{1/2}$ or higher as a whole at the positions of $R^1$ and $R^2$ of the pyrrolopyrrole ring.

The SP value described in the present disclosure is calculated using the Okitsu method ("Journal of the Adhesion Society of Japan" 29(5) (1993) by Toshinao Okitsu).

Specifically, the SP value is calculated from the following expression. AF refers to a value described in the document.

SP Value (δ)=ΣΔF (Molar Attraction Constants)/V (Molar Volume)

From the viewpoint of dispersibility, the solubility parameter (SP value) of $R^1$ and $R^2$ as a whole is preferably 12.3 $(cal/cm^3)^{1/2}$ to 17.0 $(cal/cm^3)^{1/2}$, more preferably 12.5 $(cal/cm^3)^{1/2}$ to 16.0 $(cal/cm^3)^{1/2}$, and still more preferably 13.2 $(cal/cm^3)^{1/2}$ to 15.0 $(cal/cm^3)^{1/2}$.

In addition, $R^1$ and $R^2$ each independently represent a group represented by Formula (2).

In Formula (2), $X^1$ represents a m-phenylene group, a p-phenylene group, a divalent fused polycyclic aromatic ring group in which two or more aromatic rings are fused, or a divalent heteroaromatic ring group, $L^1$ represents a single bond or a divalent linking group, $Y^1$ represents a polar group, and * represents a linking site to a pyrrolopyrrole ring in Formula (1).

From the viewpoint of dispersibility, $X^1$ represents preferably a m-phenylene group, a p-phenylene group, a naphthylene group, a furandiyl group, or a thiophenediyl group, more preferably a m-phenylene group, a p-phenylene group, or a naphthylene group, still more preferably a m-phenylene group or a p-phenylene group, and still more preferably a p-phenylene group.

From the viewpoint of dispersibility, it is preferable that $L^1$ represents a divalent linking group.

From the viewpoint of dispersibility, the number of carbon atoms in the divalent linking group represented by $L^1$ is preferably 1 to 30, more preferably 1 to 20, and still more preferably 1 to 10.

In addition, from the viewpoint of dispersibility, it is preferable that the divalent linking group represented by $L^1$ is an alkylene group, an ester bond, or a group including a combination of two or more structures selected from the group consisting of an alkylene group, an ester bond, an ether bond, and an arylene group.

Further, from the viewpoint of dispersibility, the divalent linking group represented by $L^1$ is preferably a group having an oxygen atom, more preferably a group having at least one structure selected from the group consisting of an ester bond and an ether bond, and still more preferably a group having an ester bond.

From the viewpoint of dispersibility, $Y^1$ represents preferably a group having at least one structure selected from the group consisting of an imide structure, an acid anhydride structure, a cyano group, an alkylsulfone group, an arylsulfone group, an alkylsulfoxide group, an arylsulfoxide group, a sulfonamide group, an amido group, a urethane group, a urea group, and a hydroxy group, more preferably a group having at least one structure selected from the group consisting of an imide structure, an acid anhydride structure, a cyano group, an alkylsulfone group, an arylsulfone group, an alkylsulfoxide group, an arylsulfoxide group, a sulfonamide group, an amido group, a urethane group, and a urea group, still more preferably an N-substituted imide structure, an acid anhydride structure, a cyano group, an alkylsulfone group, an arylsulfone group, an alkylsulfoxide group, an arylsulfoxide group, an N-disubstituted sulfonamide group, and an N-disubstituted amide group, still more preferably a group having at least one structure selected from the group consisting of an N-substituted imide structure, an N-disubstituted sulfonamide group, and an N-disubstituted amide group, and most preferably a group having an N-substituted imide structure.

In addition, it is preferable that $Y^1$ does not have an acidic group, a basic group, or a group having a salt structure described below regarding a colorant derivative.

In addition, from the viewpoint of dispersibility, $Y^1$ represents preferably a group represented by any one of the following Formulae Y-1 to Y-14, more preferably a group represented by any one of the following Formulae Y-1 to Y-8, still more preferably a group represented by any one of the following Formulae Y-1 to Y-3, still more preferably a group represented by the following Formula Y-1 or Y-2, and most preferably a group represented by the following Formula Y-1.

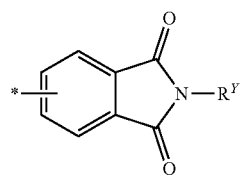

Y-1

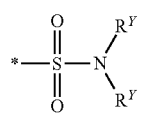

Y-2

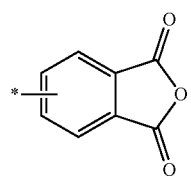

Y-3

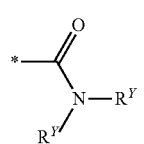

Y-4

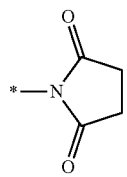

Y-5

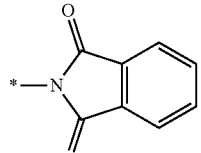

Y-6

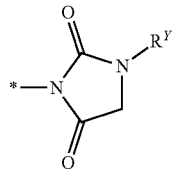

Y-7

*—CN

Y-8

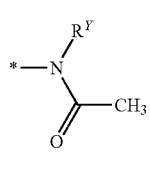

Y-9

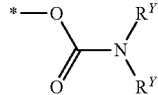

Y-10

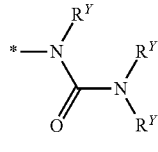

Y-11

*—OH

Y-12

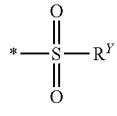

Y-13

Y-14

In Formulae Y-1 to Y-14, $R^Y$'s each independently represent a hydrogen atom, an alkyl group, or an aryl group, in a case where two or more $R^Y$'s are present in one Formula, two $R^Y$'s may form a ring through an alkylene group or an alkylene group-O-alkylene group, and * represents a linking site to a $L^1$ in Formula (2).

From the viewpoint of dispersibility, $R^Y$ represents preferably an alkyl group or an aryl group, more preferably an alkyl group, still more preferably an alkyl group having 1 to 8 carbon atoms, and still more preferably a methyl group.

Specific preferable examples of $R^1$ and $R^2$ include the following groups. * represents a binding site to a pyrrolopyrrole ring.

A-1
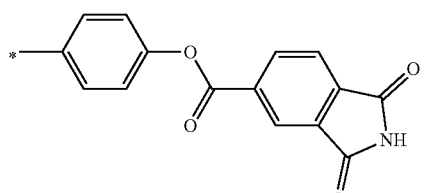
SP Value: 17.0 (cal/cm$^3$)$^{1/2}$

A-2
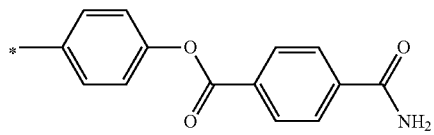
SP Value: 13.06 (cal/cm$^3$)$^{1/2}$

A-3
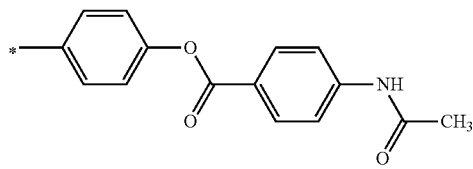
SP Value: 13.19 (cal/cm$^3$)$^{1/2}$

A-4
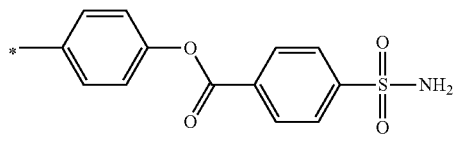
SP Value: 15.22 (cal/cm$^3$)$^{1/2}$

A-5
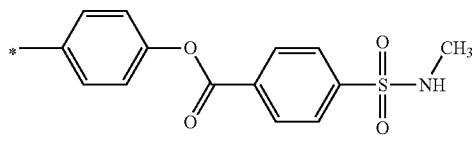
SP Value: 13.94 (cal/cm$^3$)$^{1/2}$

A-6
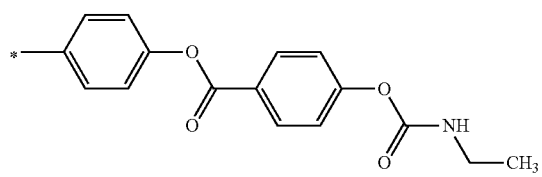
SP Value: 12.89 (cal/cm$^3$)$^{1/2}$

A-7
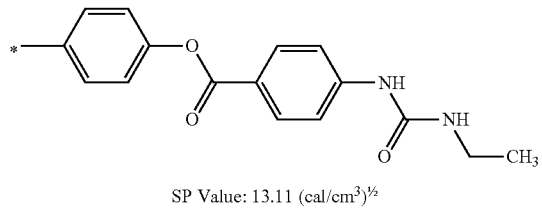
SP Value: 13.11 (cal/cm$^3$)$^{1/2}$

-continued

A-8
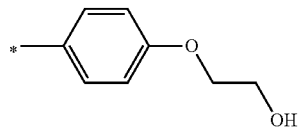
SP Value: 12.72 (cal/cm$^3$)$^{1/2}$

A-9
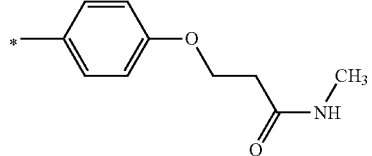
SP Value: 12.64 (cal/cm$^3$)$^{1/2}$

A-10
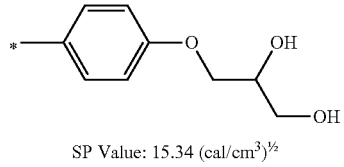
SP Value: 15.34 (cal/cm$^3$)$^{1/2}$

A-11
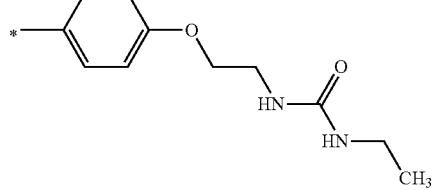
SP Value: 12.64 (cal/cm$^3$)$^{1/2}$

A-12
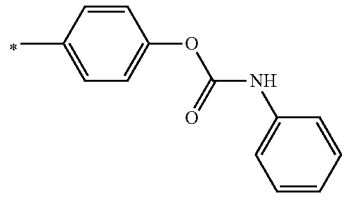
SP Value: 13.74 (cal/cm$^3$)$^{1/2}$

A-13
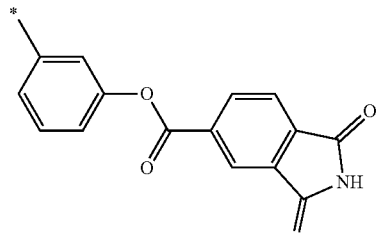
SP Value: 17.0 (cal/cm$^3$)$^{1/2}$

A-14
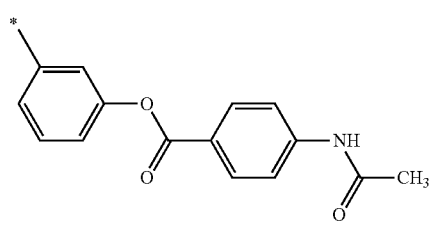
SP Value: 13.19 (cal/cm$^3$)$^{1/2}$

A-15
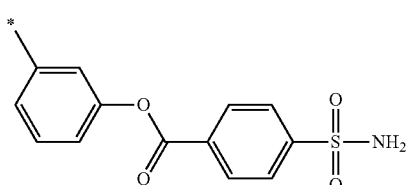
SP Value: 15.22 (cal/cm$^3$)$^{1/2}$
A-16
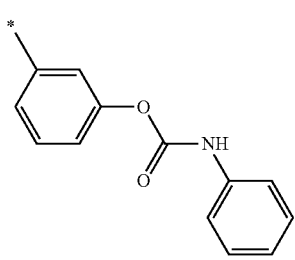
SP Value: 13.73 (cal/cm$^3$)$^{1/2}$
A-17
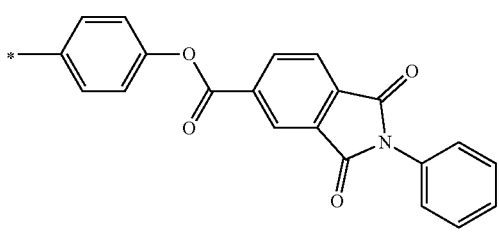
SP Value: 14.50 (cal/cm$^3$)$^{1/2}$
A-18
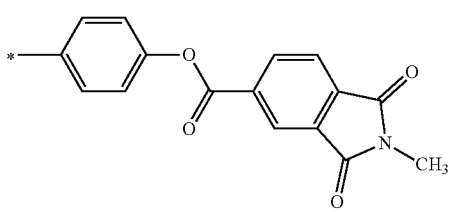
SP Value: 14.84 (cal/cm$^3$)$^{1/2}$
A-19
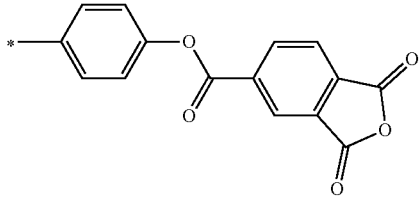
SP Value: 14.63 (cal/cm$^3$)$^{1/2}$
A-20
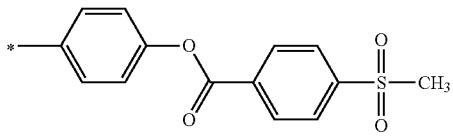
SP Value: 13.61 (cal/cm$^3$)$^{1/2}$
A-21
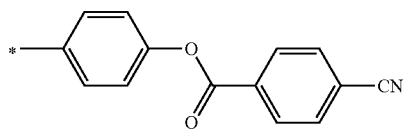
SP Value: 12.50 (cal/cm$^3$)$^{1/2}$
A-22
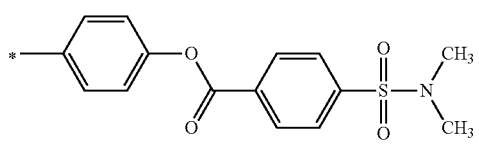
SP Value: 13.40 (cal/cm$^3$)$^{1/2}$
A-23
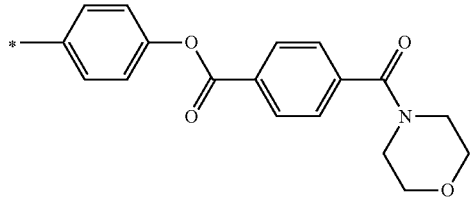
SP Value: 12.50 (cal/cm$^3$)$^{1/2}$
A-24
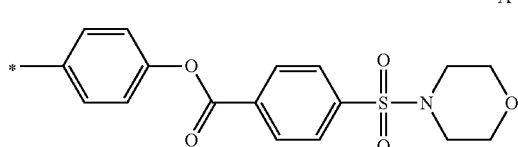
SP Value: 14.04 (cal/cm$^3$)$^{1/2}$
A-25
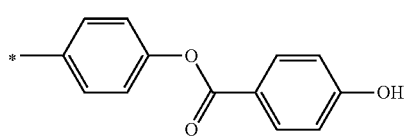
SP Value: 12.22 (cal/cm$^3$)$^{1/2}$
A-26
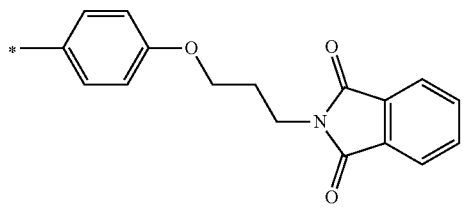
SP Value: 12.99 (cal/cm$^3$)$^{1/2}$
A-27
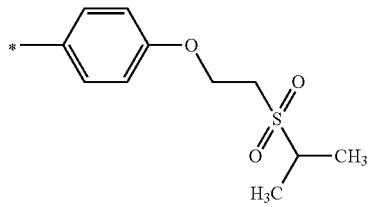
SP Value: 12.96 (cal/cm$^3$)$^{1/2}$ A-28
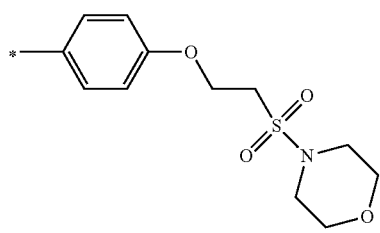
SP Value: 13.77 (cal/cm³)^½
A-29
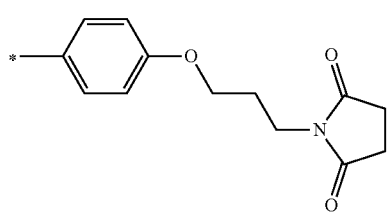
SP Value: 12.90 (cal/cm³)^½
A-30
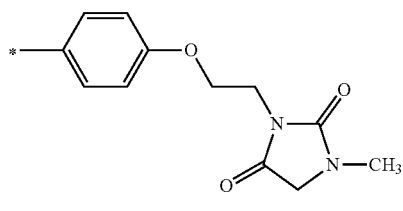
SP Value: 13.96 (cal/cm³)^½
A-31
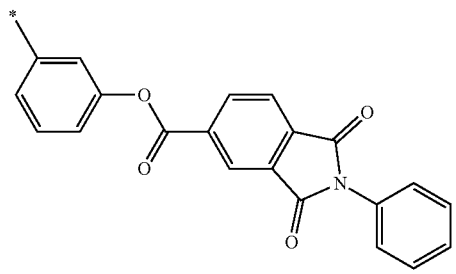
SP Value: 14.50 (cal/cm³)^½
A-32
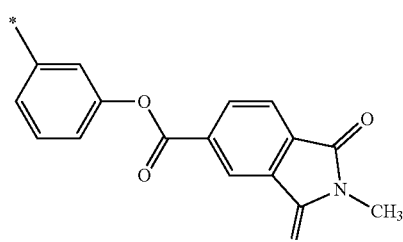
SP Value: 14.84 (cal/cm³)^½
A-33
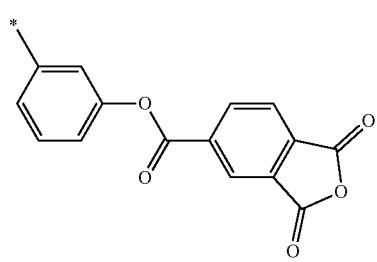
SP Value: 14.63 (cal/cm³)^½
A-34
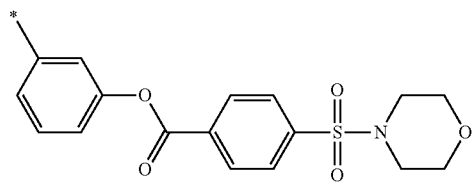
SP Value: 14.04 (cal/cm³)^½
A-35
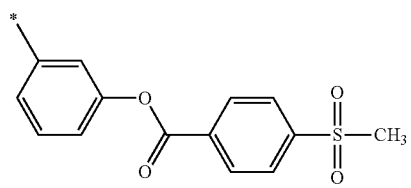
SP Value: 12.60 (cal/cm³)^½
A-36
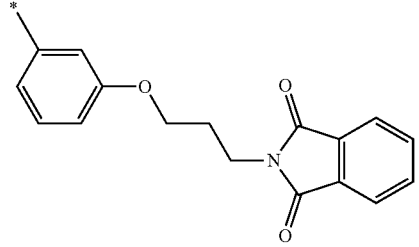
SP Value: 12.99 (cal/cm³)^½
A-37
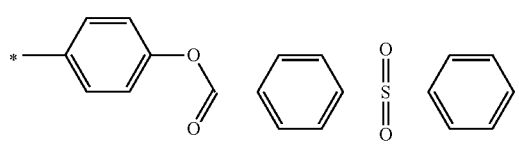
SP Value: 13.52 (cal/cm³)^½
A-38
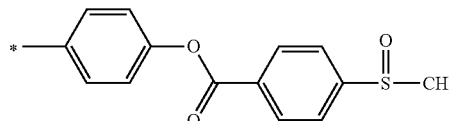
SP Value: 12.60 (cal/cm³)^½

-continued

A-39

SP Value: 12.68 (cal/cm³)^½

A-40

SP Value: 12.61 (cal/cm³)^½

In Formula (1), from the viewpoint of infrared absorbing properties, it is preferable that $R^3$ to $R^6$ each independently represent a cyano group or a heteroaryl group.

From the viewpoint of infrared absorbing properties, it is more preferable that two of $R^3$ to $R^6$ represent a cyano group and $R^5$ and $R^6$ represent a cyano group.

In addition, from the viewpoint of infrared absorbing properties, it is more preferable that two of $R^3$ to $R^6$ represent a heteroaryl group and $R^3$ and $R^4$ represent a heteroaryl group.

From the viewpoint of infrared absorbing properties, it is preferable that at least a nitrogen atom is included as the heteroaryl group represented by $R^3$ to $R^6$.

In addition, from the viewpoint of infrared absorbing properties, the heteroaryl group represented by $R^3$ to $R^6$ is preferably a heteroaryl group in which a benzene ring or a naphthalene ring is fused to a heteroaryl ring and more preferably a heteroaryl group in which a benzene ring is fused to a heteroaryl ring.

Further, the heteroaryl ring in the heteroaryl group represented by $R^3$ to $R^6$ is preferably a 5-membered ring or a 6-membered ring, more preferably an oxazole ring, a thiazole ring, a pyridine ring, a pyrimidine ring, or a pyrazine ring, and still more preferably an oxazole ring, a thiazole ring, or a pyrazine ring.

Preferable examples of the heteroaryl group represented by $R^3$ to $R^6$ include the following groups. * represents a binding site to a carbon-carbon double bond in Formula (1).

B-1

B-2

B-3

B-4

B-5

B-6

B-7

B-8 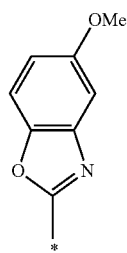
B-9 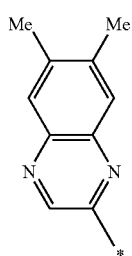 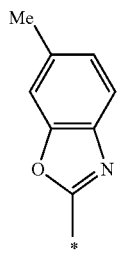
B-10 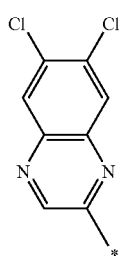 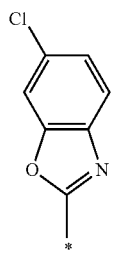
B-11 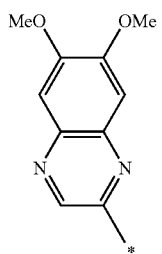 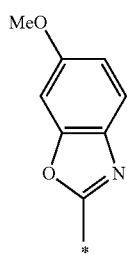
B-12 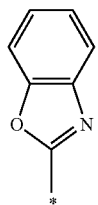 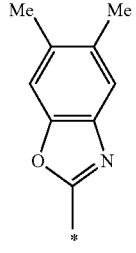
B-13 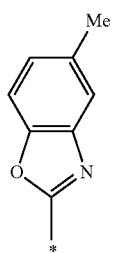
B-19 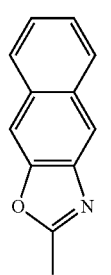
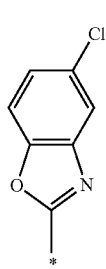

B-19 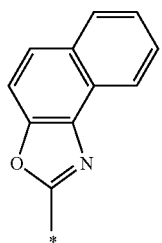
B-20 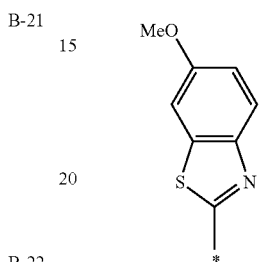
B-21 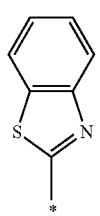
B-22 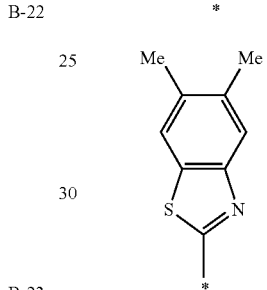
B-23 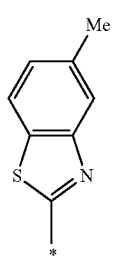
B-24 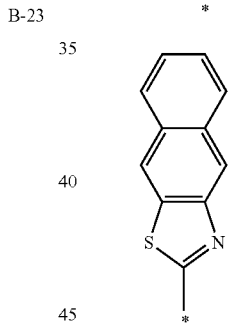
B-25 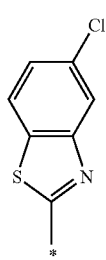
B-29 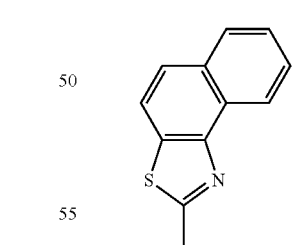
B-30 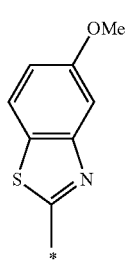
B-31 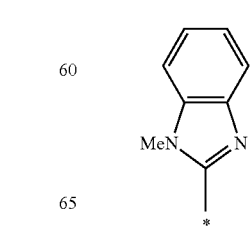
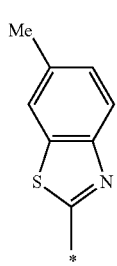

Specific preferable examples of $R^7$ and $R^8$ include the following groups. * represents a binding site to a nitrogen atom in Formula (1).

From the viewpoints infrared absorbing properties and dispersibility, $R^7$ and $R^8$ each independently represent preferably an alkyl group, an aryl group, a heteroaryl group, or —$BR^9R^{10}$, and more preferably —$BR^9R^{10}$.

From the viewpoints infrared absorbing properties and dispersibility, $R^9$ and $R^{10}$ each independently represent preferably a halogen atom, an alkyl group, an aryl group, or an aryloxy group and more preferably an aryl group.

In addition, it is preferable that $R^9$ and $R^{10}$ represent the same group.

In addition, preferable examples of the compound represented by Formula (1) used in the present disclosure include the following compound group. However, it is needless to say that the present disclosure is not limited to these examples.

In the compounds shown in Tables 1 to 4, $R^5$ and $R^6$ in Formula (1) represent a cyano group.

In addition, in Tables 1 to 4, A-1 to A-36, B-1 to B-38, and C-1 and C-7 represent the same groups as described above.

TABLE 1

| Compound | $R^1$ and $R^2$ | $R^3$ | $R^4$ | $R^7$ and $R^8$ |
|---|---|---|---|---|
| 1-1 | A-1 | B-1 | B-1 | C-1 |
| 1-2 | A-3 | B-1 | B-1 | C-1 |

TABLE 1-continued

| Compound | $R^1$ and $R^2$ | $R^3$ | $R^4$ | $R^7$ and $R^8$ |
|---|---|---|---|---|
| 1-3 | A-4 | B-1 | B-1 | C-1 |
| 1-4 | A-12 | B-1 | B-1 | C-1 |
| 1-5 | A-13 | B-1 | B-1 | C-1 |
| 1-6 | A-16 | B-1 | B-1 | C-1 |
| 1-7 | A-17 | B-1 | B-1 | C-1 |
| 1-8 | A-18 | B-1 | B-1 | C-1 |
| 1-9 | A-19 | B-1 | B-1 | C-1 |
| 1-10 | A-24 | B-1 | B-1 | C-1 |
| 1-11 | A-25 | B-1 | B-1 | C-1 |
| 1-12 | A-26 | B-1 | B-1 | C-1 |
| 1-13 | A-28 | B-1 | B-1 | C-1 |
| 1-14 | A-31 | B-1 | B-1 | C-1 |
| 1-15 | A-32 | B-1 | B-1 | C-1 |
| 1-16 | A-34 | B-1 | B-1 | C-1 |
| 1-17 | A-1 | B-2 | B-2 | C-1 |
| 1-18 | A-3 | B-2 | B-2 | C-1 |
| 1-19 | A-18 | B-2 | B-2 | C-1 |
| 1-20 | A-32 | B-2 | B-2 | C-1 |
| 1-21 | A-1 | B-3 | B-3 | C-1 |
| 1-22 | A-3 | B-3 | B-3 | C-1 |
| 1-23 | A-4 | B-3 | B-3 | C-1 |
| 1-24 | A-12 | B-3 | B-3 | C-1 |
| 1-25 | A-13 | B-3 | B-3 | C-1 |
| 1-26 | A-16 | B-3 | B-3 | C-1 |
| 1-27 | A-17 | B-3 | B-3 | C-1 |
| 1-28 | A-18 | B-3 | B-3 | C-1 |
| 1-29 | A-19 | B-3 | B-3 | C-1 |
| 1-30 | A-24 | B-3 | B-3 | C-1 |
| 1-31 | A-25 | B-3 | B-3 | C-1 |
| 1-32 | A-26 | B-3 | B-3 | C-1 |
| 1-33 | A-28 | B-3 | B-3 | C-1 |
| 1-34 | A-31 | B-3 | B-3 | C-1 |
| 1-35 | A-32 | B-3 | B-3 | C-1 |
| 1-36 | A-34 | B-3 | B-3 | C-1 |
| 1-37 | A-1 | B-4 | B-4 | C-1 |
| 1-38 | A-3 | B-4 | B-4 | C-1 |
| 1-39 | A-4 | B-4 | B-4 | C-1 |
| 1-40 | A-12 | B-4 | B-4 | C-1 |
| 1-41 | A-13 | B-4 | B-4 | C-1 |
| 1-42 | A-16 | B-4 | B-4 | C-1 |
| 1-43 | A-17 | B-4 | B-4 | C-1 |
| 1-44 | A-18 | B-4 | B-4 | C-1 |
| 1-45 | A-19 | B-4 | B-4 | C-1 |
| 1-46 | A-24 | B-4 | B-4 | C-1 |
| 1-47 | A-25 | B-4 | B-4 | C-1 |
| 1-48 | A-26 | B-4 | B-4 | C-1 |
| 1-49 | A-28 | B-4 | B-4 | C-1 |
| 1-50 | A-31 | B-4 | B-4 | C-1 |
| 1-51 | A-32 | B-4 | B-4 | C-1 |
| 1-52 | A-34 | B-4 | B-4 | C-1 |
| 1-53 | A-1 | B-5 | B-5 | C-1 |
| 1-54 | A-3 | B-5 | B-5 | C-1 |
| 1-55 | A-18 | B-5 | B-5 | C-1 |
| 1-56 | A-32 | B-5 | B-5 | C-1 |
| 1-57 | A-1 | B-6 | B-6 | C-1 |
| 1-58 | A-3 | B-6 | B-6 | C-1 |
| 1-59 | A-18 | B-6 | B-6 | C-1 |
| 1-60 | A-32 | B-6 | B-6 | C-1 |
| 1-61 | A-1 | B-7 | B-7 | C-1 |
| 1-62 | A-3 | B-7 | B-7 | C-1 |
| 1-63 | A-18 | B-7 | B-7 | C-1 |
| 1-64 | A-32 | B-7 | B-7 | C-1 |
| 1-65 | A-1 | B-8 | B-8 | C-1 |
| 1-66 | A-3 | B-8 | B-8 | C-1 |
| 1-67 | A-18 | B-8 | B-8 | C-1 |
| 1-68 | A-32 | B-8 | B-8 | C-1 |
| 1-69 | A-1 | B-9 | B-9 | C-1 |
| 1-70 | A-2 | B-9 | B-9 | C-1 |
| 1-71 | A-3 | B-9 | B-9 | C-1 |
| 1-72 | A-4 | B-9 | B-9 | C-1 |
| 1-73 | A-5 | B-9 | B-9 | C-1 |
| 1-74 | A-6 | B-9 | B-9 | C-1 |
| 1-75 | A-7 | B-9 | B-9 | C-1 |
| 1-76 | A-8 | B-9 | B-9 | C-1 |
| 1-77 | A-9 | B-9 | B-9 | C-1 |
| 1-78 | A-10 | B-9 | B-9 | C-1 |
| 1-79 | A-11 | B-9 | B-9 | C-1 |
| 1-80 | A-12 | B-9 | B-9 | C-1 |
| 1-81 | A-13 | B-9 | B-9 | C-1 |
| 1-82 | A-14 | B-9 | B-9 | C-1 |
| 1-83 | A-15 | B-9 | B-9 | C-1 |
| 1-84 | A-16 | B-9 | B-9 | C-1 |
| 1-85 | A-17 | B-9 | B-9 | C-1 |
| 1-86 | A-18 | B-9 | B-9 | C-1 |
| 1-87 | A-19 | B-9 | B-9 | C-1 |
| 1-88 | A-20 | B-9 | B-9 | C-1 |
| 1-89 | A-21 | B-9 | B-9 | C-1 |
| 1-90 | A-22 | B-9 | B-9 | C-1 |
| 1-91 | A-23 | B-9 | B-9 | C-1 |
| 1-92 | A-24 | B-9 | B-9 | C-1 |
| 1-93 | A-25 | B-9 | B-9 | C-1 |
| 1-94 | A-26 | B-9 | B-9 | C-1 |
| 1-95 | A-27 | B-9 | B-9 | C-1 |
| 1-96 | A-28 | B-9 | B-9 | C-1 |
| 1-97 | A-29 | B-9 | B-9 | C-1 |
| 1-98 | A-30 | B-9 | B-9 | C-1 |
| 1-99 | A-31 | B-9 | B-9 | C-1 |
| 1-100 | A-32 | B-9 | B-9 | C-1 |
| 1-101 | A-33 | B-9 | B-9 | C-1 |
| 1-102 | A-34 | B-9 | B-9 | C-1 |
| 1-103 | A-35 | B-9 | B-9 | C-1 |
| 1-104 | A-36 | B-9 | B-9 | C-1 |

TABLE 2

| Compound | $R^1$ and $R^2$ | $R^3$ | $R^4$ | $R^7$ and $R^8$ |
|---|---|---|---|---|
| 1-105 | A-1 | B-10 | B-10 | C-1 |
| 1-106 | A-3 | B-10 | B-10 | C-1 |
| 1-107 | A-18 | B-10 | B-10 | C-1 |
| 1-108 | A-32 | B-10 | B-10 | C-1 |
| 1-109 | A-1 | B-11 | B-11 | C-1 |
| 1-110 | A-2 | B-11 | B-11 | C-1 |
| 1-111 | A-3 | B-11 | B-11 | C-1 |
| 1-112 | A-4 | B-11 | B-11 | C-1 |
| 1-113 | A-5 | B-11 | B-11 | C-1 |
| 1-114 | A-6 | B-11 | B-11 | C-1 |
| 1-115 | A-7 | B-11 | B-11 | C-1 |
| 1-116 | A-8 | B-11 | B-11 | C-1 |
| 1-117 | A-9 | B-11 | B-11 | C-1 |
| 1-118 | A-10 | B-11 | B-11 | C-1 |
| 1-119 | A-11 | B-11 | B-11 | C-1 |
| 1-120 | A-12 | B-11 | B-11 | C-1 |
| 1-121 | A-13 | B-11 | B-11 | C-1 |
| 1-122 | A-14 | B-11 | B-11 | C-1 |
| 1-123 | A-15 | B-11 | B-11 | C-1 |
| 1-124 | A-16 | B-11 | B-11 | C-1 |
| 1-125 | A-17 | B-11 | B-11 | C-1 |
| 1-126 | A-18 | B-11 | B-11 | C-1 |
| 1-127 | A-19 | B-11 | B-11 | C-1 |
| 1-128 | A-20 | B-11 | B-11 | C-1 |
| 1-129 | A-21 | B-11 | B-11 | C-1 |
| 1-130 | A-22 | B-11 | B-11 | C-1 |
| 1-131 | A-23 | B-11 | B-11 | C-1 |
| 1-132 | A-24 | B-11 | B-11 | C-1 |
| 1-133 | A-25 | B-11 | B-11 | C-1 |
| 1-134 | A-26 | B-11 | B-11 | C-1 |
| 1-135 | A-27 | B-11 | B-11 | C-1 |
| 1-136 | A-28 | B-11 | B-11 | C-1 |
| 1-137 | A-29 | B-11 | B-11 | C-1 |
| 1-138 | A-30 | B-11 | B-11 | C-1 |
| 1-139 | A-31 | B-11 | B-11 | C-1 |
| 1-140 | A-32 | B-11 | B-11 | C-1 |
| 1-141 | A-33 | B-11 | B-11 | C-1 |
| 1-142 | A-34 | B-11 | B-11 | C-1 |
| 1-143 | A-35 | B-11 | B-11 | C-1 |
| 1-144 | A-36 | B-11 | B-11 | C-1 |
| 1-145 | A-1 | B-12 | B-12 | C-1 |
| 1-146 | A-2 | B-12 | B-12 | C-1 |
| 1-147 | A-3 | B-12 | B-12 | C-1 |
| 1-148 | A-4 | B-12 | B-12 | C-1 |
| 1-149 | A-5 | B-12 | B-12 | C-1 |
| 1-150 | A-6 | B-12 | B-12 | C-1 |

TABLE 2-continued

| Compound | R¹ and R² | R³ | R⁴ | R⁷ and R⁸ |
|---|---|---|---|---|
| 1-151 | A-7 | B-12 | B-12 | C-1 |
| 1-152 | A-8 | B-12 | B-12 | C-1 |
| 1-153 | A-9 | B-12 | B-12 | C-1 |
| 1-154 | A-10 | B-12 | B-12 | C-1 |
| 1-155 | A-11 | B-12 | B-12 | C-1 |
| 1-156 | A-12 | B-12 | B-12 | C-1 |
| 1-157 | A-13 | B-12 | B-12 | C-1 |
| 1-158 | A-14 | B-12 | B-12 | C-1 |
| 1-159 | A-15 | B-12 | B-12 | C-1 |
| 1-160 | A-16 | B-12 | B-12 | C-1 |
| 1-161 | A-17 | B-12 | B-12 | C-1 |
| 1-162 | A-18 | B-12 | B-12 | C-I |
| 1-163 | A-19 | B-12 | B-12 | C-1 |
| 1-164 | A-20 | B-12 | B-12 | C-1 |
| 1-165 | A-21 | B-12 | B-12 | C-1 |
| 1-166 | A-22 | B-12 | B-12 | C-1 |
| 1-167 | A-23 | B-12 | B-12 | C-1 |
| 1-168 | A-24 | B-12 | B-12 | C-1 |
| 1-169 | A-25 | B-12 | B-12 | C-1 |
| 1-170 | A-26 | B-12 | B-12 | C-1 |
| 1-171 | A-27 | B-12 | B-12 | C-1 |
| 1-172 | A-28 | B-12 | B-12 | C-1 |
| 1-173 | A-29 | B-12 | B-12 | C-1 |
| 1-174 | A-30 | B-12 | B-12 | C-1 |
| 1-175 | A-31 | B-12 | B-12 | C-1 |
| 1-176 | A-32 | B-12 | B-12 | C-1 |
| 1-177 | A-33 | B-12 | B-12 | C-1 |
| 1-178 | A-34 | B-12 | B-12 | C-1 |
| 1-179 | A-35 | B-12 | B-12 | C-1 |
| 1-180 | A-36 | B-12 | B-12 | C-1 |
| 1-181 | A-1 | B-13 | B-13 | C-1 |
| 1-182 | A-3 | B-13 | B-13 | C-1 |
| 1-183 | A-18 | B-13 | B-13 | C-1 |
| 1-184 | A-32 | B-13 | B-13 | C-1 |
| 1-185 | A-1 | B-14 | B-14 | C-1 |
| 1-186 | A-3 | B-14 | B-14 | C-1 |
| 1-187 | A-18 | B-14 | B-14 | C-1 |
| 1-188 | A-32 | B-14 | B-14 | C-1 |
| 1-189 | A-1 | B-14 | B-14 | C-1 |
| 1-190 | A-3 | B-14 | B-14 | C-1 |
| 1-191 | A-18 | B-14 | B-14 | C-1 |
| 1-192 | A-32 | B-14 | B-14 | C-1 |
| 1-193 | A-1 | B-14 | B-14 | C-1 |
| 1-194 | A-3 | B-14 | B-14 | C-1 |
| 1-195 | A-18 | B-14 | B-14 | C-1 |
| 1-196 | A-32 | B-14 | B-14 | C-1 |
| 1-197 | A-1 | B-15 | B-15 | C-1 |
| 1-198 | A-3 | B-15 | B-15 | C-1 |
| 1-199 | A-18 | B-15 | B-15 | C-1 |
| 1-200 | A-32 | B-15 | B-15 | C-1 |
| 1-201 | A-1 | B-16 | B-16 | C-1 |
| 1-202 | A-3 | B-16 | B-16 | C-1 |
| 1-203 | A-18 | B-16 | B-16 | C-1 |
| 1-204 | A-32 | B-16 | B-16 | C-1 |
| 1-205 | A-1 | B-17 | B-17 | C-1 |
| 1-206 | A-3 | B-17 | B-17 | C-1 |
| 1-207 | A-18 | B-17 | B-17 | C-1 |
| 1-208 | A-32 | B-17 | B-17 | C-1 |

TABLE 3

| Compound | R¹ and R² | R³ | R⁴ | R⁷ and R⁸ |
|---|---|---|---|---|
| 1-209 | A-1 | B-18 | B-18 | C-1 |
| 1-210 | A-3 | B-18 | B-18 | C-1 |
| 1-211 | A-18 | B-18 | B-18 | C-1 |
| 1-212 | A-32 | B-18 | B-18 | C-1 |
| 1-213 | A-1 | B-19 | B-19 | C-1 |
| 1-214 | A-3 | B-19 | B-19 | C-1 |
| 1-215 | A-18 | B-19 | B-19 | C-1 |
| 1-216 | A-32 | B-19 | B-19 | C-1 |
| 1-217 | A-1 | B-20 | B-20 | C-1 |
| 1-218 | A-3 | B-20 | B-20 | C-1 |
| 1-219 | A-18 | B-20 | B-20 | C-1 |
| 1-220 | A-32 | B-20 | B-20 | C-1 |

TABLE 3-continued

| Compound | R¹ and R² | R³ | R⁴ | R⁷ and R⁸ |
|---|---|---|---|---|
| 1-221 | A-1 | B-21 | B-21 | C-1 |
| 1-222 | A-3 | B-21 | B-21 | C-1 |
| 1-223 | A-4 | B-21 | B-21 | C-1 |
| 1-224 | A-12 | B-21 | B-21 | C-1 |
| 1-225 | A-13 | B-21 | B-21 | C-1 |
| 1-226 | A-16 | B-21 | B-21 | C-1 |
| 1-227 | A-17 | B-21 | B-21 | C-1 |
| 1-228 | A-18 | B-21 | B-21 | C-1 |
| 1-229 | A-19 | B-21 | B-21 | C-1 |
| 1-230 | A-24 | B-21 | B-21 | C-1 |
| 1-231 | A-25 | B-21 | B-21 | C-1 |
| 1-232 | A-26 | B-21 | B-21 | C-1 |
| 1-233 | A-28 | B-21 | B-21 | C-1 |
| 1-234 | A-31 | B-21 | B-21 | C-1 |
| 1-235 | A-32 | B-21 | B-21 | C-1 |
| 1-236 | A-34 | B-21 | B-21 | C-1 |
| 1-237 | A-1 | B-22 | B-22 | C-1 |
| 1-238 | A-3 | B-22 | B-22 | C-1 |
| 1-239 | A-18 | B-22 | B-22 | C-1 |
| 1-240 | A-32 | B-22 | B-22 | C-1 |
| 1-241 | A-1 | B-23 | B-23 | C-1 |
| 1-242 | A-3 | B-23 | B-23 | C-1 |
| 1-243 | A-18 | B-23 | B-23 | C-1 |
| 1-244 | A-32 | B-23 | B-23 | C-1 |
| 1-245 | A-1 | B-24 | B-24 | C-1 |
| 1-246 | A-2 | B-24 | B-24 | C-1 |
| 1-247 | A-3 | B-24 | B-24 | C-1 |
| 1-248 | A-4 | B-24 | B-24 | C-1 |
| 1-249 | A-5 | B-24 | B-24 | C-1 |
| 1-250 | A-6 | B-24 | B-24 | C-1 |
| 1-251 | A-7 | B-24 | B-24 | C-1 |
| 1-252 | A-8 | B-24 | B-24 | C-1 |
| 1-253 | A-9 | B-24 | B-24 | C-1 |
| 1-254 | A-10 | B-24 | B-24 | C-1 |
| 1-255 | A-11 | B-24 | B-24 | C-1 |
| 1-256 | A-12 | B-24 | B-24 | C-1 |
| 1-257 | A-13 | B-24 | B-24 | C-1 |
| 1-258 | A-14 | B-24 | B-24 | C-1 |
| 1-259 | A-15 | B-24 | B-24 | C-1 |
| 1-260 | A-16 | B-24 | B-24 | C-1 |
| 1-261 | A-17 | B-24 | B-24 | C-1 |
| 1-262 | A-18 | B-24 | B-24 | C-1 |
| 1-263 | A-19 | B-24 | B-24 | C-1 |
| 1-264 | A-20 | B-24 | B-24 | C-1 |
| 1-265 | A-21 | B-24 | B-24 | C-1 |
| 1-266 | A-22 | B-24 | B-24 | C-1 |
| 1-267 | A-23 | B-24 | B-24 | C-1 |
| 1-268 | A-24 | B-24 | B-24 | C-1 |
| 1-269 | A-25 | B-24 | B-24 | C-1 |
| 1-270 | A-26 | B-24 | B-24 | C-1 |
| 1-271 | A-27 | B-24 | B-24 | C-1 |
| 1-272 | A-28 | B-24 | B-24 | C-1 |
| 1-273 | A-29 | B-24 | B-24 | C-1 |
| 1-274 | A-30 | B-24 | B-24 | C-1 |
| 1-275 | A-31 | B-24 | B-24 | C-1 |
| 1-276 | A-32 | B-24 | B-24 | C-1 |
| 1-277 | A-33 | B-24 | B-24 | C-1 |
| 1-278 | A-34 | B-24 | B-24 | C-1 |
| 1-279 | A-35 | B-24 | B-24 | C-1 |
| 1-280 | A-36 | B-24 | B-24 | C-1 |
| 1-281 | A-1 | B-25 | B-25 | C-1 |
| 1-282 | A-3 | B-25 | B-25 | C-1 |
| 1-283 | A-18 | B-25 | B-25 | C-1 |
| 1-284 | A-32 | B-25 | B-25 | C-1 |
| 1-285 | A-1 | B-26 | B-26 | C-1 |
| 1-286 | A-3 | B-26 | B-26 | C-1 |
| 1-287 | A-18 | B-26 | B-26 | C-1 |
| 1-288 | A-32 | B-26 | B-26 | C-1 |
| 1-289 | A-1 | B-27 | B-27 | C-1 |
| 1-290 | A-3 | B-27 | B-27 | C-1 |
| 1-291 | A-18 | B-27 | B-27 | C-1 |
| 1-292 | A-32 | B-27 | B-27 | C-1 |
| 1-293 | A-1 | B-28 | B-28 | C-1 |
| 1-294 | A-3 | B-28 | B-28 | C-1 |
| 1-295 | A-18 | B-28 | B-28 | C-1 |
| 1-296 | A-32 | B-28 | B-28 | C-1 |
| 1-297 | A-1 | B-29 | B-29 | C-1 |
| 1-298 | A-3 | B-29 | B-29 | C-1 |

TABLE 3-continued

| Compound | R¹ and R² | R³ | R⁴ | R⁷ and R⁸ |
|---|---|---|---|---|
| 1-299 | A-18 | B-29 | B-29 | C-1 |
| 1-300 | A-32 | B-29 | B-29 | C-1 |
| 1-301 | A-1 | B-30 | B-30 | C-1 |
| 1-302 | A-3 | B-30 | B-30 | C-1 |
| 1-303 | A-18 | B-30 | B-30 | C-1 |
| 1-304 | A-32 | B-30 | B-30 | C-1 |
| 1-305 | A-1 | B-31 | B-31 | C-1 |
| 1-306 | A-3 | B-31 | B-31 | C-1 |
| 1-307 | A-18 | B-31 | B-31 | C-1 |
| 1-308 | A-32 | B-31 | B-31 | C-1 |
| 1-309 | A-1 | B-32 | B-32 | C-1 |
| 1-310 | A-3 | B-32 | B-32 | C-1 |
| 1-311 | A-18 | B-32 | B-32 | C-1 |
| 1-312 | A-32 | B-32 | B-32 | C-1 |

TABLE 4

| Compound | R¹ and R² | R³ | R⁴ | R⁷ and R⁸ |
|---|---|---|---|---|
| 1-313 | A-1 | B-33 | B-33 | C-1 |
| 1-314 | A-3 | B-33 | B-33 | C-1 |
| 1-315 | A-12 | B-33 | B-33 | C-1 |
| 1-316 | A-13 | B-33 | B-33 | C-1 |
| 1-317 | A-16 | B-33 | B-33 | C-1 |
| 1-318 | A-17 | B-33 | B-33 | C-1 |
| 1-319 | A-18 | B-33 | B-33 | C-1 |
| 1-320 | A-24 | B-33 | B-33 | C-1 |
| 1-321 | A-25 | B-33 | B-33 | C-1 |
| 1-322 | A-26 | B-33 | B-33 | C-1 |
| 1-323 | A-1 | B-34 | B-34 | C-1 |
| 1-324 | A-3 | B-34 | B-34 | C-1 |
| 1-325 | A-18 | B-34 | B-34 | C-1 |
| 1-326 | A-32 | B-34 | B-34 | C-1 |
| 1-327 | A-1 | B-35 | B-35 | C-1 |
| 1-328 | A-3 | B-35 | B-35 | C-1 |
| 1-329 | A-18 | B-35 | B-35 | C-1 |
| 1-330 | A-32 | B-35 | B-35 | C-1 |
| 1-331 | A-1 | B-36 | B-36 | C-1 |
| 1-332 | A-3 | B-36 | B-36 | C-1 |
| 1-333 | A-18 | B-36 | B-36 | C-1 |
| 1-334 | A-32 | B-36 | B-36 | C-1 |
| 1-335 | A-1 | B-37 | B-37 | C-1 |
| 1-336 | A-3 | B-37 | B-37 | C-1 |
| 1-337 | A-18 | B-37 | B-37 | C-1 |
| 1-338 | A-32 | B-37 | B-37 | C-1 |
| 1-339 | A-1 | B-38 | B-38 | C-1 |
| 1-340 | A-3 | B-38 | B-38 | C-1 |
| 1-341 | A-18 | B-38 | B-38 | C-1 |
| 1-342 | A-32 | B-38 | B-38 | C-1 |
| 1-343 | A-1 | B-12 | B-21 | C-1 |
| 1-344 | A-3 | B-12 | B-21 | C-1 |
| 1-345 | A-18 | B-12 | B-21 | C-1 |
| 1-346 | A-32 | B-12 | B-21 | C-1 |
| 1-347 | A-1 | B-12 | B-24 | C-1 |
| 1-348 | A-3 | B-12 | B-24 | C-1 |
| 1-349 | A-18 | B-12 | B-24 | C-1 |
| 1-350 | A-32 | B-12 | B-24 | C-1 |
| 1-351 | A-1 | B-12 | B-12 | C-5 |
| 1-352 | A-3 | B-12 | B-12 | C-5 |
| 1-353 | A-18 | B-12 | B-12 | C-5 |
| 1-354 | A-32 | B-12 | B-12 | C-5 |
| 1-355 | A-1 | B-21 | B-21 | C-5 |
| 1-356 | A-3 | B-21 | B-21 | C-5 |
| 1-357 | A-18 | B-21 | B-21 | C-5 |
| 1-358 | A-32 | B-21 | B-21 | C-5 |
| 1-359 | A-1 | B-24 | B-24 | C-5 |
| 1-360 | A-3 | B-24 | B-24 | C-5 |
| 1-361 | A-18 | B-24 | B-24 | C-5 |
| 1-362 | A-32 | B-24 | B-24 | C-5 |
| 1-363 | A-32 | B-12 | B-21 | C-5 |
| 1-364 | A-32 | B-11 | B-24 | C-5 |
| 1-365 | A-1 | B-9 | B-9 | C-2 |
| 1-366 | A-3 | B-9 | B-9 | C-2 |
| 1-367 | A-18 | B-9 | B-9 | C-2 |
| 1-368 | A-32 | B-9 | B-9 | C-2 |
| 1-369 | A-1 | B-9 | B-9 | C-3 |
| 1-370 | A-3 | B-9 | B-9 | C-3 |
| 1-371 | A-18 | B-9 | B-9 | C-3 |
| 1-372 | A-32 | B-9 | B-9 | C-3 |
| 1-373 | A-1 | B-21 | B-21 | C-4 |
| 1-374 | A-3 | B-21 | B-21 | C-4 |
| 1-375 | A-18 | B-21 | B-21 | C-4 |
| 1-376 | A-32 | B-21 | B-21 | C-4 |
| 1-377 | A-1 | B-21 | B-21 | C-6 |
| 1-378 | A-3 | B-21 | B-21 | C-6 |
| 1-379 | A-18 | B-21 | B-21 | C-6 |
| 1-380 | A-32 | B-21 | B-21 | C-6 |
| 1-381 | A-32 | B-21 | B-21 | C-7 |
| 1-382 | A-32 | B-22 | B-22 | C-7 |
| 1-383 | A-32 | B-23 | B-23 | C-7 |
| 1-384 | A-32 | B-24 | B-24 | C-7 |
| 1-385 | A-32 | B-28 | B-28 | C-7 |

The compound represented by Formula (1) has a maximum absorption wavelength preferably in a wavelength range of 700 nm to 1,200 nm, more preferably in a wavelength range of 750 nm to 1,200 nm, and still more preferably in a range of 750 nm to 1,000 nm.

In addition, from the viewpoint of dispersibility, it is preferable that the compound represented by Formula (1) is in the form of particles.

From the viewpoint of dispersibility, the volume average particle size of the compound represented by Formula (1) is preferably 5 nm to 500 nm, more preferably 5 nm to 100 nm, and still more preferably 5 nm to 50 nm.

The volume average particle size of the compound represented by Formula (1) is measured using MICROTRAC UPA 150 (manufactured by Nikkiso Co., Ltd.).

In addition, the composition according to the embodiment of the present disclosure may include one compound represented by Formula (1) alone or two or more compounds represented by Formula (1) and preferably includes two or more compounds represented by Formula (1).

From the viewpoints of infrared absorbing properties and dispersibility, the content of the compound represented by Formula (1) is preferably 1 mass % to 90 mass % with respect to the total solid content of the composition. The lower limit is more preferably 5 mass % or higher and still more preferably 10 mass % or higher. The upper limit is more preferably 80 mass % or lower, and still more preferably 70 mass % or lower.

(Curable Compound)

It is preferable that the composition according to the embodiment of the present disclosure further includes a curable compound.

The curable compound is preferably a compound having a polymerizable group (hereinafter, also referred to as "polymerizable compound"). The curable compound may be in a chemical form of a monomer, an oligomer, a prepolymer, a polymer, or the like. The details of the curable compound can be found in, for example, paragraphs "0070" to "0191" of JP2014-041318A (corresponding to paragraphs "0071" to "0192" of WO2014/017669A) or paragraphs "0045" to "0216" of JP2014-032380A, the content of which is incorporated herein by reference.

In addition, examples of a commercially available product of a urethane resin having a methacryloyl group include 8UH-1006 and 8UH-1012 (both of which are manufactured by Taisei Fine Chemical Co., Ltd.).

The curable compound is preferably a polymerizable compound. The polymerizable compound may be a radically polymerizable compound or a cationically polymerizable compound. For example, a compound having a polymerizable group such as an ethylenically unsaturated bond or a cyclic ether (epoxy, oxetane) can be used. As the ethylenically unsaturated bond, a vinyl group, a styryl group, a (meth)acryloyl group, or a (meth)allyl group is preferable. The polymerizable compound may be a monofunctional compound having one polymerizable group or a polyfunctional polymerizable compound having two or more polymerizable groups, and is preferably a polyfunctional polymerizable compound and more preferably a polyfunctional (meth)acrylate compound. By the composition including the polyfunctional polymerizable compound, film hardness can be further improved.

Examples of the curable compound include a monofunctional (meth)acrylate compound, a polyfunctional (meth)acrylate compound (preferably a trifunctional to hexafunctional (meth)acrylate compound), a polybasic acid-modified acrylic oligomer, an epoxy resin, and a polyfunctional epoxy resin.

The content of the curable compound is preferably 1 to 90 mass % with respect to the total solid content of the composition. The lower limit is more preferably 5 mass % or higher, still more preferably 10 mass % or higher, and even still more preferably 20 mass % or higher. The upper limit is more preferably 80 mass % or lower, and still more preferably 75 mass % or lower.

As the curable compound, one kind may be used alone, or two or more kinds may be used. In a case where two or more curable compounds are used in combination, it is preferable that the total content of the two or more curable compounds is in the above-described range.

As the curable compound, an ethylenically unsaturated compound can also be used. Examples of the ethylenically unsaturated compound can be found in paragraphs "0033" and "0034" of JP2013-253224A, the content of which is incorporated herein by reference.

As the ethylenically unsaturated compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol or a propylene glycol residue is preferable. In addition, oligomers of the above-described examples can be used.

In addition, diglycerin ethylene oxide (EO)-modified (meth)acrylate (as a commercially available product, M-460 manufactured by Toagosei Co., Ltd.) is preferable.

Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The ethylenically unsaturated compound may have an acid group such as a carboxy group, a sulfonate group, or a phosphate group.

Examples of the acid group and the ethylenically unsaturated compound include an ester of an aliphatic polyhydroxy compound and an unsaturated carboxylic acid. A compound having an acid group obtained by causing a nonaromatic carboxylic anhydride to react with an unreacted hydroxyl group of an aliphatic polyhydroxy compound is preferable.

In particular, it is more preferable that, in this ester, the aliphatic polyhydroxy compound is pentaerythritol or dipentaerythritol. Examples of a commercially available product of the monomer having an acid group include M-510 and M-520 of ARONIX series as polybasic acid-modified acrylic oligomer (manufactured by Toagosei Co., Ltd.).

The acid value of the acid group and the ethylenically unsaturated compound is preferably 0.1 mgKOH/g to 40 mgKOH/g. The lower limit is more preferably 5 mgKOH/g or higher. The upper limit is more preferably 30 mgKOH/g or lower.

In the present disclosure, as the curable compound, a compound having an epoxy group or an oxetanyl group can be used. Examples of the compound having an epoxy group or an oxetanyl group include a polymer having an epoxy group at a side chain and a monomer or an oligomer having two or more epoxy groups in a molecule. Examples of the compound include a bisphenol A epoxy resin, a bisphenol F epoxy resin, a phenol novolac epoxy resin, a cresol novolac epoxy resin, and an aliphatic epoxy resin. In addition, a monofunctional or polyfunctional glycidyl ether compound can also be used, and a polyfunctional aliphatic glycidyl ether compound is preferable.

The weight-average molecular weight is preferably 500 to 5,000,000 and more preferably 1,000 to 500,000.

As the compound, a commercially available product may be used, or a compound obtained by introducing an epoxy group into a side chain of the polymer may be used.

Examples of the commercially available product include CYCLOMER P ACA 200M, CYCLOMER P ACA 230AA, CYCLOMER P ACA Z250, CYCLOMER P ACA Z251, CYCLOMER P ACA Z300, and CYCLOMER P ACA Z320 (all of which are manufactured by Daicel Corporation).

(Polymerization Initiator) It is preferable that the composition according to the embodiment of the present disclosure further includes a polymerization initiator in addition to the curable compound.

The content of the polymerization initiator is preferably 0.01 to 30 mass % with respect to the total solid content of the composition. The lower limit is more preferably 0.1 mass % or higher and still more preferably 0.5 mass % or higher. The upper limit is more preferably 20 mass % or lower, and still more preferably 15 mass % or lower.

As the polymerization initiator, one kind or two or more kinds may be used. In a case where two or more polymerization initiators are used, it is preferable that the total content of the two or more polymerization initiators is in the above-described range.

The polymerization initiator may be a photopolymerization initiator or a thermal polymerization initiator and is preferably a photopolymerization initiator.

In addition, the polymerization initiator may be a radical polymerization initiator or a cationic polymerization initiator.

Examples of the photoradical polymerization initiator include: a halogenated hydrocarbon derivative (For example, a compound having a triazine skeleton or a compound having an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in German Patent No. 3337024, a compound described in J. Org. Chem.; 29, 1527 (1964) by F C. Schaefer et al., a compound described in JP1987-058241A (JP-S62-058241A), a compound described in JP1993-281728A (JP-H5-281728A), a compound described in JP1993-034920A (JP-S5-034920A), and a compound described in U.S. Pat. No. 4,212,976A.

In addition, from the viewpoint of exposure sensitivity, as the photoradical polymerization initiator, a compound selected from the group consisting of an oxime compound, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound is preferable, and an oxime compound is more preferable.

Specific examples of the oxime compound include a compound described in JP2001-233842A, a compound described in JP2000-080068A, a compound described in JP2006-342166A, and a compound described in JP2016-021012A. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, JP2000-066385A, JP2000-080068A, JP2004-534797A, or JP2006-342166A.

As a commercially available product of the oxime compound, IRGACURE-OXE01, IRGACURE-OXE02, IRGACURE-OXE03, or IRGACURE-OXE04 (all of which are manufactured by BASF SE) can also be preferably used. In addition, TR-PBG-304 (manufactured by Changzhou Tronly New Electronic Materials Co., Ltd.), ADEKA ARKLS NCI-831 (manufactured by Adeka Corporation), ADEKA ARKLS NCI-930 (manufactured by Adeka Corporation), or ADEKA OPTOMER N-1919 (manufactured by Adeka Corporation) can also be used.

In addition, in addition to the above-described oxime compounds, for example, a compound described in JP2009-519904A in which oxime is linked to a N-position of a carbazole ring, a compound described in U.S. Pat. No. 7,626,957B in which a hetero substituent is introduced into the benzophenone site, a compound described in JP2010-015025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays may be used.

Other preferable examples of the oxime compound can be found in paragraphs "0274" to "0275" of JP2013-029760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

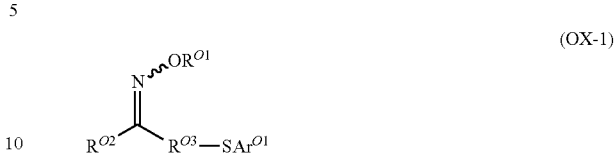

(OX-1)

In Formula (OX-1), $R^{O1}$ and $R^{O2}$ each independently represent a monovalent substituent, $R^{O3}$ represents a divalent organic group, and $Ar^{O1}$ represents an aryl group.

In Formula (OX-1), it is preferable that the monovalent substituent represented by $R^{O1}$ is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may be further substituted with another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by $R^{O2}$, an aryl group, a heterocyclic group, an arylcarbonyl group, or a heterocyclic carbonyl group is preferable.

These groups may have one or more substituents. Examples of the substituent are as described above.

In Formula (OX-1), as the divalent organic group represented by $R^{O3}$, an alkylene group having 1 to 12 carbon atoms, a cycloalkylene group, or an alkynylene group is preferable. These groups may have one or more substituents. Examples of the substituent are as described above.

A compound represented by the following Formula (X-1) or (X-2) can also be used as the photopolymerization initiator.

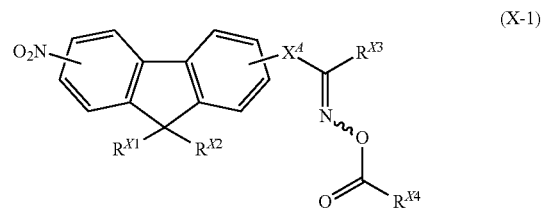

(X-1)

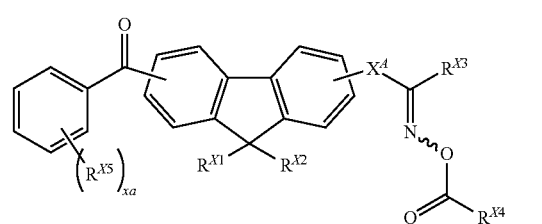

(X-2)

In Formula (X-1), $R^{X1}$ and $R^{X2}$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms; in a case where $R^{X1}$ and $R^{X2}$ represent a phenyl group, the phenyl groups may be bonded to each other to form a fluorene group; $R^{X3}$ and $R^{X4}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and $X^A$ represents a single bond or a carbonyl group.

In Formula (X-2), $R^{X1}$, $R^{X2}$, $R^{X3}$, and $R^{X4}$ have the same definitions as those of $R^{X1}$, $R^{X2}$, $R^{X3}$, and $R^{X4}$ in Formula (X-1), $R^{X5}$ represents —$R^{X6}$, —$OR^{X6}$, —$SR^6$, —$COR^{X6}$, —$CONR^{X6}R^{X6}$, —$NR^{X6}COR^{X6}$, —$OCOR^{X6}$—$COOR^{X6}$—$SCOR^{X6}$—$OCSR^{X6}$—$COSR^{X6}$—$CSOR^{X6}$—CN, a halogen atom, or a hydroxyl group, $R^{X6}$ represents a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, $X^A$ represents a single bond or a carbonyl group, and xa represents an integer of 0 to 4.

In Formulae (X-1) and (X-2), it is preferable that $R^1$ and $R^2$ each independently represent a methyl group, an ethyl group, a n-propyl group, an i-propyl group, a cyclohexyl group, or a phenyl group. It is preferable that $R^{X3}$ represents a methyl group, an ethyl group, a phenyl group, a tolyl group, or a xylyl group. It is preferable that $R^{X4}$ represents an alkyl group having 1 to 6 carbon atoms or a phenyl group. It is preferable that $R^{X5}$ represents a methyl group, an ethyl group, a phenyl group, a tolyl group, or a naphthyl group. It is preferable that $X^A$ represents a single bond.

Specific examples of the compounds represented by Formulae (X-1) and (X-2) include compounds described in paragraphs "0076" to "0079" of JP2014-137466A. The content is incorporated herein by reference.

As the photopolymerization initiator, an oxime compound having a nitro group can be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, paragraphs "0007" to 0025" of JP4223071B, and ADEKA ARKLS NCI-831 (both of which are manufactured by Adeka Corporation).

The oxime compound preferably has a maximum absorption wavelength in a wavelength range of 350 nm to 500 nm, more preferably has a maximum absorption wavelength in a wavelength range of 360 nm to 480 nm, and still more preferably has a high absorbance at 365 nm and 405 nm.

The molar absorption coefficient of the oxime compound at 365 nm or 405 nm is preferably 1,000 to 300,000, more preferably 2,000 to 300,000, and still more preferably 5,000 to 200,000 from the viewpoint of sensitivity.

The molar absorption coefficient of the compound can be measured using a well-known method. For example, it is preferable that the molar absorption coefficient can be measured using an ultraviolet-visible spectrophotometer (Cary-5 spectrophotometer, manufactured by Varian Medical Systems, Inc.) and ethyl acetate as a solvent at a concentration of 0.01 g/L.

Specific examples of the oxime compound which are preferably used in the present disclosure are shown below, but the present disclosure is not limited thereto.

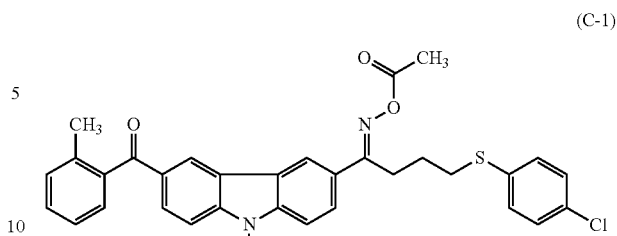
(C-1)

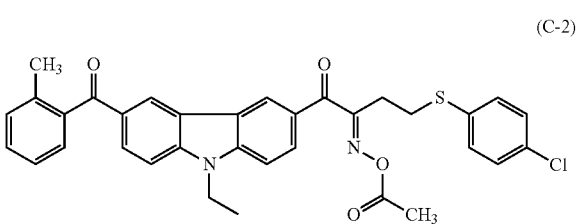
(C-2)

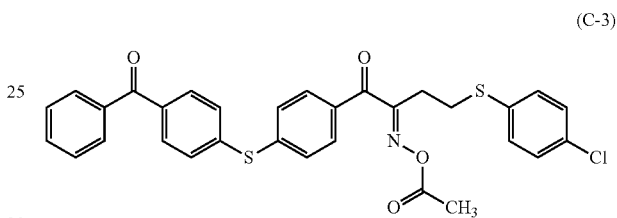
(C-3)

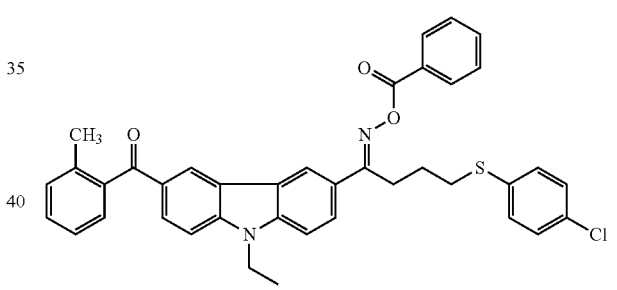
(C-4)

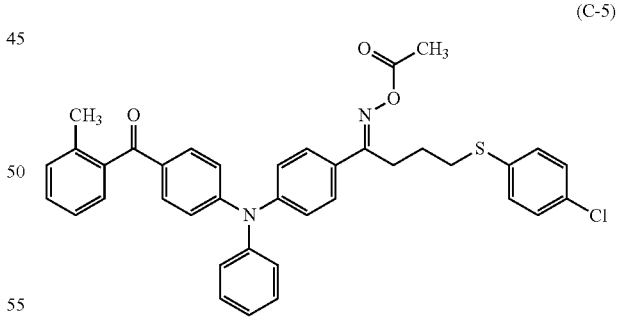
(C-5)

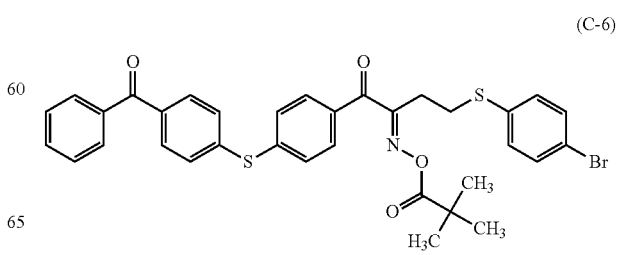
(C-6)

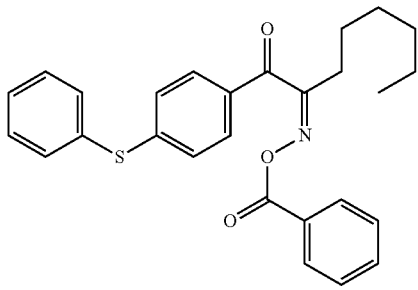

(C-7)

(C-8)

(C-9)

(C-10)

(C-11)

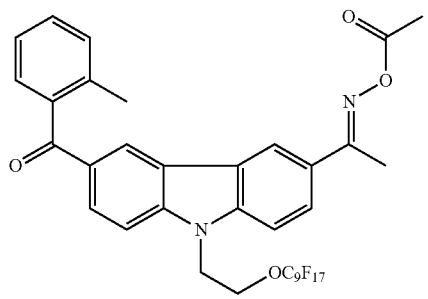

(C-12)

Examples of the $OC_9F_{17}$ in (C-12) shown above include the following groups.

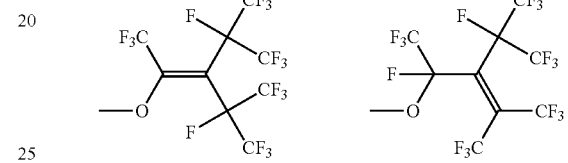

As the photopolymerization initiator, an oxime compound having a fluorine atom can also be used. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

Examples of the photocationic polymerization initiator include a photoacid generator. Examples of the photoacid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodisulfone, disulfone, or o-nitrobenzyl sulfonate. The details of the photocationic polymerization initiator can be found in paragraphs "0139" to "0214" of JP2009-258603A, the content of which is incorporated herein by reference.

As the photocationic polymerization initiator, a commercially available product can also be used. Examples of the commercially available product of the photocationic polymerization initiator include ADEKA ARKLS SP series manufactured by Adeka Corporation (for example, ADEKA ARKLS SP-606) and IRGACURE 250, IRGACURE 270, and IRGACURE 290 manufactured by BASF SE.

(Resin)

It is preferable that the composition according to the embodiment of the present disclosure includes a resin. The resin is mixed, for example, in order to disperse the pigment and the like in the composition and to be added as a binder. The resin which is mainly used to disperse the compound represented by Formula (1) and the like will also be called a dispersant. However, the above-described uses of the resin are merely exemplary, and the resin can be used for purposes other than the uses.

The weight-average molecular weight (Mw) of the resin is preferably 2,000 to 2,000,000. The upper limit is more preferably 1,000,000 or lower and still more preferably 500,000 or lower. The lower limit is more preferably 3,000 or higher and still more preferably 5,000 or higher.

The content of the resin is preferably 10 mass % to 80 mass % and more preferably 20 mass % to 60 mass % with respect to the total solid content of the composition. The composition may include one resin or two or more resins. In a case where the composition includes two or more resins, it is preferable that the total content of the resins is in the above-described range.

—Dispersant—

Examples of the dispersant include: a polymer dispersant such as a resin having an amine group (polyamideamine or a salt thereof), an oligoimine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate; In terms of a structure, the polymer dispersant can be further classified into a linear polymer, a terminal-modified polymer, a graft polymer, and a block polymer.

In addition, as the polymer dispersant, a resin having an acid value of 60 mgKOH/g or higher (more preferably 60 mgKOH/g or higher and 300 mgKOH/g or lower) can be preferably used.

Examples of the terminal-modified polymer include a polymer having a phosphate group at a terminal thereof described in JP1991-112992A (JP-H3-112992A) or JP2003-533455A, a polymer having a sulfonate group at a terminal thereof described in JP2002-273191A, and a polymer having a partial skeleton or a heterocycle of an organic colorant described in JP1997-077994A (JP-H9-077994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the graft polymer include a reaction product of poly(low-alkylene imine) and polyester described in JP1979-037082A (JP-S54-037082A), JP1996-507960A (JP-H8-507960A), or JP2009-258668A, a reaction product of polyallylamine and polyester described in JP1997-169821A (JP-H9-169821A), a copolymer of a macromonomer and a nitrogen-containing monomer described in JP1998-339949A (JP-H10-339949A) or JP2004-037986A, a graft polymer having a partial skeleton or a heterocycle of an organic colorant described in JP2003-238837A, JP2008-009426A, or JP2008-081732A, and a copolymer of a macromonomer and an acid group-containing monomer described in JP2010-106268A.

As the macromonomer used for manufacturing the graft polymer by radical polymerization, a well-known macromonomer can be used, and examples thereof include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H2-272009A). Among these, from the viewpoint of the dispersibility and dispersion stability of the pigment dispersion and the developability of the composition in which the pigment dispersion is used, a polyester macromonomer having excellent flexibility and solvent compatibility is more preferable, and the polyester macromonomer represented by the polyester macromonomer described in JP1990-272009A (JP-H2-272009A) is most preferable.

As the block polymer, a block polymer described in JP2003-049110A or JP2009-052010A is preferable.

The resin (dispersant) is available as a commercially available product, and specific examples thereof include "Disperbyk-101 (polyamideamine phosphate), 107 (carboxylate), 110, 111 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid plyyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; HINOACT T-8000E manufactured by Kawaken Fine Chemicals Co., Ltd.; organosiloxane polymer KP341 manufactured by Shin-Etsu Chemical Co., Ltd.; "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "IONET S-20" manufactured by Sanyo Chemical Industries Ltd.

Among these resins, one kind may be used alone, or two or more kinds may be used in combination. In addition, an alkali-soluble resin described below can also be used as the dispersant. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by modifying a polymer having a hydroxyl group with an acid anhydride. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H7-319161A) is also preferable.

Among these, from the viewpoint of dispersibility, it is preferable that a resin having a polyester chain is included as the resin, and it is more preferable that a resin having a polycaprolactone chain is included as the resin. The polyester chain interacts with $R^1$ and $R^2$ of the compound represented by Formula (1) such that the dispersibility is further improved.

In addition, from the viewpoints of improving dispersibility and transparency and suppressing film defects caused by foreign matter, it is preferable that the resin (preferably an acrylic resin) includes a constitutional unit having an ethylenically unsaturated group.

The ethylenically unsaturated group is not particularly limited and is preferably a (meth)acryloyl group.

In addition, in a case where the resin includes an ethylenically unsaturated group, in particular, a (meth)acryloyl group at a side chain, it is preferable that the resin includes a divalent linking group having an alicyclic structure between a main chain and an ethylenically unsaturated group.

The content of the dispersant is preferably 1 part by mass to 80 parts by mass, more preferably 5 parts by mass to 70 parts by mass, and still more preferably 10 parts by mass to 60 parts by mass with respect to 100 parts by mass of the compound represented by Formula (l).

—Alkali-Soluble Resin—

From the viewpoint of developability, it is preferable that the composition according to the embodiment of the present disclosure further includes an alkali-soluble resin.

The alkali-soluble resin may be a linear organic polymer and can be appropriately selected from alkali-soluble resins having at least one group for promoting alkali solubility in a molecule (preferably a molecule having an acrylic copolymer or a styrene copolymer as a main chain). As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as an acid group) include a carboxy group, a phosphate group, a sulfonate group, and a phenolic hydroxyl group. A group that is soluble in an organic solvent and is developable with a weakly alkaline aqueous solution is preferable, and (meth)acrylic acid group is more preferable. Among these acid groups, one kind may be used alone, or two or more kinds may be used in combination. The details of the alkali-soluble resin can be found in paragraphs "0558" to "0571" of JP2012-208494A (corresponding to paragraphs "0685" to "0700" of US2012/0235099A), the contents of which are incorporated herein by reference.

As the alkali-soluble resin, a resin that includes a constitutional unit represented by the following Formula (ED) is also preferable.

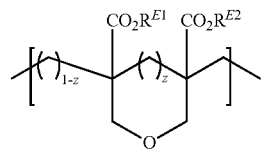

(ED)

In Formula (ED1), $R^{E1}$ and $R^{E2}$ each independently represent a hydrogen atom or a hydrocarbon group having 1 to 25 carbon atoms which may have a substituent, and z represents 0 or 1.

The hydrocarbon group having 1 to 25 carbon atoms represented by $R^{E1}$ and $R^{E2}$ is not particularly limited, and examples thereof include: a linear or branched alkyl group such as a methyl group, an ethyl group, a n-propyl group, an isopropyl group, a n-butyl group, an isobutyl group, a t-butyl group, a t-amyl group, a stearyl group, a lauryl group, or a 2-ethylhexyl group; an aryl group such as a phenyl group; an alicyclic group such as a cyclohexyl group, a t-butylcyclohexyl group, a dicyclopentadienyl group, a tricyclodecanyl group, an isobornyl group, an adamantyl group, or a 2-methyl-2-adamantyl group; an alkyl group substituted with an alkoxy group such as a 1-methoxyethyl group or a 1-ethoxyethyl group; and an alkyl group substituted with an aryl group such as a benzyl group. Among these, a primary or secondary hydrocarbon group which is not likely to leave due to an acid or heat, for example, a methyl group, an ethyl group, a cyclohexyl group, or a benzyl group is preferable from the viewpoint of heat resistance.

$R^{E1}$ and $R^{E2}$ may represent the same substituent or different substituents.

Examples of the compound that includes the constitutional unit represented by Formula (ED) include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(n-butyl)-2,2'-[oxybis(methylene)]bis-2-propenoate, di(t-butyl)-2,2'-[oxybis(methylene)bis-2-propenoate, di(isobutyl)-2,2'-[oxybis(methylene)]bis-2-propenoate. Among these, dimethyl-2,2'-[oxybis(methylene)]bis-2-propenoate is preferable.

The alkali-soluble resin may include a constitutional unit other than the constitutional unit represented by Formula (ED).

As the monomer for forming the constitutional unit, for example, from the viewpoint of handleability such as solubility in a solvent, it is preferable that an aryl (meth)acrylate, an alkyl (meth)acrylate, or a polyethyleneoxy (meth)acrylate that imparts oil-solubility is included as a copolymerization component, and it is more preferable that an aryl (meth)acrylate or an alkyl (meth)acrylate is included as a copolymerization component.

In addition, from the viewpoint of alkali developability, it is preferable that a monomer having a carboxyl group such as a (meth)acrylic acid or an itaconic acid that includes an acidic group, a monomer having a phenolic hydroxyl group such as N-hydroxyphenyl maleimide, or a monomer having a carboxylic anhydride group such as maleic anhydride or itaconic anhydride is included as a copolymerization component, and it is more preferable that (meth)acrylic acid is included as a copolymerization component.

Preferable examples of the alkali-soluble resin include a resin including a constitutional unit represented by Formula (ED), a constitutional unit that is formed of benzyl methacrylate, and a constitutional unit that is formed at least one monomer selected from the group consisting of methyl methacrylate and methacrylic acid.

The details of the resin that includes the constitutional unit represented by Formula (ED) can be found in paragraphs "0079" to "0099" of JP2012-198408A, the content of which is incorporated herein by reference.

The weight-average molecular weight (Mw) of the alkali-soluble resin is preferably 2,000 to 50,000. The lower limit is more preferably 5,000 or higher and still more preferably 7,000 or higher. The upper limit is more preferably 30,000 or lower and still more preferably 20,000 or lower.

The acid value of the alkali-soluble resin is preferably 30 to 200 mgKOH/g. The lower limit is more preferably 50 mgKOH/g or higher and still more preferably 70 mgKOH/g or higher. The upper limit is more preferably 150 mgKOH/g or lower and still more preferably 120 mgKOH/g or lower.

In the present disclosure, the acid value is measured using the following method.

The acid value indicates the mass of potassium hydroxide required to neutralize an acidic component per 1 g of solid content. A measurement sample is dissolved in a mixed solvent including tetrahydrofuran and water at a ratio (mass ratio; tetrahydrofuran/water) of 9/1, and the obtained solution is neutralized and titrated with a 0.1 mol/L sodium hydroxide aqueous solution at 25° C. using a potentiometric titrator (trade name: AT-510, manufactured by Kyoto Electronics Manufacturing Co., Ltd.). An inflection point of a titration pH curve is set as a titration end point, and the acid value is calculated from the following expression.

$$A = 56.11 \times Vs \times 0.1 \times f/w$$

A: the acid value (mgKOH/g)

Vs: the amount (mL) of the 0.1 mol/L sodium hydroxide aqueous solution used for the titration f: the titer of the 0.1 mol/L sodium hydroxide aqueous solution w: the mass (g) of the measurement sample (expressed in terms of solid contents)

(Colorant Derivative)

It is preferable that the composition according to the embodiment of the present disclosure further includes a colorant derivative other than the compound represented by Formula (1) (hereinafter, also simply referred to as "colorant derivative"). By the composition including the colorant derivative, the dispersibility of the compound represented by Formula (1) is improved, and the aggregation of the compound represented by Formula (1) can be efficiently suppressed. It is preferable that the colorant derivative is a pigment derivative.

As the colorant derivative, a compound having a structure in which a portion of a pigment is substituted with an acidic group, a basic group, or a group having a salt structure is preferable, and a colorant derivative represented by the following Formula (3) is more preferable. In the colorant derivative represented by the following Formula (3), a colorant structure P is likely to adsorb to the surface of the compound represented by Formula (1). Therefore, the dispersibility of the compound represented by Formula (1) in the composition can be improved. In addition, in a case where the composition includes a resin, a terminal portion X of the colorant derivative adsorbs to the resin due to an interaction with an adsorption portion (for example, a polar group) of the resin. Therefore, the dispersibility of the compound represented by Formula (1) can be further improved.

In Formula (3), $P^3$ represents a colorant structure, $L^3$'s each independently represent a single bond or a linking group, $X^3$'s each independently represent an acidic group, a basic group, or a group having a salt structure, m represents an integer of 1 or more, and n represents an integer of 1 or more.

The colorant structure represented by $P^3$ is preferably at least one selected from the group consisting of a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a dioxazine colorant structure, a perylene colorant structure, a perinone colorant structure, and a benzimidazolinone colorant structure, more preferably at least one selected from the group consisting of a pyrrolopyrrole colorant structure, a diketo pyrrolo pyrrolopyrrole colorant structure, a quinacridone colorant structure, and a benzimidazolinone colorant structure, and still more preferably a pyrrolopyrrole colorant structure. By the colorant derivative including the colorant structure, the dispersibility of the compound represented by Formula (1) can be further improved.

The linking group represented by $L^3$ is preferably a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent. As the substituent, an alkyl group, an aryl group, a hydroxy group, or a halogen atom is preferable.

The linking group is preferably an alkylene group, an arylene group, a nitrogen-containing heterocyclic group, —NR'—, —SO$_2$—, —S—, —O—, —CO—, —COO—, —CONR—, or a group including a combination of the above-described groups and more preferably an alkylene group, an arylene group, —SO$_2$—, —COO—, or a group including a combination of the above-described groups. R' represents a hydrogen atom, an alkyl group (preferably having 1 to 30 carbon atoms) or an aryl group (preferably 6 to 30 carbon atoms).

The number of carbon atoms in the alkylene group is preferably 1 to 30, more preferably 1 to 15, and still more preferably 1 to 10. The alkylene group may have a substituent. The alkylene group may be linear, branched, or cyclic. In addition, the cyclic alkylene group may be monocyclic or polycyclic.

As the arylene group, an arylene group having 6 to 18 carbon atoms is preferable, an arylene group having 6 to 14 carbon atoms is more preferable, an arylene group having 6 to 10 carbon atoms is still more preferable, and a phenylene group is even still more preferable.

It is preferable that the nitrogen-containing heterocyclic group is a 5-membered or 6-membered ring. The nitrogen-containing heterocyclic group is preferably a monocycle or a fused ring, more preferably a monocycle or a fused ring composed of 2 to 8 rings, and still more preferably a monocycle or a fused ring composed of 2 to 4 rings. The number of nitrogen atoms in the nitrogen-containing heterocyclic group is preferably 1 to 3 and more preferably 1 or 2. The nitrogen-containing heterocyclic group may include a heteroatom other than a nitrogen atom. Examples of the heteroatom other than a nitrogen atom include an oxygen atom and a sulfur atom. The number of heteroatoms other than a nitrogen atom is preferably 0 to 3 and more preferably 0 or 1.

Examples of the nitrogen-containing heterocyclic group include a piperazine ring group, a pyrrolidine ring group, a pyrrole ring group, a piperidine ring group, a pyridine ring group, an imidazole ring group, a pyrazole ring group, an oxazole ring group, a thiazole ring group, a pyrazine ring group, a morpholine ring group, a thiazine ring group, an indole ring group, an isoindole ring group, a benzimidazole ring group, a purine ring group, a quinoline ring group, an isoquinoline ring group, a quinoxaline ring group, a cinnoline ring group, a carbazole ring group, and a group represented by any one of the following Formulae (L-1) to (L-7).

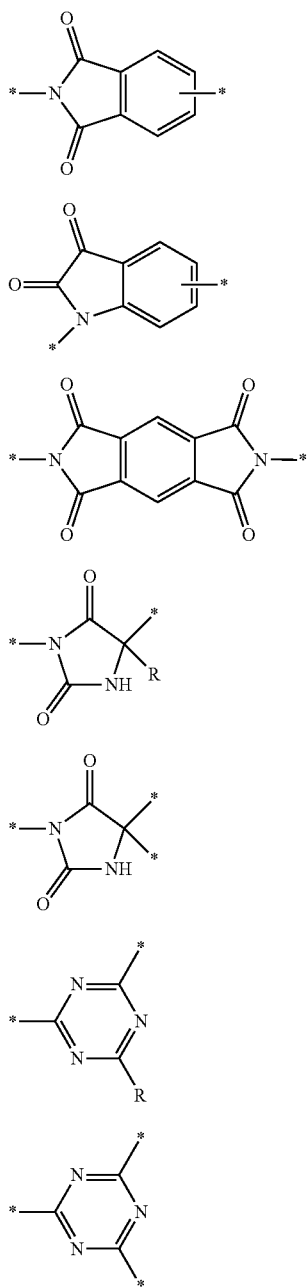

In the formulae, * represents a binding site to $P^3$, $L^3$, or $X^3$, and R represents a hydrogen atom or a substituent. Examples of the substituent include a substituent T.

Examples of the substituent T include an alkyl group having 1 to 10 carbon atoms, an alkoxy group having 1 to 10 carbon atoms, an thioalkoxy group having 1 to 10 carbon atoms, a hydroxyl group, a carboxyl group, an acetyl group, a cyano group, and a halogen atom (a fluorine atom, a chlorine atom, a bromine atom, or an iodine atom). These substituents may further have a substituent.

Specific examples of the linking group include an alkylene group, an arylene group, —$SO_2$—, a group represented by Formula (L-1), a group represented by Formula (L-5), a group including a combination of —O— and an alkylene group, a group including a combination of —NR'— and an alkylene group, a group including a combination of —NR'—, —CO—, and an alkylene group, a group including a combination of —NR'—, —CO—, an alkylene group, and an arylene group, a group including a combination of —NR'—, —CO—, and an arylene group, a group including a combination of —NR'—, —$SO_2$—, and an alkylene group, a group including a combination of —NR'—, —$SO_2$—, an alkylene group, and an arylene group, a group including a combination of the group represented by (L-1) and an alkylene group, a group including a combination of the group represented by (L-1) and an arylene group, a group including a combination of the group represented by (L-1), —$SO_2$—, and an alkylene group, a group including a combination of the group represented by (L-1), —S, and an alkylene group, a group including a combination of the group represented by (L-1), —O—, and an arylene group, a group including a combination of the group represented by (L-1), —NR'—, —CO—, and an arylene group, a group including a combination of the group represented by (L-3) and an arylene group, a group including a combination of —COO— and an arylene group, and a group including a combination of an arylene group, —COO—, and an alkylene group.

In Formula (3), $X^3$ represents an acidic group, a basic group, or a group having a salt structure.

Examples of the acidic group include a carboxyl group, a sulfo group, and a phospho group.

Examples of the basic group include groups represented by Formulae (X-3) to (X-8) described below.

Examples of the group having a salt structure include salts of the above-described acidic groups and salts of the above-described basic groups. Examples of an atom or an atomic group constituting the salts include a metal atom and tetrabutylammonium. As the metal atom, an alkali metal atom or an alkali earth metal atom is more preferable. Examples of the alkali metal atom include lithium, sodium, and potassium. Examples of the alkali earth metal atom include calcium and magnesium.

In addition, the substituent may be the substituent T. The substituent T may be further substituted with another substituent. Examples of the other substituent include a carboxyl group, a sulfo group, and a phospho group.

$X^3$ represents preferably at least one selected from the group consisting of a carboxyl group, a sulfo group, and a group represented by any one of the following Formulae (X-1) to (X-9).

-continued

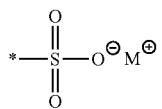 (X-2)

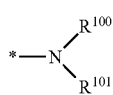 (X-3)

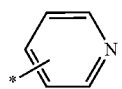 (X-4)

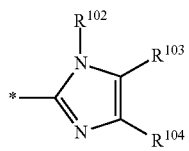 (X-5)

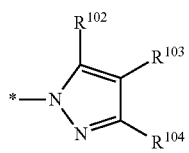 (X-6)

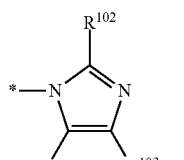 (X-7)

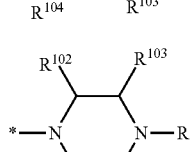 (X-8)

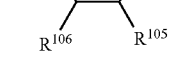

In Formulae (X-1) to (X-8), * represents a binding site to $L^3$ in Formula (3), $R^{100}$ to $R^{106}$ each independently represent a hydrogen atom, an alkyl group, an alkenyl group, or an aryl group, $R^{100}$ and $R^{101}$ may be linked to each other to form a ring, and M represents an atom or an atomic group constituting an anion and a salt.

The alkyl group may be linear, branched, or cyclic. The number of carbon atoms in the linear alkyl group is preferably 1 to 20, more preferably 1 to 12, and still more preferably 1 to 8. The number of carbon atoms in the branched alkyl group is preferably 3 to 20, more preferably 3 to 12, and still more preferably 3 to 8. The cyclic alkylene group may be monocyclic or polycyclic. The cyclic alkylene group may be monocyclic or polycyclic. The number of carbon atoms in the cyclic alkyl group is preferably 3 to 20, more preferably 4 to 10, and still more preferably 6 to 10.

The number of carbon atoms in the alkenyl group is preferably 2 to 10, more preferably 2 to 8, and still more preferably 2 to 4.

The number of carbon atoms in the aryl group is preferably 6 to 18, more preferably 6 to 14, and still more preferably 6 to 10.

$R^{100}$ and $R^{101}$ may be linked to each other to form a ring. The ring may be an alicyclic ring or an aromatic ring. The ring may be a monocycle or a polycycle. In a case where $R^{100}$ and $R^{101}$ are linked to each other to form a ring, a linking group may be a divalent linking group selected from the group consisting of —CO—, —O—, —NH—, a divalent aliphatic group, a divalent aromatic group, and a combination thereof. Specific examples include a piperazine ring, a pyrrolidine ring, a pyrrole ring, a piperidine ring, a pyridine ring, an imidazole ring, a pyrazole ring, an oxazole ring, a thiazole ring, a pyrazine ring, a morpholine ring, a thiazine ring, an indole ring, an isoindole ring, a benzimidazole ring, a purine ring, a quinoline ring, an isoquinoline ring, a quinoxaline ring, a cinnoline ring, and a carbazole ring.

M represents an atom or an atomic group constituting an anion and a salt. M have the same exemplary groups and the same preferable ranges as described above.

The upper limit of m represents the number of substituents which may be included in the colorant structure P and, for example, is preferably 10 or less and more preferably 5 or less. In a case where m represents 2 or more, a plurality of L's and a plurality of X's may be the same as or different from each other.

n represents preferably an integer of 1 to 3 and more preferably 1 or 2. IN a case where n represents 2 or more, a plurality of X's may be the same as or different from each other.

The colorant derivative is preferably a colorant derivative represented by the following Formula (4). In the colorant derivative represented by the following Formula (4), P in formula (3) represents a compound having a pyrrolopyrrole colorant structure.

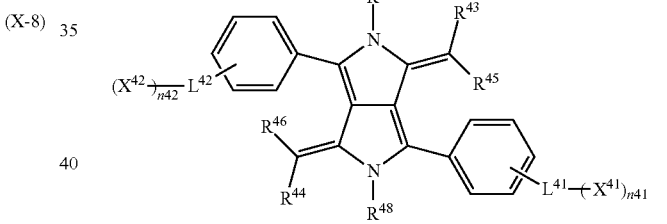 (4)

In Formula (4), $R^{43}$ to $R^{46}$ each independently represent a cyano group, an acyl group, an alkoxycarbonyl group, an alkylsulfinyl group, an arylsulfinyl group, or a heteroaryl group, $R^{47}$ and $R^{48}$ each independently represent a hydrogen atom, an alkyl group, an aryl group, a heteroaryl group, —BR$^{49}$R$^{50}$, or a metal atom, $R^{47}$ may form a covalent bond or a coordinate bond with $R^{43}$ or $R^{45}$, $R^{48}$ may form a covalent bond or a coordinate bond with $R^{44}$ or $R^{46}$, $R^{49}$ and $R^{50}$ each independently represent a hydrogen atom, a halogen atom, an alkyl group, an alkenyl group, an aryl group, a heteroaryl group, an alkoxy group, an aryloxy group, or a heteroaryloxy group, $R^{49}$ and $R^{50}$ may be bonded to each other to form a ring, $L^{41}$ and $L^{42}$ each independently represent a single bond, an alkylene group, an arylene group, a nitrogen-containing heterocyclic group, —O—, —S—, —NR'—, —CO—, —SO$_2$—, or a linking group including a combination of two or more kinds of the above-described groups, $R^1$ represents a hydrogen atom, an alkyl group, or an aryl group, $X^{41}$ and $X^{42}$ each independently represent an acidic group, a basic group, or a group having a salt structure, n41 and n42 each independently represent an integer of 0 to 4, and at least one of n41 or n42 represents 1 or more.

$R^{43}$ to $R^{48}$ in Formula (4) has the same definitions and the same preferable aspects as $R^3$ to $R^8$ in Formula (1).

$X^{41}$ and $X^{42}$ in Formula (4) have the same definitions and the same preferable aspects as of $X^3$ in Formula (3).

In Formula (4), $L^{41}$ and $L^{42}$ have the same definitions and the same preferable aspects as $L^3$ in Formula (3). Further, from the viewpoints of synthesis suitability and visible transparency, the following linking groups are more preferable.

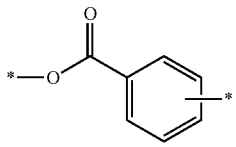
(L-8)

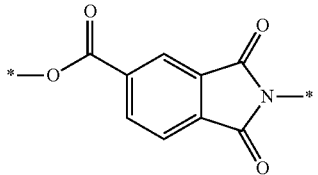
(L-9)

In addition, in $L^{41}$, the number of atoms constituting a chain through which a benzene ring directly linked to a pyrrolopyrrole structure as the mother nucleus structure of the pigment derivative is linked to $X^{41}$ is preferably 1 to 20. The lower limit is more preferably 2 or more and still more preferably 3 or more. The upper limit is more preferably 15 or less and still more preferably 10 or less. In addition, in $L^{42}$, the number of atoms constituting a chain through which a benzene ring directly linked to a pyrrolopyrrole structure as the mother nucleus structure of the pigment derivative is linked to $X^{42}$ is preferably 1 to 20. The lower limit is more preferably 2 or more and still more preferably 3 or more. The upper limit is more preferably 15 or less and still more preferably 10 or less. According to this aspect, the pigment dispersibility can be further improved. The detailed reason is not clear but is presumed to be that, by increasing the distance from the pyrrolopyrrole structure as the mother nucleus structure of the pigment derivative to $X^{41}$ and $X^{42}$, $X^{41}$ and $X^{42}$ is not likely to undergo steric hindrance, the interaction with the resin or the like is likely to occur, and thus the pigment dispersibility can be improved.

A solubility of the compound represented by Formula (4) in the solvent (25° C.) included in the composition is preferably 0 g/L to 0.1 g/L and more preferably 0 g/L to 0.01 g/L.

According to this aspect, the pigment dispersibility can be further improved.

It is preferable that the compound represented by Formula (1) is a compound having a maximum absorption wavelength in a wavelength range of 700 nm to 1,200 nm. In addition, a ratio A1/A2 of an absorbance A1 at a wavelength of 500 nm to an absorbance A2 at the maximum absorption wavelength is preferably 0.1 or lower and more preferably 0.05 or lower.

The absorbance of the compound in the present disclosure is a value obtained from the absorption spectrum of the compound in the solution. Examples of a measurement solvent used for the measurement of the absorption spectrum of the compound represented by Formula (4) in the solution include chloroform, dimethyl sulfoxide, and tetrahydrofuran. In a case where the compound represented by Formula (4) is soluble in chloroform, chloroform is used as the measurement solvent. In addition, in a case where the compound represented by Formula (1) is not soluble in chloroform and is soluble in dimethyl sulfoxide or tetrahydrofuran, dimethyl sulfoxide or tetrahydrofuran is used as the measurement solvent. Specific examples of the colorant derivative represented by Formula (3) include the following (3-1) to (3-25). In the following formulae, m, m1, m2, and m3 each independently represent an integer of 1 or more.

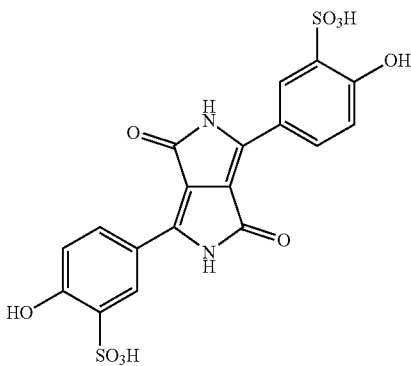
(3-1)

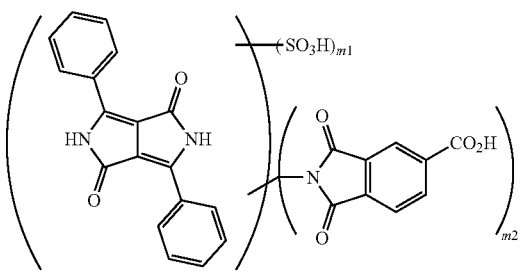
(3-2)

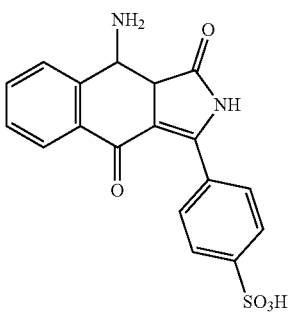
(3-3)

-continued
(3-4)
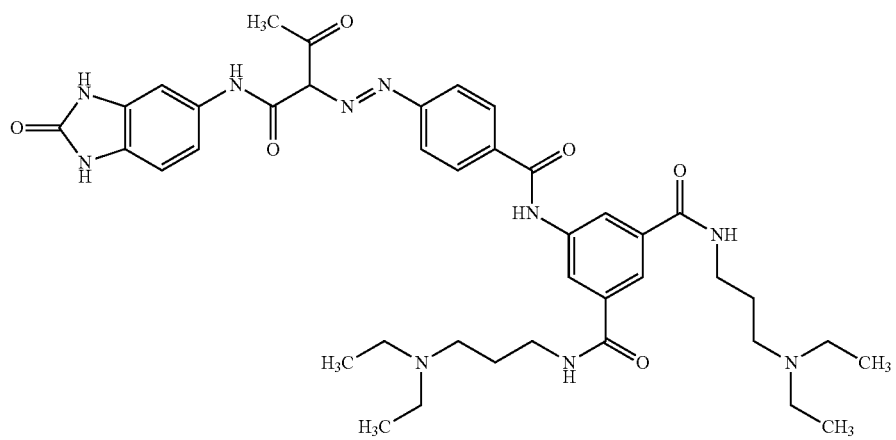
(3-5)
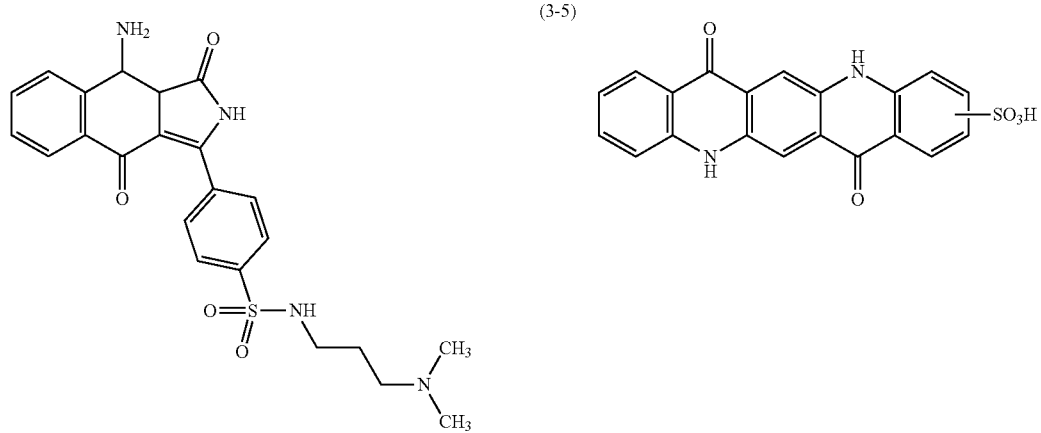
(3-6)
(3-7)
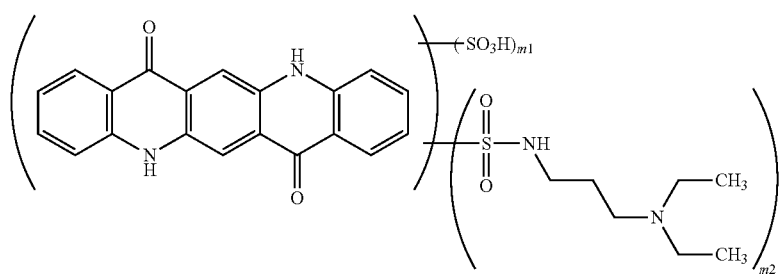
(3-8)
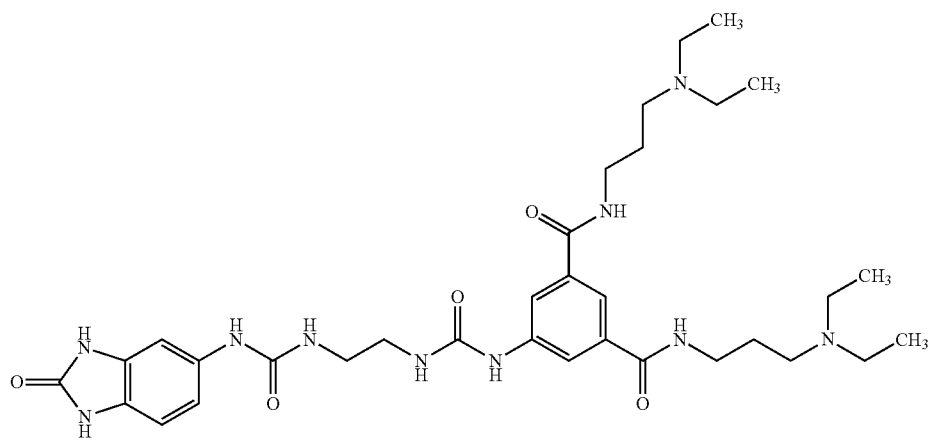

(3-9)
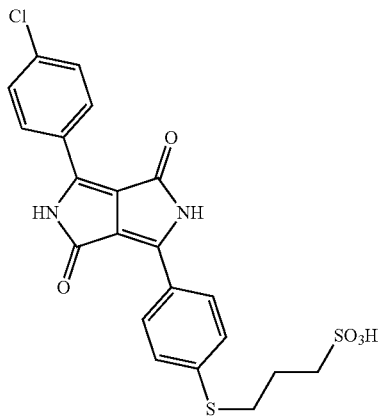
(3-10)
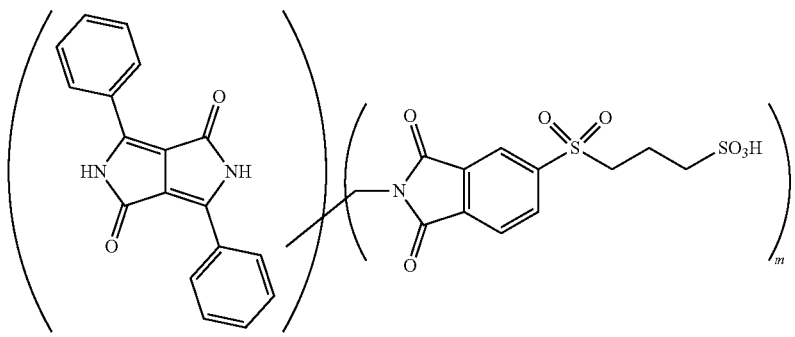
(3-11) (3-12)
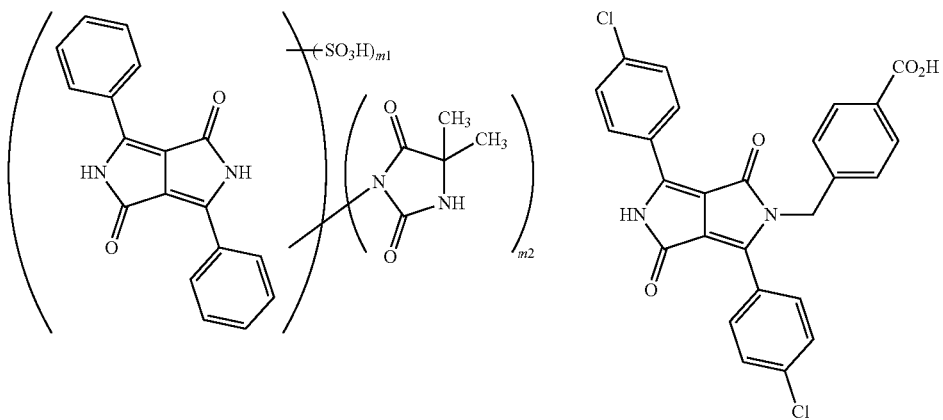
(3-13)
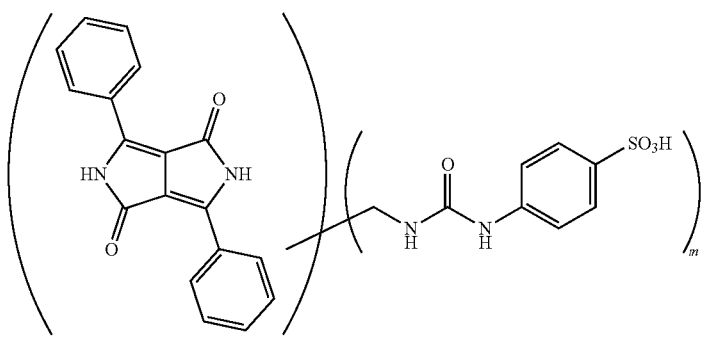

-continued
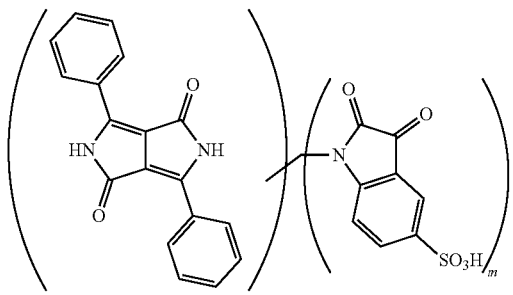 (3-14)
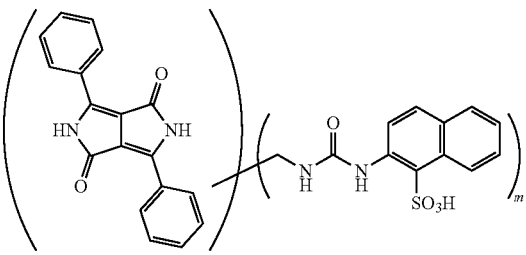 (3-17)
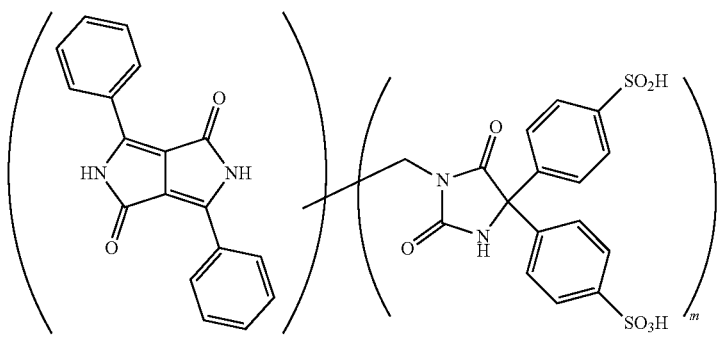 (3-18)
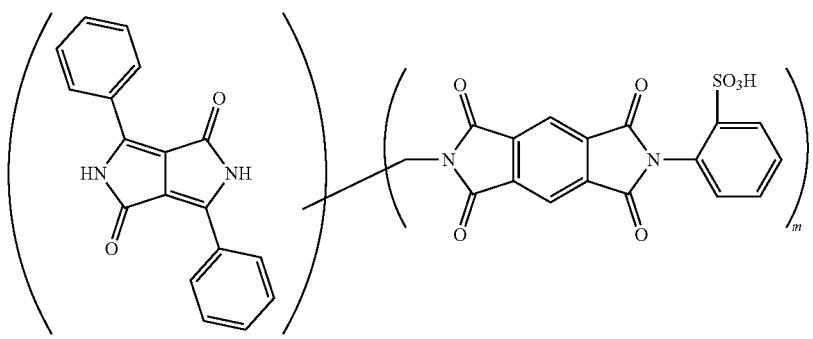 (3-19)
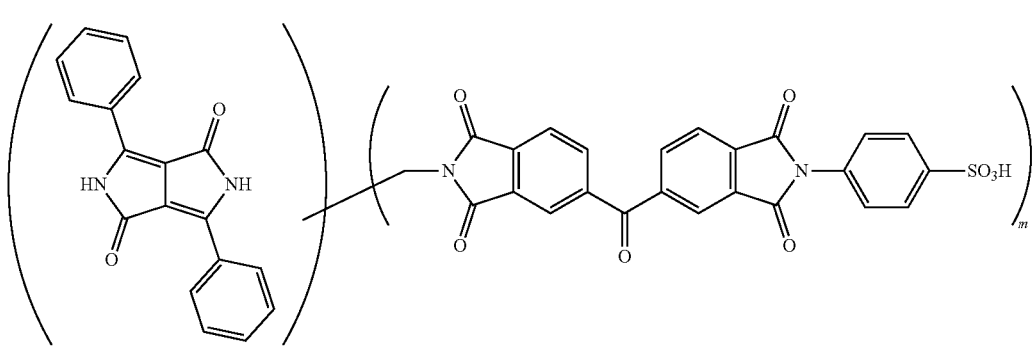 (3-20)

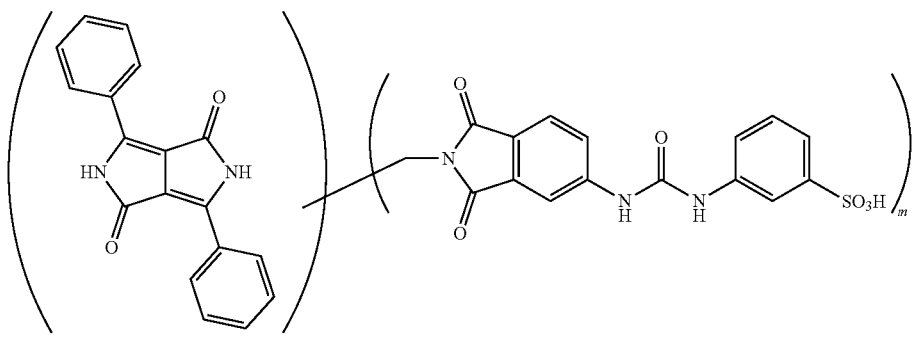
(3-21)
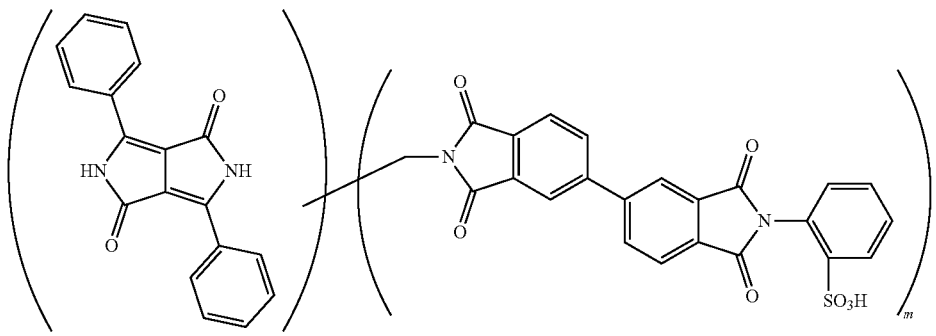
(3-22)
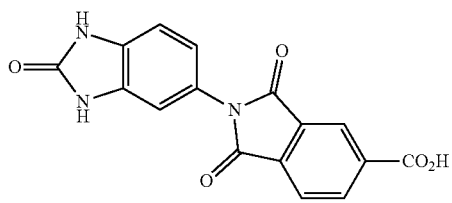
(3-23)
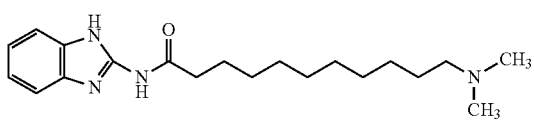
(3-24)
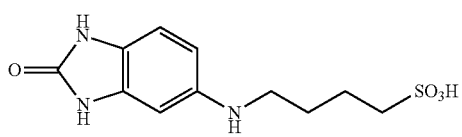
(3-25)
Specific examples of the compound represented by Formula (4) include the following compounds. In the following structural formulae, Me represents a methyl group, Bu represents a butyl group, and Ph represents a phenyl group.

Ar-1 to Ar-31 and R-1 to R-7 in the following tables are as follows. In the following structures, "*" represents a direct bond.

TABLE 5

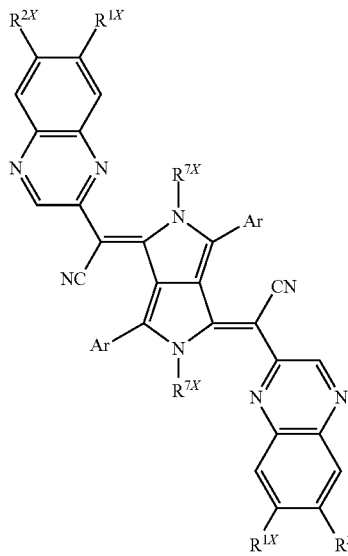

| | Ar | $R^{1X}$ | $R^{2X}$ | $R^{7X}$ |
|---|---|---|---|---|
| 4-1 | Ar-1 | H | H | R-1 |
| 4-2 | Ar-1 | Cl | H | R-1 |
| 4-3 | Ar-1 | H | Cl | R-1 |
| 4-4 | Ar-1 | Cl | Cl | R-1 |
| 4-5 | Ar-1 | Me | H | R-1 |
| 4-6 | Ar-1 | H | Me | R-1 |
| 4-7 | Ar-1 | Me | Me | R-1 |
| 4-8 | Ar-1 | OMe | H | R-1 |
| 4-9 | Ar-1 | H | OMe | R-1 |
| 4-10 | Ar-1 | OMe | OMe | R-1 |
| 4-11 | Ar-1 | Cl | Cl | R-1 |
| 4-12 | Ar-1 | Cl | Cl | R-2 |
| 4-13 | Ar-1 | Cl | Cl | R-3 |
| 4-14 | Ar-1 | Cl | Cl | R-4 |
| 4-15 | Ar-1 | Cl | Cl | R-5 |
| 4-16 | Ar-1 | Cl | Cl | R-6 |
| 4-17 | Ar-1 | Cl | Cl | R-7 |
| 4-18 | Ar-2 | Cl | Cl | R-1 |
| 4-19 | Ar-2 | H | H | R-1 |
| 4-20 | Ar-3 | Cl | Cl | R-1 |
| 4-21 | Ar-3 | H | H | R-1 |
| 4-22 | Ar-4 | H | H | R-1 |
| 4-23 | Ar-4 | Cl | H | R-1 |
| 4-24 | Ar-4 | H | Cl | R-1 |
| 4-25 | Ar-4 | Cl | Cl | R-1 |
| 4-26 | Ar-4 | Me | H | R-1 |
| 4-27 | Ar-4 | H | Me | R-1 |
| 4-28 | Ar-4 | Me | Me | R-1 |
| 4-29 | Ar-4 | OMe | H | R-1 |
| 4-30 | Ar-4 | H | OMe | R-1 |
| 4-31 | Ar-4 | OMe | OMe | R-1 |
| 4-32 | Ar-4 | Cl | Cl | R-1 |
| 4-33 | Ar-4 | Cl | Cl | R-2 |
| 4-34 | Ar-4 | Cl | Cl | R-3 |
| 4-35 | Ar-4 | Cl | Cl | R-4 |
| 4-36 | Ar-4 | Cl | Cl | R 5 |
| 4-37 | Ar-4 | Cl | Cl | R-6 |
| 4-38 | Ar-4 | Cl | Cl | R-7 |
| 4-39 | Ar-5 | H | H | R-1 |
| 4-40 | Ar-5 | Cl | H | R-1 |
| 4-41 | Ar-5 | H | Cl | R-1 |
| 4-42 | Ar-5 | Cl | Cl | R-1 |
| 4-43 | Ar-5 | Me | H | R-1 |
| 4-44 | Ar-5 | H | Me | R-1 |
| 4-45 | Ar-5 | Me | Me | R-1 |
| 4-46 | Ar-5 | OMe | H | R-1 |

TABLE 5-continued

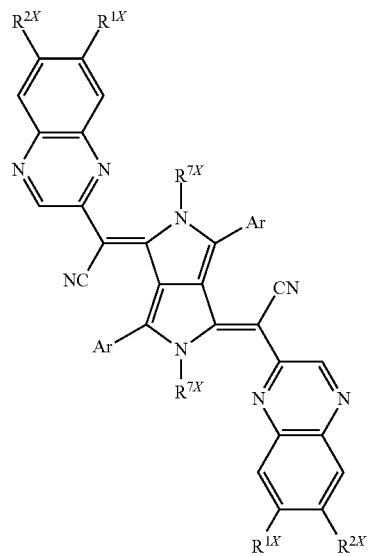

| | Ar | $R^{1X}$ | $R^{2X}$ | $R^{7X}$ |
|---|---|---|---|---|
| 4-47 | Ar-5 | H | OMe | R-1 |
| 4-48 | Ar-5 | OMe | OMe | R-1 |
| 4-49 | Ar-6 | Cl | Cl | R-1 |
| 4-50 | Ar-7 | Cl | Cl | R-1 |
| 4-51 | Ar-8 | H | H | R-1 |
| 4-52 | Ar-8 | Cl | H | R-1 |
| 4-53 | Ar-8 | H | Cl | R-1 |
| 4-54 | Ar-8 | Cl | Cl | R-1 |
| 4-55 | Ar-8 | Me | H | R-1 |
| 4-56 | Ar-8 | H | Me | R-1 |
| 4-57 | Ar-8 | Me | Me | R-1 |
| 4-58 | Ar-8 | OMe | H | R-1 |
| 4-59 | Ar-8 | H | OMe | R-1 |
| 4-60 | Ar-8 | OMe | OMe | R-1 |
| 4-61 | Ar-9 | Cl | Cl | R-1 |
| 4-62 | Ar-10 | Cl | Cl | R-1 |
| 4-63 | Ar-11 | Cl | Cl | R-1 |
| 4-64 | Ar-12 | Cl | Cl | R-1 |
| 4-65 | Ar-13 | Cl | H | R-1 |
| 4-66 | Ar-13 | H | Cl | R-1 |
| 4-67 | Ar-13 | Cl | Cl | R-1 |
| 4-68 | Ar-13 | Me | Me | R-1 |
| 4-69 | Ar-13 | OMe | OMe | R-1 |
| 4-70 | Ar-14 | Cl | Cl | R-1 |
| 4-71 | Ar-15 | Cl | H | R-1 |
| 4-72 | Ar-15 | H | Cl | R-1 |
| 4-73 | Ar-15 | Cl | Cl | R-1 |
| 4-74 | Ar-15 | Me | Me | R-1 |
| 4-75 | Ar-15 | OMe | OMe | R-1 |
| 4-76 | Ar-16 | Cl | Cl | R-1 |
| 4-77 | Ar-17 | Cl | Cl | R-1 |
| 4-78 | Ar-18 | Cl | Cl | R-1 |
| 4-79 | Ar-19 | Cl | H | R-1 |
| 4-80 | Ar-20 | Me | Me | R-1 |
| 4-81 | Ar-21 | Cl | Cl | R-1 |
| 4-82 | Ar-22 | Cl | Cl | R-1 |
| 4-83 | Ar-23 | Cl | H | R-1 |
| 4-84 | Ar-24 | H | Cl | R-1 |
| 4-85 | Ar-25 | Me | Me | R-1 |
| 4-86 | Ar-26 | OMe | OMe | R-1 |
| 4-87 | Ar-27 | OMe | OMe | R-1 |
| 4-88 | Ar-28 | Cl | Cl | R-1 |
| 4-89 | Ar-29 | Cl | H | R-1 |
| 4-90 | Ar-30 | Cl | H | R-1 |
| 4-91 | Ar-31 | Cl | Cl | R-1 |

TABLE 6

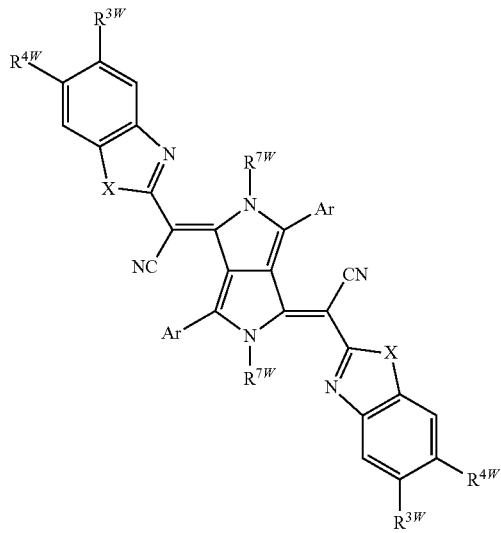

| | X | Ar | R³ᵂ | R⁴ᵂ | R⁷ᵂ |
|---|---|---|---|---|---|
| 4-91 | ○ | Ar-1 | H | H | R-1 |
| 4-92 | ○ | Ar-1 | Me | H | R-1 |
| 4-93 | ○ | Ar-1 | Cl | H | R-1 |
| 4-94 | ○ | Ar-1 | OMe | H | R-1 |
| 4-95 | ○ | Ar-1 | H | Me | R-1 |
| 4-96 | ○ | Ar-2 | H | H | R-1 |
| 4-97 | ○ | Ar-3 | H | H | R-1 |
| 4-98 | ○ | Ar-4 | H | H | R-1 |
| 4-99 | ○ | Ar-4 | Me | H | R-1 |
| 4-100 | ○ | Ar-4 | Cl | H | R-1 |
| 4-101 | ○ | Ar-4 | OMe | H | R-1 |
| 4-102 | ○ | Ar-4 | H | Me | R-1 |
| 4-103 | ○ | Ar-5 | H | H | R-1 |
| 4-104 | ○ | Ar-5 | Me | H | R-1 |
| 4-105 | ○ | Ar-5 | OMe | H | R-1 |
| 4-106 | ○ | Ar-6 | H | H | R-1 |
| 4-107 | ○ | Ar-7 | H | H | R-1 |
| 4-108 | ○ | Ar-8 | H | H | R-1 |
| 4-109 | ○ | Ar-8 | Me | H | R-1 |
| 4-110 | ○ | Ar-8 | OMe | H | R-1 |
| 4-111 | ○ | Ar-9 | H | H | R-1 |
| 4-112 | ○ | Ar-10 | H | H | R-1 |
| 4-113 | ○ | Ar-11 | H | H | R-1 |
| 4-114 | ○ | Ar-12 | H | H | R-1 |
| 4-115 | ○ | Ar-13 | H | H | R-1 |
| 4-116 | ○ | Ar-13 | Me | H | R-1 |
| 4-117 | ○ | Ar-13 | OMe | H | R-1 |
| 4-118 | ○ | Ar-14 | H | H | R-1 |
| 4-119 | ○ | Ar-15 | H | H | R-1 |
| 4-120 | ○ | Ar-15 | Me | H | R-1 |
| 4-121 | ○ | Ar-15 | OMe | H | R-1 |
| 4-122 | ○ | Ar-16 | H | H | R-1 |
| 4-123 | ○ | Ar-17 | H | H | R-1 |
| 4-124 | ○ | Ar-18 | H | H | R-1 |
| 4-125 | ○ | Ar-19 | H | H | R-1 |
| 4-126 | ○ | Ar-20 | H | H | R-1 |
| 4-127 | ○ | Ar-21 | H | H | R-1 |
| 4-128 | ○ | Ar-22 | H | H | R-1 |
| 4-129 | ○ | Ar-23 | H | H | R-1 |
| 4-130 | ○ | Ar-24 | H | H | R-1 |
| 4-131 | ○ | Ar-25 | H | H | R-1 |
| 4-132 | ○ | Ar-26 | H | H | R-1 |
| 4-133 | ○ | Ar-27 | H | H | R-1 |
| 4-134 | ○ | Ar-28 | H | H | R-1 |
| 4-135 | ○ | Ar-29 | H | H | R-1 |
| 4-136 | ○ | Ar-30 | H | H | R-1 |
| 4-137 | ○ | Ar-31 | H | H | R-1 |
| 4-139 | S | Ar-1 | H | H | R-1 |
| 4-140 | S | Ar-1 | Me | H | R-1 |
| 4-141 | S | Ar-1 | Cl | H | R-1 |
| 4-142 | S | Ar-1 | OMe | H | R-1 |
| 4-143 | S | Ar-1 | Me | Me | R-1 |

TABLE 6-continued

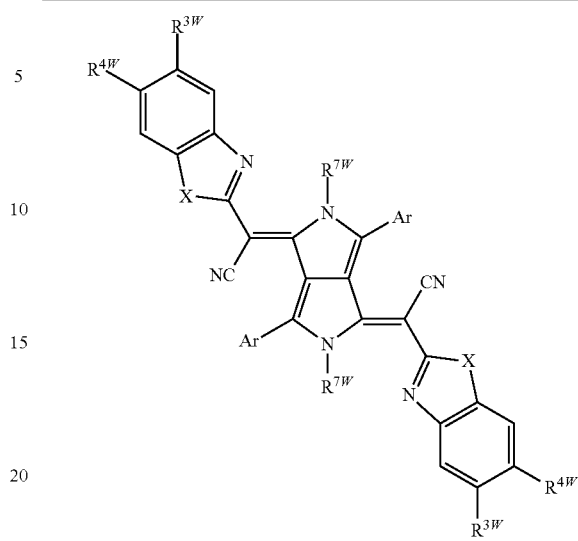

| | X | Ar | R³ᵂ | R⁴ᵂ | R⁷ᵂ |
|---|---|---|---|---|---|
| 4-144 | S | Ar-2 | H | H | R-1 |
| 4-145 | S | Ar-3 | H | H | R-1 |
| 4-146 | S | Ar-4 | H | H | R-1 |
| 4-147 | S | Ar-4 | Me | H | R-1 |
| 4-148 | S | Ar-4 | Cl | H | R-1 |
| 4-149 | S | Ar-4 | OMe | H | R-1 |
| 4-150 | S | Ar-4 | Me | Me | R-1 |
| 4-151 | S | Ar-4 | Me | Me | R-5 |
| 4-152 | S | Ar-5 | H | H | R-1 |
| 4-153 | S | Ar-5 | Me | Me | R-1 |
| 4-154 | S | Ar-5 | OMe | H | R-1 |
| 4-155 | S | Ar-6 | H | H | R-1 |
| 4-150 | S | Ar-7 | H | H | R-1 |
| 4-157 | S | Ar-8 | H | H | R-1 |
| 4-158 | S | Ar-8 | Me | Me | R-1 |
| 4-159 | S | Ar-8 | OMe | H | R-1 |
| 4-160 | S | Ar-9 | H | H | R-1 |
| 4-161 | S | Ar-10 | H | H | R-1 |
| 4-162 | S | Ar-11 | H | H | R-1 |
| 4-163 | S | Ar-12 | H | H | R-1 |
| 4-164 | S | Ar-13 | H | H | R-1 |
| 4-165 | S | Ar-13 | Me | Me | R-1 |
| 4-166 | S | Ar-13 | OMe | H | R-1 |
| 4-167 | S | Ar-14 | H | H | R-1 |
| 4-168 | S | Ar-15 | H | H | R-1 |
| 4-169 | S | Ar-15 | Me | Me | R-1 |
| 4-170 | S | Ar-15 | OMe | H | R-1 |
| 4-171 | S | Ar-16 | H | H | R-1 |
| 4-172 | S | Ar-17 | H | H | R-1 |
| 4-173 | S | Ar-18 | H | H | R-1 |
| 4-174 | S | Ar-19 | H | H | R-1 |
| 4-175 | S | Ar-20 | H | H | R-1 |
| 4-176 | S | Ar-21 | H | H | R-1 |
| 4-177 | S | Ar-22 | H | H | R-1 |
| 4-178 | S | Ar-23 | H | H | R-1 |
| 4-179 | S | Ar-24 | H | H | R-1 |
| 4-180 | S | Ar-25 | H | H | R-1 |
| 4-181 | S | Ar-26 | H | H | R-1 |
| 4-182 | S | Ar-27 | H | H | R-1 |
| 4-183 | S | Ar-28 | H | H | R-1 |
| 4-184 | S | Ar-29 | H | H | R-1 |
| 4-185 | S | Ar-30 | H | H | R-1 |

Ar-1
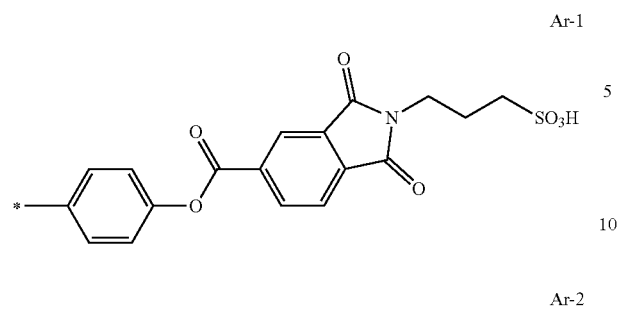
Ar-2
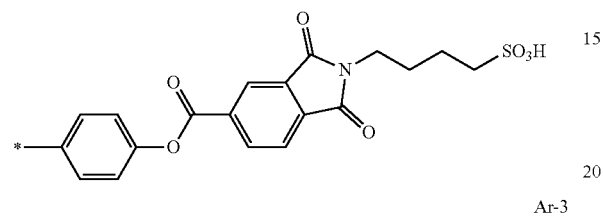
Ar-3
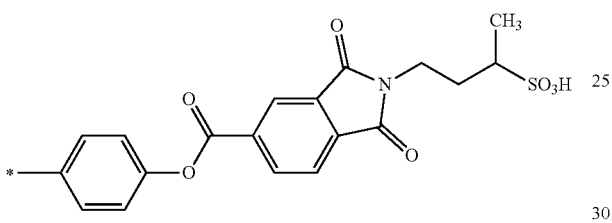
Ar-4
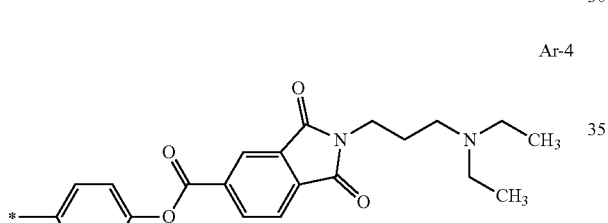
Ar-5
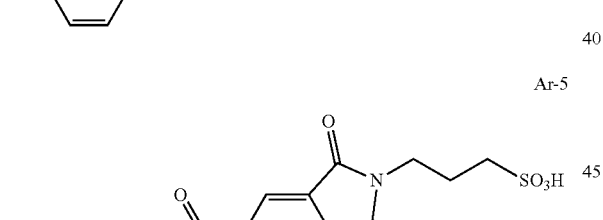
Ar-6
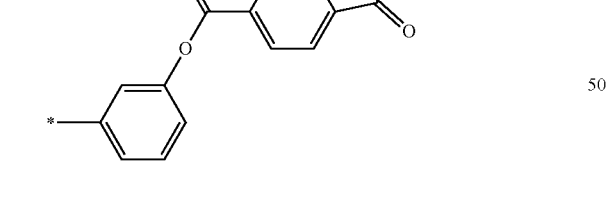
Ar-7
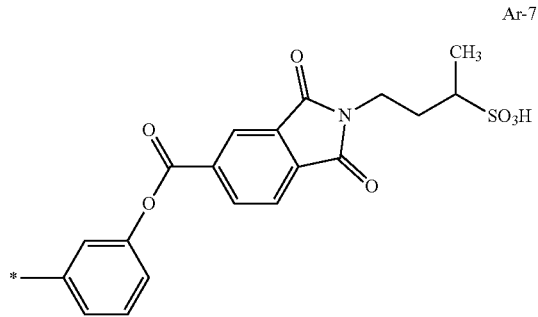
Ar-8
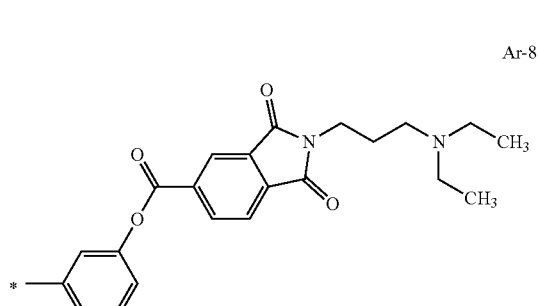
Ar-9
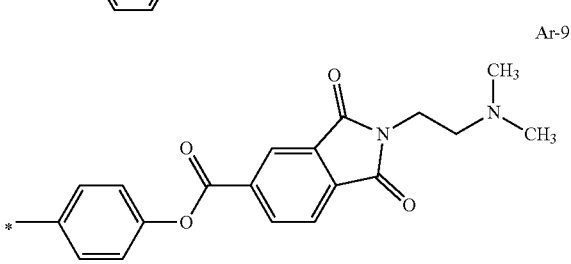
Ar-10
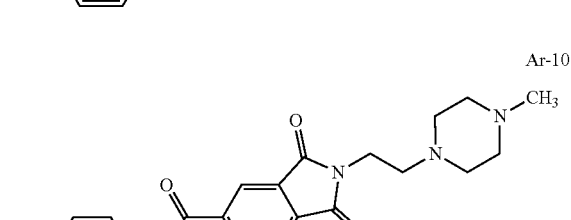
Ar-11
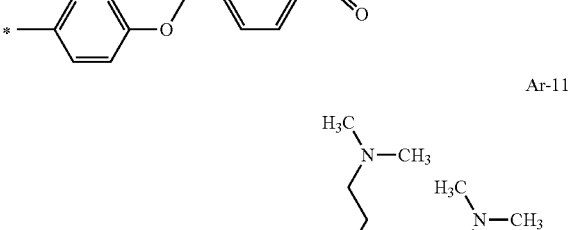
Ar-12
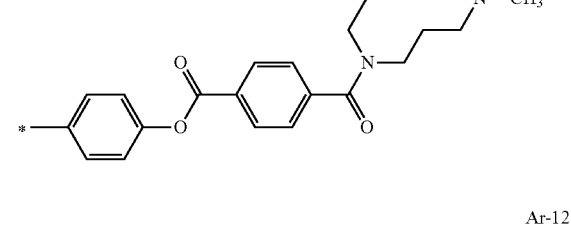
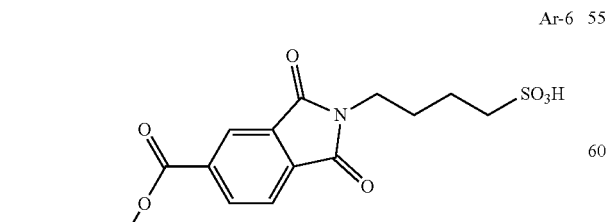
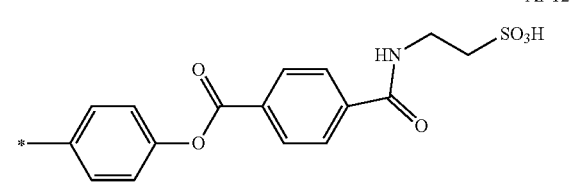

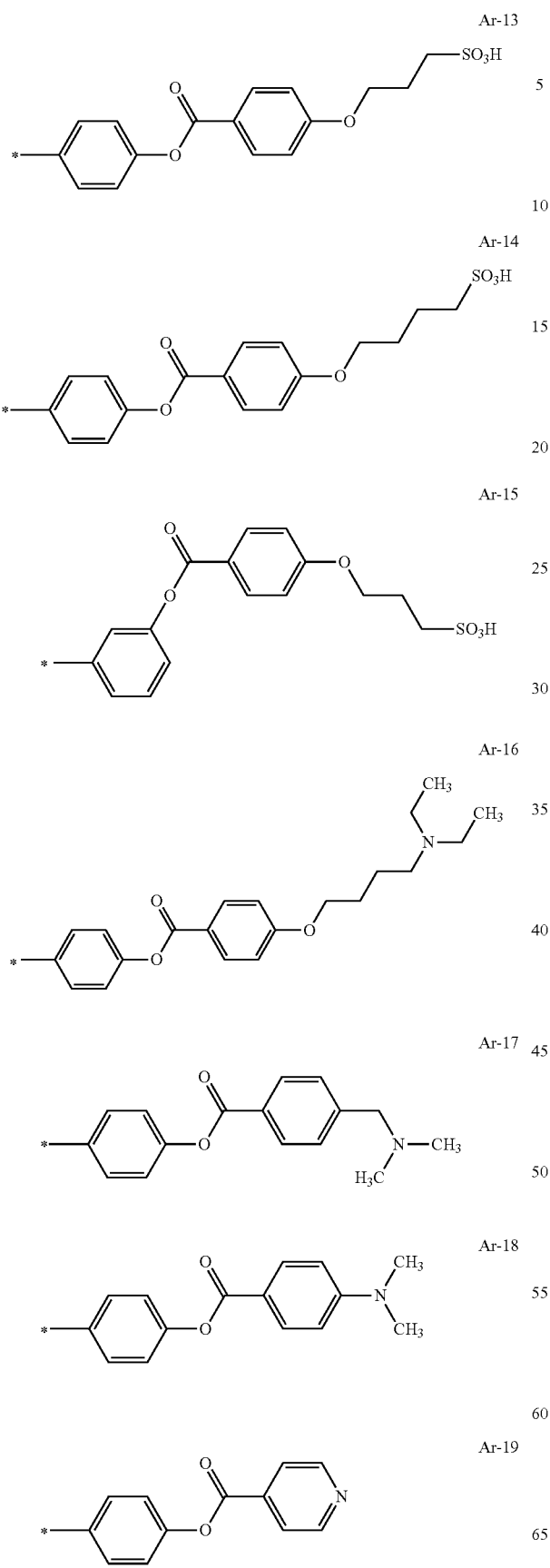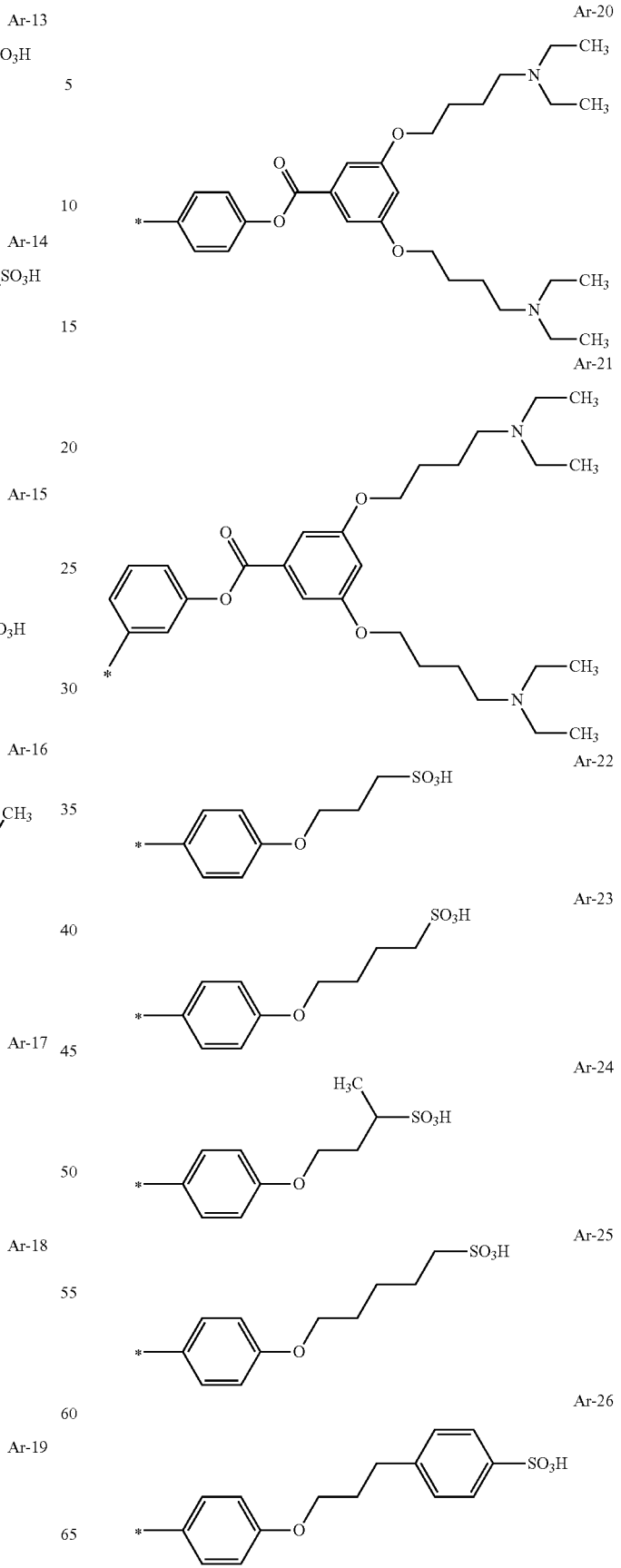

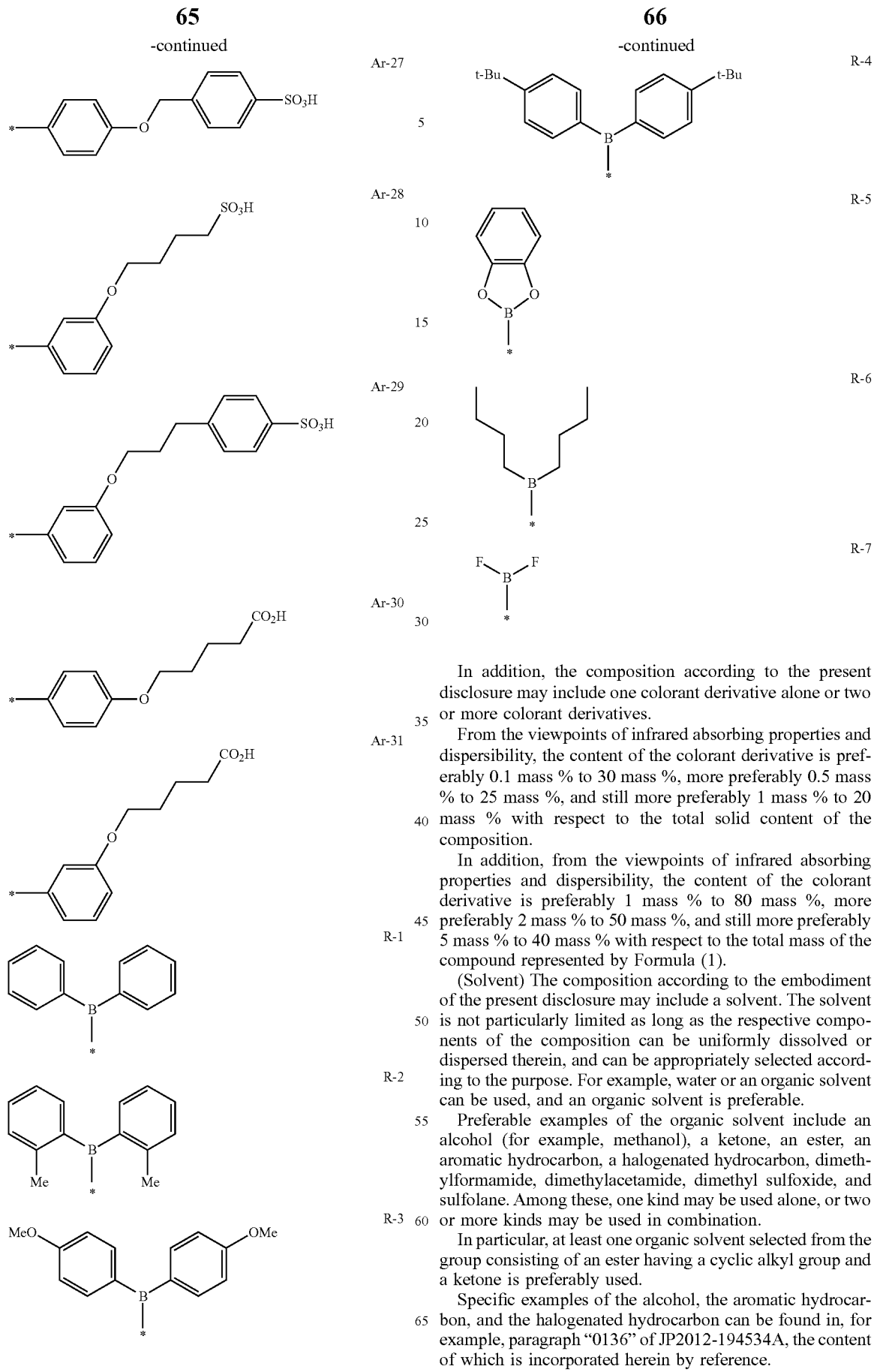

In addition, the composition according to the present disclosure may include one colorant derivative alone or two or more colorant derivatives.

From the viewpoints of infrared absorbing properties and dispersibility, the content of the colorant derivative is preferably 0.1 mass % to 30 mass %, more preferably 0.5 mass % to 25 mass %, and still more preferably 1 mass % to 20 mass % with respect to the total solid content of the composition.

In addition, from the viewpoints of infrared absorbing properties and dispersibility, the content of the colorant derivative is preferably 1 mass % to 80 mass %, more preferably 2 mass % to 50 mass %, and still more preferably 5 mass % to 40 mass % with respect to the total mass of the compound represented by Formula (1).

(Solvent) The composition according to the embodiment of the present disclosure may include a solvent. The solvent is not particularly limited as long as the respective components of the composition can be uniformly dissolved or dispersed therein, and can be appropriately selected according to the purpose. For example, water or an organic solvent can be used, and an organic solvent is preferable.

Preferable examples of the organic solvent include an alcohol (for example, methanol), a ketone, an ester, an aromatic hydrocarbon, a halogenated hydrocarbon, dimethylformamide, dimethylacetamide, dimethyl sulfoxide, and sulfolane. Among these, one kind may be used alone, or two or more kinds may be used in combination.

In particular, at least one organic solvent selected from the group consisting of an ester having a cyclic alkyl group and a ketone is preferably used.

Specific examples of the alcohol, the aromatic hydrocarbon, and the halogenated hydrocarbon can be found in, for example, paragraph "0136" of JP2012-194534A, the content of which is incorporated herein by reference.

Specific examples of the ester, the ketone, and the ether can be found in, for example, paragraph "0497" of JP2012-208494A (corresponding to paragraph "0609" of US2012/0235099A). Other examples include n-amyl acetate, ethyl propionate, dimethyl phthalate, ethyl benzoate, methyl sulfate, acetone, methyl isobutyl ketone, diethyl ether, and ethylene glycol monobutyl ether acetate.

As the solvent, one or more selected from ethanol, methanol, methyl 3-methoxypropionate, ethyl 3-methoxypropionate, methyl 3-ethoxypropionate, ethyl 3-ethoxypropionate, N-methyl-2-pyrrolidone, ethyl cellosolve acetate, ethyl lactate, butyl acetate, cyclohexyl acetate, diethylene glycol dimethyl ether, 2-heptanone, cyclopentanone, cyclohexanone, ethyl carbitol acetate, butyl carbitol acetate, ethylene glycol monobutyl ether acetate, propylene glycol monomethyl ether, and propylene glycol monomethyl ether acetate are preferable.

The content of the solvent is preferably 10 mass % to 90 mass % with respect to the total solid content of the composition. The lower limit is more preferably 15 mass % or higher and still more preferably 20 mass % or higher. The upper limit is more preferably 80 mass % or lower, and still more preferably 70 mass % or lower.

As the solvent, one kind or two or more kinds may be used. In a case where two or more solvents are used, it is preferable that the total content of the two or more solvents is in the above-described range.

In addition, from the viewpoint of environmental response, it is preferable that the composition according to the embodiment of the present disclosure does not include a solvent such as toluene.

(Chromatic Colorant, Black Colorant, Colorant that Shields Visible Light)

The composition according to the present disclosure may include at least one selected from the group consisting of a chromatic colorant and a black colorant (hereinafter, a chromatic colorant and a black colorant will also be collectively called "visible colorant"). In the present disclosure, "chromatic colorant" denotes a colorant other than a white colorant and a black colorant. It is preferable that the chromatic colorant is a colorant having an absorption in a wavelength range of 400 nm or longer and shorter than 650 nm.

—Chromatic Colorant—

In the present disclosure, the chromatic colorant may be a pigment or a dye.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, simply referred to as "particle size distribution") which can be used, it is preferable that secondary particles having a particle size of (average particle size+100) nm account for 70 mass % or higher, preferably, 80 mass % or higher in the pigment. The particle size distribution of the secondary particles can be measured using a scattering intensity distribution.

The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

The pigment is preferably an organic pigment, and examples thereof are as follows. However, the present disclosure is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

In addition, as the dye, at least one of an acid dye or a derivative thereof may be suitably used. Furthermore, for example, at least one of a direct dye, a basic dye, a mordant dye, an acid mordant dye, an azoic dye, a dispersed dye, an oil-soluble dye, a food dye, or a derivative thereof can be suitably used.

Specific examples of the acid dye are shown below, but the present disclosure is not limited to these examples. For example, the following dyes and derivatives thereof can be used:

acid alizarin violet N;

acid blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1; acid chrome violet K;

acid Fuchsin and acid green 1, 3, 5, 9, 16, 25, 27, and 50;

acid orange 6, 7, 8, 10, 12, 50, 51, 52, 56, 63, 74, and 95;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;

acid violet 6B, 7, 9, 17, and 19;

acid yellow 1, 3, 7, 9, 11, 17, 23, 25, 29, 34, 36, 42, 54, 72, 73, 76, 79, 98, 99, 111, 112, 114, 116, 184, and 243; and Food Yellow 3.

In addition to the above-described examples, an azo acid dye, a xanthene acid dye, and a phthalocyanine acid dye are preferably used, and acid dyes, such as C.I. Solvent Blue 44 and 38, C.I. Solvent Orange 45, Rhodamine B, and Rhodamine 110 and derivatives of the dyes are also preferably used.

Among these, it is preferable that the dye is a colorant selected from the group consisting of a triarylmethane dye, an anthraquinone dye, an azomethine dye, a benzylidene dye, an oxonol dye, a cyanine dye, a phenothiazine dye, a pyrrolopyrazole azo methine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

—Black Colorant—

It is preferable that the black colorant is an organic black colorant. In the present disclosure, the black colorant as the colorant that shields visible light denotes a material that absorbs visible light and allows at least a part of infrared light. Accordingly, in the present disclosure, examples of the black colorant as the colorant that shields visible light do not include carbon black and titanium black. As the black colorant as the colorant that shields visible light, for example, a bisbenzofuranone compound, an azomethine compound, a perylene compound, or an azo compound can also be used.

Examples of the bisbenzofuranone compound include compounds described in JP2010-534726A, JP2012-515233A, and JP2012-515234A. For example, "Irgaphor Black" (manufactured by BASF SE) is available.

Examples of the perylene compound include C.I. Pigment Black 31 and 32. Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available. The azo compound is not particularly limited, and for example, a compound represented by the following Formula (A-1) can be suitably used.

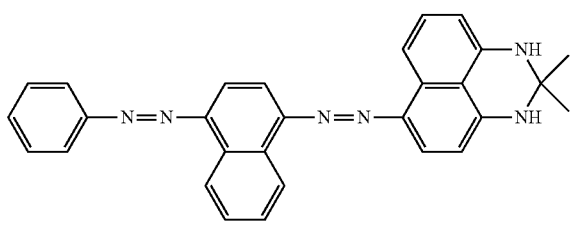

A-1

—Colorant that Shields Visible Light—

In a case where an infrared transmitting filter that allows transmission of infrared light in a range that is not absorbed by the compound represented by Formula (1) is manufactured using the composition according to the embodiment of the present disclosure, it is preferable that the composition includes the colorant that shields visible light.

In addition, it is preferable that black, gray, or a color similar to black or gray is exhibited using a combination of a plurality of colorants that shields visible light.

In addition, it is preferable that the colorant that shields visible light is a material that absorbs light in a wavelength range of violet to red.

In addition, it is preferable that the colorant that shields visible light is a colorant that shields light in a wavelength range of 450 nm to 650 nm.

In the present disclosure, it is preferable that the colorant that shields visible light satisfies at least one of the following requirement (1) or (2), and it is more preferable that the coloring material that shields visible light satisfies the requirement (1).

(1): An aspect in which the colorant that shields visible light includes two or more chromatic colorants (2): An aspect in which the colorant that shields visible light includes a black colorant In addition, in the present disclosure, the black colorant as the colorant that shields visible light denotes a material that absorbs visible light and allows at least a part of infrared light. Accordingly, in the present disclosure, the organic black colorant as the colorant that shields visible light does not denote a black colorant that absorbs both visible light and infrared light, for example, carbon black or titanium black.

It is preferable that the colorant that shields visible light is a material in which a ratio A/B of a minimum value A of an absorbance in a wavelength range of 450 nm to 650 nm to a minimum value B of an absorbance in a wavelength range of 900 nm to 1,300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants.

In a case where the colorant that shields visible light includes two or more chromatic colorants, it is preferable that the chromatic colorants are selected from the group consisting of a red colorant, a green colorant, a blue colorant, a yellow colorant, a violet colorant, and an orange colorant.

In a case where the colorant that shields visible light is formed using a combination of two or more chromatic colorants, examples of the combination of chromatic colorants are as follows.

(1) An aspect in which the colorant that shields visible light includes a yellow colorant, a blue colorant, a violet colorant, and a red colorant (2) An aspect in which the colorant that shields visible light includes a yellow colorant, a blue colorant, and a red colorant (3) An aspect in which the colorant that shields visible light includes a yellow colorant, a violet colorant, and a red colorant (4) An aspect in which the colorant that shields visible light includes a yellow colorant and a violet colorant (5) An aspect in which the colorant that shields visible light includes a green colorant, a blue colorant, a violet colorant, and a red colorant (6) An aspect in which the colorant that shields visible light includes a violet colorant and an orange colorant (7) An aspect in which the colorant that shields visible light includes a green colorant, a violet colorant, and a red colorant (8) An aspect in which the colorant that shields light in the visible range includes a green colorant and a red colorant Specific examples of the aspect (1) include C.I. Pigment Yellow 139 or 185 as a yellow pigment, C.I. Pigment Blue 15:6 as a blue pigment, C.I. Pigment Violet 23 as a violet pigment, and C.I. Pigment Red 254 or 224 as a red pigment.

Specific examples of the aspect (2) include C.I. Pigment Yellow 139 or 185 as a yellow pigment, C.I. Pigment Blue 15:6 as a blue pigment, and C.I. Pigment Red 254 or 224 as a red pigment.

Specific examples of the aspect (3) include C.I. Pigment Yellow 139 or 185 as a yellow pigment, C.I. Pigment Violet 23 as a violet pigment, and C.I. Pigment Red 254 or 224 as a red pigment.

Specific examples of the aspect (4) include C.I. Pigment Yellow 139 or 185 as a yellow pigment, and C.I. Pigment Violet 23 as a violet pigment.

Specific examples of the aspect (5) include C.I. Pigment Green 7 or 36 as a green pigment, C.I. Pigment Blue 15:6 as a blue pigment, C.I. Pigment Violet 23 as a violet pigment, and C.I. Pigment Red 254 or 224 as a red pigment.

Specific examples of the aspect (6) include C.I. Pigment Violet 23 as a violet pigment, and C.I. Pigment Orange 71 as an orange pigment.

Specific examples of the aspect (7) include C.I. Pigment Green 7 or 36 as a green pigment, C.I. Pigment Violet 23 as a violet pigment, and C.I. Pigment Red 254 or 224 as a red pigment.

Specific examples of the aspect (8) include C.I. Pigment Green 7 or 36 as a green pigment, and C.I. Pigment Red 254 or 224 as a red pigment.

For example, ratios (mass ratios) between the respective colorants are as follows.

agent is a compound having an alkoxysilyl group. In addition, it is preferable that the functional group other than a hydrolyzable group is a group which interacts with the resin or the like or forms a bond with the resin or the like to exhibit affinity. Examples of the functional group other than a hydrolyzable group include a vinyl group, a styryl group, a (meth)acryloyl group, a mercapto group, an epoxy group, an oxetanyl group, an amino group, an ureido group, a sulfide group, and an isocyanate group. Among these, a (meth)acryloyl group or an epoxy group is preferable. In addition, examples of the silane coupling agent include a compound described in paragraphs "0018" to "0036" of JP2009-288703A, a compound described in paragraphs "0056" to "0066" of JP2009-242604A, and a compound described in paragraphs "0229" to "0236" of WO2015/166779A, the content of which is incorporated herein by reference.

The content of the silane coupling agent is preferably 0.01 mass % to 15.0 mass % and more preferably 0.05 mass % to 10.0 mass % with respect to the total solid content of the composition. As the silane coupling agent, one kind may be used alone, or two or more kinds may be used. In a case where two or more silane coupling agents are used in combination, it is preferable that the total content of the silane coupling agents is in the above-described range.

(Surfactant)

The composition according to the embodiment of the present disclosure may include a surfactant from the viewpoint of further improving application properties. As the surfactants, various surfactants such as a fluorine surfactant, a nonionic surfactant, a cationic surfactant, an anionic

| No. | Yellow Colorant | Green Colorant | Blue Colorant | Violet Colorant | Red Colorant | Orange Colorant |
|---|---|---|---|---|---|---|
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | 0.2 to 0.8 | | |
| 5 | | 0.1 to 0.4 | 0.1 to 0.4 | 0.1 to 0.4 | 0.1 to 0.4 | |
| 6 | | | | 0.2 to 0.6 | | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

In a case where the composition according to the embodiment of the present disclosure includes a visible colorant, the content of the visible colorant is preferably 0.01 mass % to 50 mass % with respect to the total solid content of the composition. The lower limit is more preferably 0.1 mass % or higher and still more preferably 0.5 mass % or higher. The upper limit is more preferably 30 mass % or lower, and still more preferably 15 mass % or lower.

The content of the visible colorant is preferably 10 parts by mass to 1,000 parts by mass and more preferably 50 parts by mass to 800 parts by mass with respect to 100 parts by mass of the compound represented by Formula (1).

(Silane Coupling Agent)

The composition according to the embodiment of the present disclosure may include a silane coupling agent. In the present disclosure, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling surfactant, or a silicone surfactant can be used. The details of the surfactant can be found in paragraphs "0238" to "0245" of WO2015/166779A, the content of which is incorporated herein by reference.

By the composition according to the embodiment of the present disclosure containing a fluorine surfactant, liquid characteristics (for example, fluidity) of a coating solution prepared from the coloring composition are further improved, and the uniformity in coating thickness and liquid saving properties can be further improved. In addition, a film having a uniform thickness with reduced unevenness in thickness can be formed more suitably.

The fluorine content in the fluorine surfactant is preferably 3 mass % to 40 mass %, more preferably 5 mass % to 30 mass %, and still more preferably 7 mass % to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-041318A (paragraphs "0060" to "0064" of corresponding WO2014/17669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present disclosure.

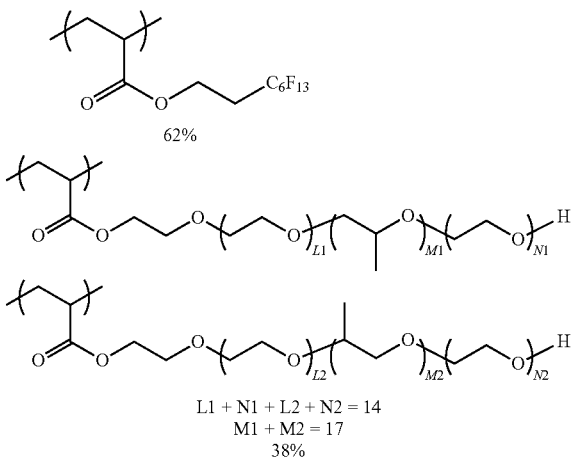

The weight-average molecular weight of the compound is preferably 3,000 to 50,000 and, for example, 14,000. In the compound, "%" representing the proportion of a constitutional unit is mol %.

In addition, as the fluorine surfactant, a fluorine-containing polymer having an ethylenically unsaturated group at a side chain can also be used. Specific examples include compounds described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

The content of the surfactant is preferably 0.001 to 5.0 mass % and more preferably 0.005 to 3.0 mass % with respect to the total solid content of the composition. As the surfactant, one kind may be used alone, or two or more kinds may be used. In a case where two or more surfactants are used in combination, it is preferable that the total content of the two or more surfactants is in the above-described range.

(Ultraviolet Absorber)

It is preferable that the composition according to the embodiment of the present disclosure further includes an ultraviolet absorber. Examples of the ultraviolet absorber include conjugated diene compound and a diketone compound. Among these, a conjugated diene compound is preferable. As the conjugated diene compound, a compound represented by the following Formula (UV-1) is more preferable.

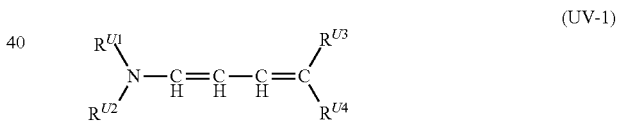

In Formula (UV-1), $R^{U1}$ and $R^{U2}$ each independently represent a hydrogen atom, an alkyl group having 1 to 20 carbon atoms, or an aryl group having 6 to 20 carbon atoms, and may be the same as or different from each other but does not represent a hydrogen atom at the same time.

$R^{U1}$ and $R^{U2}$ may form a cyclic amino group with a nitrogen atom bonded to $R^{U1}$ and $R^{U2}$. Examples of the cyclic amino group include a piperidino group, a morpholino group, a pyrrolidino group, a hexahydroazepino group, and a piperazino group.

$R^{U1}$ and $R^{U2}$ each independently represent preferably an alkyl group having 1 to 20 carbon atoms, more preferably an alkyl group having 1 to 10 carbon atoms, and still more preferably an alkyl group having 1 to 5 carbon atoms.

$R^{U3}$ and $R^{U4}$ represent an electron-withdrawing group. $R^{U3}$ and $R^{U4}$ represent preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group. In addition, $R^{U3}$ and $R^{U4}$ may be bonded to each other to form a cyclic electron-withdrawing group. Examples of the cyclic electron-withdrawing group which is formed by $R^{U3}$ and $R^{U4}$ being bonded to each other include a 6-membered ring having two carbonyl groups.

At least one of $R^{U1}$, $R^{U2}$, $R^{U3}$, or $R^{U4}$ may represent a polymer obtained from a monomer which is bonded to a vinyl group through a linking group. At least one of $R^{U1}$, $R^{U2}$$R^{u3}$, or $R^{U4}$ may represent a copolymer obtained from the above polymer and another monomer.

The description of the substituent of the ultraviolet absorber represented by Formula (UV-1) can be found in paragraph "0320" to "0327" of JP2013-068814A, the content of which is incorporated herein by reference. Examples of a commercially available product of the ultraviolet absorber represented by Formula (UV-1) include UV503 (manufactured by Daito Chemical Co., Ltd.).

As the diketone compound used as the ultraviolet absorber, a compound represented by the following Formula (UV-2) is preferable.

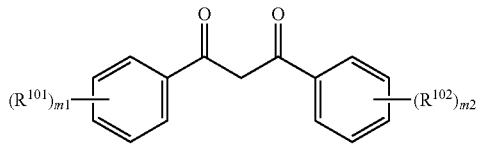

(UV-2)

In Formula (UV-2), $R^{101}$ and $R^{102}$ each independently represent a substituent, and m1 and m2 each independently represent an integer of 0 to 4. Examples of the substituent include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroayloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxy group, a halogen atom, and a cyano group. Among these, an alkyl group or an alkoxy group is preferable.

The number of carbon atoms in the alkyl group is preferably 1 to 20. The alkyl group is, for example, linear, branched, or cyclic, and is preferably linear or branched and more preferably branched.

The number of carbon atoms in the alkoxy group is preferably 1 to 20. The alkoxy group is, for example, linear, branched, or cyclic, and is preferably linear or branched and more preferably branched.

It is preferable that one of $R^{101}$ and $R^{102}$ represent an alkyl group and the other one of $R^{101}$ and $R^{102}$ represent an alkoxy group.

m1 and m2 each independently represent preferably an integer of 0 to 2, more preferably 0 or 1, and still more preferably 1.

Examples of the compound represented by Formula (UV-2) include the following compound.

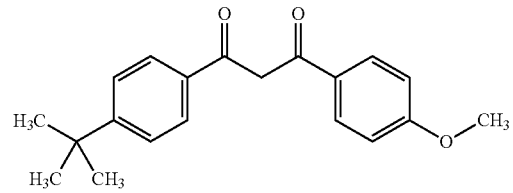 [SMILES: COc1ccc(C(=O)CC(=O)c2ccc(C(C)(C)C)cc2)cc1]

As the ultraviolet absorber, UVINUL A (manufactured by BASF SE) can also be used. In addition, as the ultraviolet absorber, an ultraviolet absorber such as an amino diene compound, a salicylate compound, a benzophenone compound, a benzotriazole compound, an acrylonitrile compound, or a triazine compound can be preferably used. Specifically, a compound described in JP2013-068814A can be used. As the benzotriazole compound, MYUA series (manufactured by Miyoshi Oil&Fat Co., Ltd.; The Chemical Daily, Feb. 1, 2016) may be used.

The content of the ultraviolet absorber is preferably 0.01 mass % to 10 mass % and more preferably 0.01 mass % to 5 mass % with respect to the mass of the total solid content of the composition.

(Polymerization Inhibitor)

The composition according to the embodiment of the present disclosure may include a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and N-nitrosophenylhydroxyamine salt (for example, an ammonium salt or a cerium (III) salt).

Among these, p-methoxyphenol is preferable. The polymerization inhibitor may also function as an antioxidant. The content of the polymerization inhibitor is preferably 0.01 mass % to 5 mass % with respect to the total solid content of the composition.

(Other Components)

Optionally, the composition according to the embodiment of the present disclosure may further include a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent). By the infrared absorbing composition appropriately including the components, desired stability, film properties, and the like of an optical filter such as a near infrared cut filter can be adjusted. The details of the components can be found in, for example, paragraph "0183" of JP2012-003225A (corresponding to "0237" of US2013/0034812A) and paragraphs "0101" to "0104" and "0107" to "0109" of JP2008-250074A, the contents of which are incorporated herein by reference. As the antioxidant, for example, a phenol compound, a phosphorus compound, (for example, a compound described in paragraph "0042" of JP2011-090147A), or a thioether compound can be used. Examples of a commercially available product of the antioxidant include ADEKA STAB series (AO-20, AO-30, AO-40, AO-50, AO-50F, AO-60, AO-60G, AO-80, and AO-330, manufactured by Adeka Corporation). The content of the antioxidant is preferably 0.01 mass % to 20 mass % and more preferably 0.3 mass % to 15 mass % with respect to the total solid content of the composition. As the antioxidant, one kind may be used alone, or two or more kinds may be used. In a case where two or more antioxidants are used in combination, it is preferable that the total content of the antioxidants is in the above-described range.

(Preparation of Composition)

The composition according to the embodiment of the present disclosure can be prepared by mixing the above-described various components. In addition, It is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (having a high density and an ultrahigh molecular weight) such as polyethylene or polypropylene (PP). Among these materials, polypropylene (including high-density polypropylene) or nylon is preferable.

The pore diameter of the filter is preferably 0.01 µm to 7.0 µm, more preferably 0.01 µm to 3.0 µm, and still more preferably 0.05 µm to 0.5 µm. In the above-described range, fine foreign matter, which inhibits preparation of a fine and smooth composition in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd., or Kits Microfilter Corporation.

(Use of Composition)

The composition according to the embodiment of the present disclosure can be made liquid. Therefore, a film can be easily formed, for example, by applying the composition according to the embodiment of the present disclosure to a substrate or the like and drying the resin composition.

For example, in a case where a film is formed by coating, the viscosity of the composition according to the embodiment of the present disclosure is preferably in a range of 1 mPa·s to 100 mPa·s from the viewpoint of application properties. The lower limit is more preferably 2 mPa·s or higher and still more preferably 3 mPa·s or higher. The upper limit is more preferably 50 mPa·s or lower, still more preferably 30 mPa·s or lower, and still more preferably 15 mPa·s or lower.

The total solid content of the composition according to the embodiment of the present disclosure changes depending on a coating method and, for example, is preferably 1 mass % to 50 mass %. The lower limit is more preferably 10 mass % or higher. The upper limit is more preferably 30 mass % or lower.

The use of the composition according to the embodiment of the present disclosure is not particularly limited. The composition according to the embodiment of the present disclosure can be preferably used to form an infrared cut filter or the like. For example, the composition can be preferably used, for example, for an infrared cut filter (for example, an infrared cut filter for a wafer level lens) on a light receiving side of a solid image pickup element or as an infrared cut filter on a back surface side (opposite to the light receiving side) of a solid image pickup element In particular, the composition can be preferably used as an infrared cut filter on a light receiving side of a solid image pickup element. In addition, by the composition according to the embodiment of the present disclosure including the colorant that shields visible light, an infrared transmitting filter that can allow transmission of only infrared light at a specific wavelength or higher can also be formed. For example, an infrared transmitting filter that shields light in a wavelength of 400 nm to 900 nm and can allow transmission of infrared light in a wavelength range of 900 nm or longer can also be formed.

In addition, it is preferable that the composition according to the embodiment of the present disclosure is stored in a storage container.

As the storage container, in order to prevent infiltration of impurities (contamination) into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

<Film>

A film according to the embodiment of the present disclosure is a film that is formed of the composition according to the embodiment of the present disclosure or a film that is formed by curing the composition according to the embodiment of the present disclosure. In addition, in a case where the resin composition according to the embodiment of the present disclosure includes a solvent, the film is preferably a film from which the solvent is removed or a cured film from which the solvent is removed.

The film according to the embodiment of the present disclosure can be preferably used as an infrared cut filter. In addition, the film according to the embodiment of the present disclosure can also be used as a heat ray shielding filter or an infrared transmitting filter. The film according to the embodiment of the present disclosure may be used in a state where it is laminated on a support, or may be peeled off from a support. The film according to the embodiment of the present disclosure may be a film having a pattern or a film (flat film) not having a pattern.

The thickness of the film according to the embodiment of the present disclosure can be appropriately adjusted according to the purpose. The thickness of the film is preferably 20 µm or less, more preferably 10 µm or less, and still more preferably 5 µm or less. For example, the lower limit of the thickness of the film is preferably 0.1 µm or more, more preferably 0.2 µm or more, and still more preferably 0.3 µm or more.

The film according to the embodiment of the present disclosure has a maximum absorption wavelength preferably in a wavelength range of 600 nm to 1,200 nm, more preferably in a wavelength range of 700 nm to 1,000 nm, and still more preferably in a wavelength range of 740 nm to 960 nm.

In a case where the film according to the embodiment of the present disclosure is used as an infrared cut filter, in the present invention, it is preferable that the film according to the embodiment of the present disclosure satisfies at least one of the following condition (1), . . . , or (4), and it is more preferable that the film satisfy all the following conditions (1) to (4).

(1) A transmittance at a wavelength of 400 nm is preferably 70% or higher, more preferably 80% or higher, still more preferably 85% or higher, and still more preferably 90% or higher (2) A transmittance at a wavelength of 500 nm is preferably 70% or higher, more preferably 80% or higher, still more preferably 90% or higher, and still more preferably 95% or higher (3) A transmittance at a wavelength of 600 nm is preferably 70% or higher, more preferably 80% or higher, still more preferably 90% or higher, and still more preferably 95% or higher (4) A transmittance at a wavelength of 650 nm is preferably 70% or higher, more preferably 80% or higher, still more preferably 90% or higher, and still more preferably 95% or higher The film according to the embodiment of the present disclosure can also be used in combination with a color filter that includes a chromatic colorant. The color filter can be manufactured using a coloring composition including a chromatic colorant. Examples of the chromatic colorant include the chromatic colorants described regarding the composition according to the embodiment of the present disclosure. The coloring composition may further include, for example, a resin, a curable compound, a polymerization initiator, a surfactant, a solvent, a polymerization inhibitor, and an ultraviolet absorber. In more detail, for example, the materials described above can be used.

In a case where the film according to the embodiment of the present disclosure is used in combination with a color filter, it is preferable that the color filter is disposed on an optical path of the film according to the embodiment of the present disclosure. For example, the film according to the embodiment of the present disclosure and the color filter can be laminated to be used as a laminate. In the laminate, the film according to the embodiment of the present disclosure and the color filter may be or may not be adjacent to each other in a thickness direction. In a case where the film according to the embodiment of the present disclosure is not adjacent to the color filter in the thickness direction, the film according to the embodiment of the present disclosure may be formed on another support other than a support on which the color filter is formed, or another member (for example, a microlens or a planarizing layer) constituting a solid image pickup element may be interposed between the film according to the embodiment of the present disclosure and the color filter.

In the present disclosure, "infrared cut filter" refers to a filter that allows transmission of light (visible light) in the visible range and shields at least a part of light (infrared light) in the near infrared range. The infrared cut filter may be a filter that allows transmission of light in the entire wavelength range of the visible range, or may be a filter that allows transmission of light in a specific wavelength range of the visible range and shields light in another specific wavelength range of the visible range. In addition, in the present disclosure, a color filter refers to a filter that allows transmission of light in a specific wavelength range of the visible range and shields light in another specific wavelength range of the visible range. In addition, in the present disclosure, "infrared transmitting filter" refers to a filter that shields visible light and allows transmission of at least a part of infrared light.

The film according to the embodiment of the present disclosure can be used in various devices including a solid image pickup element such as a charge coupled device (CCD) or a complementary metal-oxide semiconductor (CMOS), an infrared sensor, or an image display device.

<Method of Forming Film>

Next, a method of forming the film according to the embodiment of the present disclosure will be described. The film according to the embodiment of the present disclosure can be formed through a step of applying the composition according to the embodiment of the present disclosure.

In the method of forming the film according to the embodiment of the present disclosure, it is preferable that the composition is applied to a support. Examples of the support include a substrate formed of a material such as silicon, non-alkali glass, soda glass, PYREX (registered trade name) glass, or quartz glass. For example, an organic film or an inorganic film may be formed on the substrate. Examples of a material of the organic film include the above-described transparent resin. In addition, as the support, a substrate formed of the above-described resin can also be used. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat. In addition, in a case where a glass substrate is used as the support, it is preferable that an inorganic film is formed on the glass substrate or the glass substrate may be dealkalized to be used. According to this aspect, a film in which the occurrence of foreign matter is further suppressed can be easily formed.

In a case where a support including a component (for example, in the case of soda glass, a sodium ion) that is likely to be transferred from the support side such as soda glass to the film formed on the support is used, the component transferred from the support reacts with the pigment derivative to form a salt or the like, and crystals may precipitate. However, even in a case where the composition according to the embodiment of the present disclosure is applied to the support, a film in which the occurrence of foreign matter is suppressed can be formed.

Therefore, the composition according to the embodiment of the present disclosure is particularly effective in a case where a film is formed on the support using the resin composition.

As a method of applying the composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet— Infinite Possibilities in Patent-" (February, 2005, S.B. Research Co., Ltd.) and methods described in JP2003-

262716A, JP2003-185831A, JP2003-261827A, JP2012-126830A, and JP2006-169325A.

A composition layer formed by applying the composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, preferably 50° C. or higher and more preferably 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 seconds to 3,000 seconds, more preferably 40 seconds to 2,500 seconds, and still more preferably 80 seconds to 220 seconds. Drying can be performed using a hot plate, an oven, or the like.

The method of forming the film according to the embodiment of the present disclosure may further include a step of forming a pattern. Examples of a pattern forming method include a pattern forming method using a photolithography method and a pattern forming method using a dry etching method. In a case where the film according to the embodiment of the present disclosure is used as a flat film, the step of forming a pattern is not necessarily performed. Hereinafter, the step of forming a pattern will be described in detail.

—Case where Pattern is Formed Using Photolithography Method—

It is preferable that the pattern forming method using a photolithography method includes: a step (exposure step) of exposing the composition layer, which is formed by applying the composition according to the embodiment of the present disclosure, in a pattern shape; and a step (development step) of forming a pattern by removing a non-exposed portion of the composition layer by development. Optionally, the pattern forming method may further include a step (post-baking step) of baking the developed pattern. Hereinafter, the respective steps will be described.

<<Exposure Step>>

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, ultraviolet rays such as g-rays or i-rays are preferable, and i-rays are more preferable. The irradiation dose (exposure dose) is preferably 0.03 J/cm$^2$ to 2.5 J/cm$^2$, more preferably 0.05 J/cm$^2$ to 1.0 J/cm$^2$, and still more preferably 0.08 J/cm$^2$ to 0.5 J/cm$^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and preferably can be selected in a range of 1,000 W/m$^2$ to 100,000 W/m$^2$ (for example, 5,000 W/m$^2$, 15,000 W/m$^2$, or 35,000 W/m$^2$). Conditions of the oxygen concentration and conditions of the exposure illuminance may be appropriately combined. For example, conditions are oxygen concentration: 10 vol % and illuminance: 10,000 W/m$^2$, or oxygen concentration: 35 vol % and illuminance: 20,000 W/m$^2$.

<<Development Step>>

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photocured portion remains on the support. As the developer, an alkali developer which does not cause damages to a solid image pickup element as an underlayer, a circuit or the like is desired. For example, the temperature of the developer is preferably 20° C. to 30° C. The development time is preferably 20 seconds to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. As the developer, an alkaline aqueous solution in which the above alkaline agent is diluted with pure water is preferably used. A concentration of the alkaline agent in the alkaline aqueous solution is preferably 0.001 mass % to 10 mass % and more preferably 0.01 mass % to 1 mass %. In addition, a surfactant may be used as the developer. Examples of the surfactant include the surfactants described above regarding the composition. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 times to 100 times. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and still more preferably 90° C. or lower. The lower limit is, for example, 50° C. or higher. The film after the development is post-baked continuously or batchwise using heating means such as a hot plate, a convection oven (hot air circulation dryer), a high-frequency heater under the above-described conditions. In addition, in a case where a pattern is formed through a low-temperature process, post-baking is not necessarily performed.

—Case where Pattern is Formed Using Dry Etching Method—

The formation of a pattern using a dry etching method can be performed using a method including: applying the composition to a support or the like to form a composition layer; curing the composition layer to form a cured composition layer; forming a patterned photoresist layer on the cured composition layer; and dry-etching the cured composition layer with etching gas by using the patterned photoresist layer as a mask. It is preferable that pre-baking is further performed in order to form the photoresist layer. In particular, in a preferable aspect, as a process of forming the photoresist, baking after exposure or baking after development (post-baking) is performed. The details of the pattern formation using the dry etching method can be found in paragraphs "0010" to "0067" of JP2013-064993A, the content of which is incorporated herein by reference.

<Method of Manufacturing Infrared Cut Filter>

An infrared cut filter according to the embodiment of the present disclosure includes the film according to the embodiment of the present disclosure.

The infrared cut filter according to the embodiment of the present disclosure may be a filter that cuts only infrared light in a part of an infrared range or a filter that cuts infrared light in the entire infrared range. Examples of the filter that cuts only infrared light in a part of an infrared range include a near infrared cut filter.

In addition, the infrared cut filter according to the embodiment of the present disclosure is preferably a filter that cuts infrared light in a wavelength range of 750 nm to 1,000 nm, more preferably a filter that cuts infrared light in a wavelength range of 750 nm to 1,200 nm, and still more preferably a filter that cuts infrared light in a wavelength range of 750 nm to 1,200 nm.

The infrared cut filter according to the embodiment of the present disclosure may further include, for example, a layer containing copper, a dielectric multi-layer film, or an ultraviolet absorbing layer in addition to the above-described film. By further including at least the layer containing copper and/or the dielectric multi-layer film, the infrared cut filter according to the embodiment of the present disclosure having a wide viewing angle and excellent infrared shielding properties can be easily obtained. In addition, by including the ultraviolet absorbing layer, the infrared cut filter according to the embodiment of the present disclosure having excellent ultraviolet shielding properties can be obtained. The details of the ultraviolet absorbing layer can be found in the description of an absorbing layer described in paragraphs "0040" to "0070" and paragraphs "0119" of "0145" of WO2015/099060, the content of which is incorporated herein by reference. The details of the dielectric multi-layer film can be found in paragraphs "0255" to "0259" of JP2014-041318A, the content of which is incorporated herein by reference. As the layer containing copper, a glass substrate (copper-containing glass substrate) formed of glass containing copper, or a layer (copper complex-containing layer) containing a copper complex may also be used. Examples of the copper-containing glass substrate include a phosphate glass including copper and a fluorophosphate glass including copper. Examples of a commercially available product of the copper-containing glass include NF-50 (manufactured by AGC Techno Glass Co., Ltd.), BG-60 and BG-61 (both of which are manufactured by Schott AG), and CD5000 (manufactured by Hoya Corporation).

The infrared cut filter according to the embodiment of the present disclosure can be used in various devices including a solid image pickup element such as a charge coupled device (CCD) or a complementary metal-oxide semiconductor (CMOS), an infrared sensor, or an image display device.

It is also preferable that the infrared cut filter according to the embodiment of the present disclosure includes: a pixel (pattern) of the film that is formed using the composition according to the embodiment of the present disclosure; and at least one pixel (pattern) selected from the group consisting of a red pixel, a green pixel, a blue pixel, a magenta pixel, a yellow pixel, a cyan pixel, a black pixel, and an achromatic pixel.

A method of manufacturing the infrared cut filter according to the embodiment of the present disclosure is not particularly limited and is preferably a method including: a step of applying the composition according to the embodiment of the present disclosure to a support to form a composition layer; a step of exposing the composition layer in a pattern shape; and a step of forming a pattern by removing a non-exposed portion during the exposure by development, or a method including: a step of applying the composition according to the embodiment of the present disclosure to a support to form a composition layer; a step of forming a photoresist layer on the layer; a step of obtaining a resist pattern by patterning the photoresist layer by exposure and development; and a step of dry-etching the cured layer by using the resist pattern as an etching mask.

The respective steps of the method of manufacturing the infrared cut filter according to the embodiment of the present disclosure can refer to the respective steps of the method of forming the film according to the embodiment of the present disclosure.

<Solid Image Pickup Element>

An solid image pickup element according to the embodiment of the present disclosure includes the film according to the embodiment of the present disclosure. The configuration of the solid image pickup element is not particularly limited as long as it includes the film according to the embodiment of the present disclosure and functions as a solid image pickup element. For example, the following configuration can be adopted.

The solid image pickup element includes plural photodiodes and transfers electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the embodiment of the present disclosure is formed on the device protective film. Further, a configuration in which light collecting means (for example, a microlens; hereinafter, the same shall be applied) is provided above the device protective film and below the film according to the embodiment of the present disclosure (on a side thereof close the support), or a configuration in which light collecting means is provided on the film according to the embodiment of the present disclosure may be adopted. In addition, the color filter used in the solid image pickup element may have a structure in which a film which forms each pixel is embedded in a space which is partitioned in, for example, a lattice shape by a partition wall. In this case, it is preferable that the partition wall has a lower refractive index than each pixel.

Examples of an imaging device having such a structure include a device described in JP2012-227478A and JP2014-179577A.

<Image Display Device>

An image display device according to the embodiment of the present disclosure includes the film according to the embodiment of the present disclosure. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present disclosure is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the embodiment of the present disclosure includes the film according to the embodiment of the present disclosure. The configuration of the infrared sensor is not particularly limited as long as it functions as an infrared sensor. Hereinafter, an embodiment of the infrared sensor according to the present disclosure will be described using the drawings.

In FIG. 1, reference numeral 110 represents a solid image pickup element. In an imaging region provided on a solid image pickup element 110, infrared cut filters 111 and infrared transmitting filters 114 are provided. In addition, color filters 112 are laminated on the infrared cut filters 11. Microlenses 115 are disposed on an incidence ray hv side of the color filters 112 and the infrared transmitting filters 114. A planarizing layer 116 is formed so as to cover the microlenses 115.

The infrared cut filter 111 can be formed using the composition according to the embodiment of the present disclosure. Spectral characteristics of the infrared cut filters 111 can be selected according to the emission wavelength of an infrared light emitting diode (infrared LED) to be used.

The color filters 112 is not particularly limited as long as pixels which allow transmission of light having a specific wavelength in a visible range and absorbs the light are formed therein, and well-known color filters of the related art for forming a pixel can be used.

For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected according to the emission wavelength of the infrared LED to be used. For example, in a case where the emission wavelength of the infrared LED is 850 nm, a maximum value of a light transmittance of the infrared transmitting filter 114 in the thickness direction of the film in a wavelength range of 400 nm to 650 nm is preferably 30% or lower, more preferably 20% or lower, still more preferably 10% or lower and still more preferably 0.1% or lower. It is preferable that the transmittance satisfies the above-described conditions in the entire wavelength range of 400 nm to 650 nm.

A minimum value of a light transmittance of the infrared transmitting filter 114 in the thickness direction of the film in a wavelength range of 800 nm or longer (preferably 800 nm to 1,300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED.

The thickness of the infrared transmitting filter 114 is preferably 100 μm or less, more preferably 15 μm or less, still more preferably 5 μm or less, and still more preferably 1 μm or less. The lower limit value is preferably 0.1 μm. In a case where the thickness is in the above-described range, the film can satisfy the above-described spectral characteristics.

A method of measuring the spectral characteristics, the thickness, and the like of the infrared transmitting filter 114 are as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 nm to 1,300 nm using an ultraviolet-visible-near infrared spectrophotometer (U-4100, manufactured by Hitachi High-Technologies Corporation).

In addition, for example, in a case where the emission wavelength of the infrared LED is 940 nm, it is preferable that a maximum value of a light transmittance of the infrared transmitting filter 114 in a thickness direction in a wavelength range of 450 nm to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1,000 nm to 1,300 nm is 70% or higher.

In the infrared sensor shown in FIG. 1, an infrared cut filter (other infrared cut filter) other than the infrared cut filter 111 may be further disposed on the planarizing layer 116. As the other infrared cut filter, for example, at least a layer containing copper or a dielectric multi-layer film may be provided. The details are as described above. In addition, as the other infrared cut filter, a dual band pass filter may be used.

In addition, the absorption wavelengths of the infrared transmitting filter and the infrared cut filter used in the present disclosure are appropriately used in combination according to light source to be used or the like.

(Camera Module)

A camera module according to the embodiment of the present disclosure comprises a solid image pickup element and the infrared cut filter according to the embodiment of the present disclosure.

In addition, it is preferable that the camera module according to the embodiment of the present disclosure further includes a lens and a circuit that processes an image obtained from the solid image pickup element.

The solid image pickup element used in the camera module according to the embodiment of the present disclosure may be the solid image pickup element according to the embodiment of the present disclosure or may be a well-known solid image pickup element.

In addition, as the lens used in the camera module according to the embodiment of the present disclosure and the circuit that processes an image obtained from the solid image pickup element, a well-known lens and a well-known circuit can be used.

Examples of the camera module can be found in a camera module described in JP2016-006476A or JP2014-197190A, the contents of which are incorporated herein by reference.

<Compound>

A compound according to the embodiment of the present disclosure is the compound represented by the following Formula (1).

The compound according to the embodiment of the present disclosure can be suitably used as an infrared absorbing colorant.

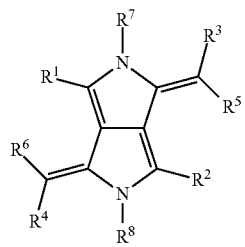

(1)

In Formula (1), $R^1$ and $R^2$ each independently represent a group represented by the following Formula (2) and having a solubility parameter of 12.2 $(cal/cm^3)^{1/2}$ or higher as a whole, $R^3$ to $R^6$ each independently represent a cyano group, an acyl group, an alkoxycarbonyl group, an alkyl group, an arylsulfinyl group, or a heteroaryl group, $R^7$ and $R^8$ each independently represent a hydrogen atom, an alkyl group, an aryl group, a heteroaryl group, $-BR^9R^{10}$, or a metal atom, at least one of $R^7$ or $R^8$ and at least one of $R^1$, . . . , or $R^4$ may form a covalent bond or a coordinate bond, $R^9$ and $R^{1\circ}$ each independently represent a hydrogen atom, a halogen atom, an alkyl group, an aryl group, a heteroaryl group, an alkoxy group, an aryloxy group, or a heteroaryloxy group, and $R^9$ and $R^{10}$ may be bonded to each other to form a ring.

$$*-X^1-L^1-Y^1 \quad (2)$$

In Formula (2), $X^1$ represents a m-phenylene group, a p-phenylene group, a divalent fused polycyclic aromatic ring group in which two or more aromatic rings are fused, or a divalent heteroaromatic ring group, $L^1$ represents a single bond or a divalent linking group, $Y^1$ represents a polar group, and * represents a linking site to a pyrrolopyrrole ring in Formula (1).

A preferable aspect of the compound according to the embodiment of the present disclosure is the same as the preferable aspect of the compound represented by Formula (1) in the composition according to the embodiment of the present disclosure.

A method of manufacturing the compound according to the embodiment of the present disclosure is not particularly limited, and the compound according to the embodiment of the present disclosure may be manufactured using a well-known manufacturing method.

For example, a manufacturing method of introducing L' and Y' in Formula (2) using a compound in which $R^1$ and $R^2$ in Formula (1) represents an m-phenoxy group or a p-phenoxy group can be suitably used.

EXAMPLES

Hereinafter, the present disclosure will be described in detail using Examples. Materials, used amounts, ratios, treatment details, treatment procedures, and the like shown in the following examples can be appropriately changed within a range not departing from the scope of the present disclosure. Accordingly, the scope of the present disclosure is not limited to the following specific examples. Unless specified otherwise, "part(s)" and "%" represent "part(s) by mass" and "mass %".

<Synthesis of Compound (1-69)>

A compound (1-69) was synthesized according to the following scheme.

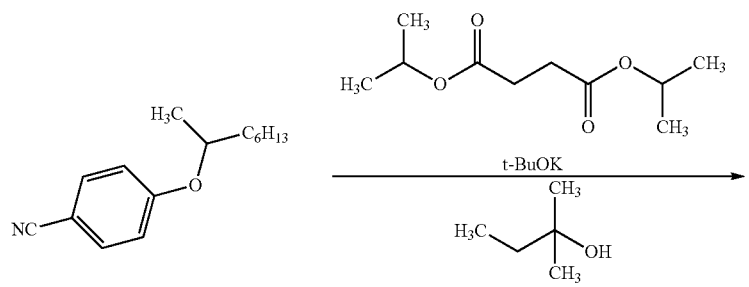

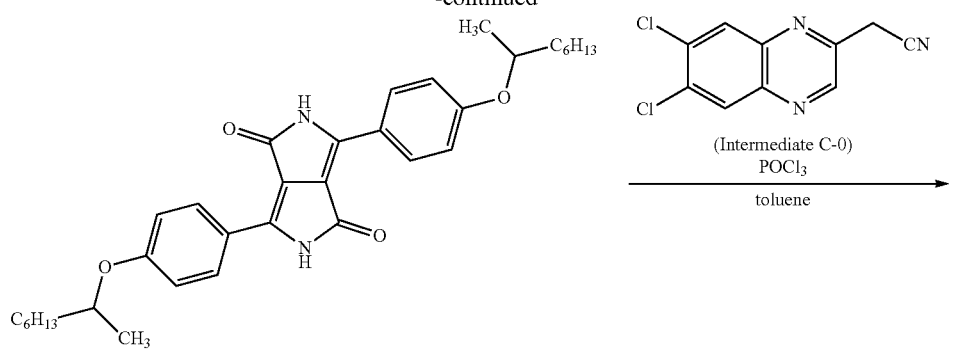
(1-69-a)
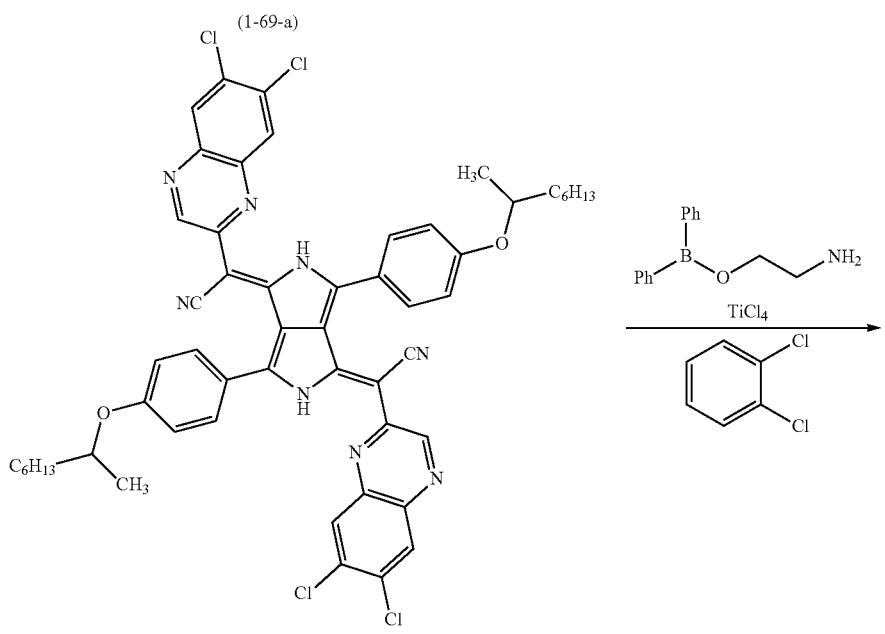
(1-69-b)
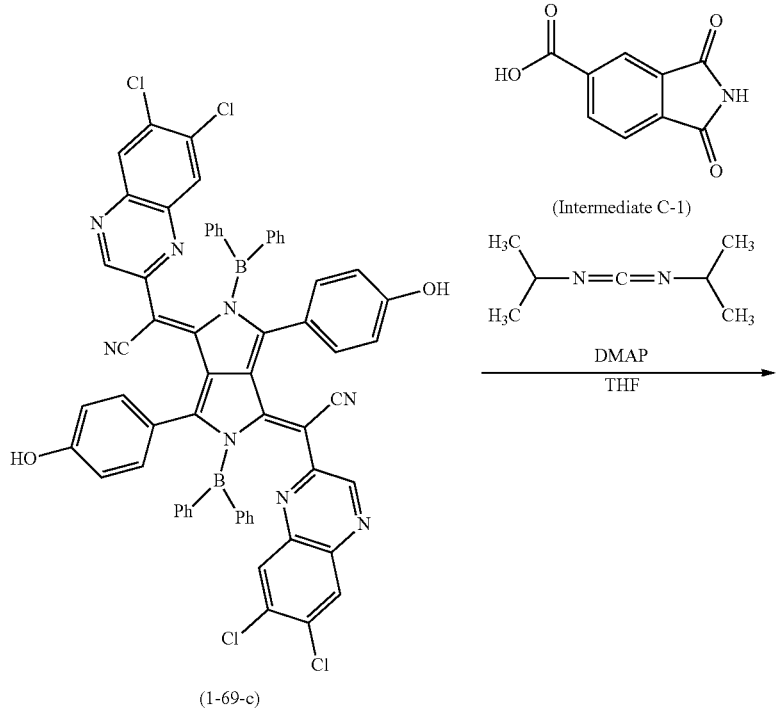
(1-69-c)

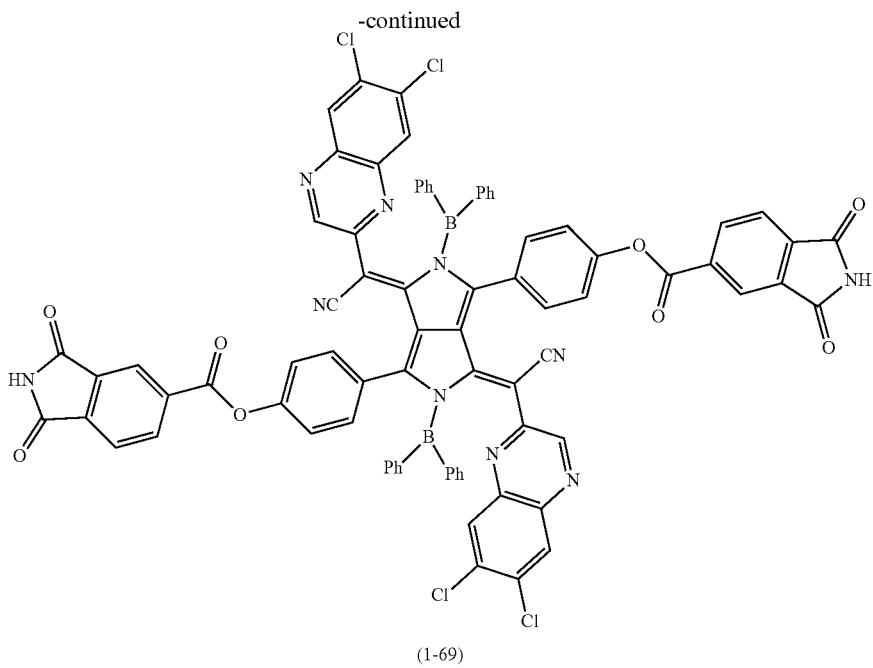

(1-69)

A compound (1-69-a) was synthesized from 4-(1-methylheptoxy)benzonitrile using a method described in U.S. Pat. No. 5,969,154A.

An intermediate C-0 was synthesized according to the following scheme.

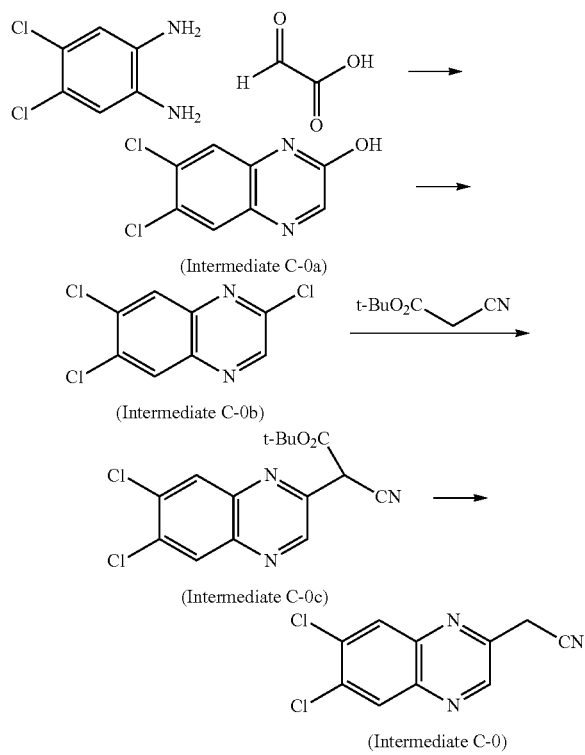

5.0 parts by mass of 4,5-dichloro-1,2-phenylenediamine, 2.9 parts by mass of glyoxylic acid monohydrate, and 120 parts by mass of ethanol were put into a flask and were stirred under heating reflux conditions for 12 hours. After the reaction, precipitates were separated by filtration. The crystals were dried by blowing air at 50° C. As a result, 5.5 parts by mass of an intermediate C-0a was obtained.

5.0 parts by mass of the intermediate C-0a and 30 parts by mass of phosphorus oxychloride were put into a flask and were stirred under heating reflux conditions for 2 hours. After the reaction, the reaction solution was poured into 300 parts by mass of water, and precipitates were separated by filtration. The crystals were dried by blowing air. As a result, 5.0 parts by mass of an intermediate C-0b was obtained.

1.3 parts by mass of 60 mass % sodium hydride and 10 parts by mass of tetrahydrofuran (THF) were put into a flask, and 4.0 parts by mass of tert-butyl cyanoacetate was added dropwise in an ice bath. The solution was stirred at room temperature (25° C.; hereinafter, the same shall be applied) for 1 hour, 5.0 parts by mass of the intermediate C-0b was added, and the solution was stirred for 12 hours. The reaction solution was poured into 75 parts by mass of water, 3 parts by mass of acetic acid was added, and precipitates were separated by filtration. The crystals were dried by blowing air at 50° C. As a result, 4.6 parts by mass of an intermediate C-0c was obtained.

4.0 parts by mass of the intermediate C-0c, 12 parts by mass of trifluoroacetic acid, and 24 parts by mass of dichloromethane were put into a flask and were stirred at 60° C. for 1 hour. After the reaction, a sodium carbonate aqueous solution was added, and the organic layer was extracted with chloroform. The solvent was removed under reduced pressure, and the obtained crystals were purified by recrystallization from ethyl acetate. The crystals were dried by blowing air at 50° C. As a result, 2.0 parts by mass of an intermediate C-0 was obtained.

50 parts by mass of the compound (1-69-a) and 52.4 parts by mass of the intermediate C-0 were stirred in 1,000 parts by mass of toluene, and 127 parts by mass of phosphorus oxychloride was added dropwise, and the solution was heated to reflux for 3.5 hours. After completion of the reaction, the solution was cooled to an internal temperature of 25° C., and 1,000 parts by mass of methanol was added dropwise for 60 minutes while maintaining the internal temperature at 30° C. or lower. After completion of the dropwise addition, the solution was stirred at room temperature for 30 minutes. Precipitated crystals were separated by filtration and were cleaned with 500 parts by mass of methanol. 500 parts by mass of methanol was added to the obtained crystals, the solution was heated to reflux for 30 minutes and was allowed to cool to 30° C., and crystals were separated by filtration. The obtained crystals were dried by blowing air at 40° C. for 12 hours. As a result, 56.6 parts by mass of a compound (1-69-b) was obtained.

51 parts by mass of diphenylborinic acid 2-aminoethyl ester was stirred in 500 parts by mass of 1,2-dichlorobenzene, 72.2 parts by mass of titanium tetrachloride was added dropwise for 10 minutes at an outside temperature of 40° C., and the solution was stirred for 30 minutes. 25 parts by mass of the compound (1-69-b) was added, and the solution was heated to an outside temperature of 130° C. to reflux for 90 minutes. The solution was allowed to cool to an internal temperature of 30° C., and 1,000 parts by mass of methanol was added dropwise while maintaining the internal temperature at 30° C. or lower. After the dropwise addition, the solution was stirred for 30 minutes, and crystals were separated by filtration and were cleaned with 500 parts by mass of methanol. 250 parts by mass of methanol was added to the obtained crystals, the solution was heated to reflux for 30 minutes and was allowed to cool to 30° C., and crystals were separated by filtration. The obtained crystals were dried by blowing air at 40° C. for 12 hours. As a result, 25 parts by mass of a compound (1-69-c) was obtained.

An intermediate C-1 was synthesized according to the following scheme.

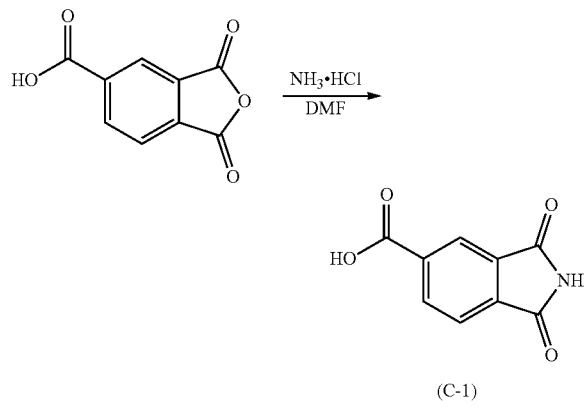

(C-1)

60 parts by mass of trimellitic anhydride was stirred in 400 parts by mass of dimethylformamide (DMF), and 53.5 parts by mass of ammonium chloride was added. 34.7 parts by mass of triethylamine was added dropwise while maintaining the internal temperature at 35° C. or lower. After the dropwise addition, the solution was stirred for 30 minutes and was heated to an outside temperature of 160° C. and was heated to reflux for 3 hours. The reaction solution was cooled to an internal temperature of 30° C., 200 parts by mass of water and 400 parts by mass of ethyl acetate were added, and the organic layer was extracted by liquid separation operation. The organic layer was cleaned with 100 parts by mass of 1 mol/L hydrochloric acid aqueous solution, and then the solvent was removed by distillation under reduced pressure. As a result, 30 parts by mass of an intermediate C-1 was obtained.

20 parts by mass of the compound (1-69-c) was stirred in 400 parts by mass of tetrahydrofuran, 28.1 parts by mass of the intermediate C-1, 18.5 parts by mass of N,N'-diisopropylcarbodiimide, and 0.2 parts by mass of dimethylaminopyridine (DMAP) were added dropwise in this order, and the solution was stirred at room temperature for 6 hours. Crystals were separated by filtration and were cleaned with 100 parts by mass of tetrahydrofuran. The obtained crystals were dried by blowing air at 40° C. for 12 hours. As a result, 23.5 parts by mass of a compound (1-69) was obtained.

λmax of the compound (1-69) in chloroform was 883 nm.

A peak of molecular weight of 1,432.2 was observed by matrix assisted laser desorption/ionization-mass spectrometry (MALDI-MS), and the obtained compound was identified as the compound (1-69).

<Synthesis of Compounds (1-70), (1-81), (1-21), (1-37), (1-148), (1-159), (1-169), (1-221), (1-245), (1-257), (1-269), and (1-321)>

Compounds (1-70), (1-81), (1-21), (1-37), (1-148), (1-159), (1-169), (1-221), (1-245), (1-257), (1-269), and (1-321) were synthesized using the same method as that of the compound (1-69), except that raw materials were changed.

<Synthesis of Compound (1-86)>

A compound (1-86) was synthesized according to the following scheme.

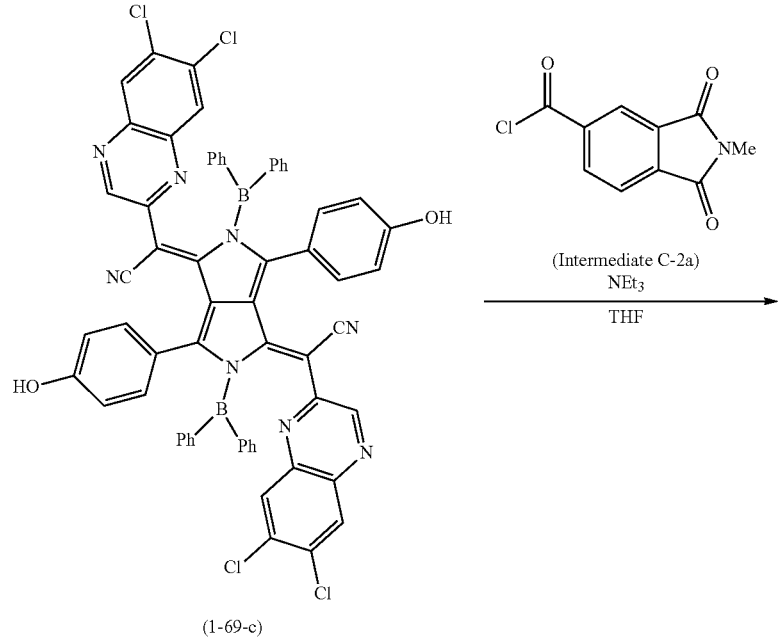

(1-69-c)

(Intermediate C-2a)
NEt₃
THF

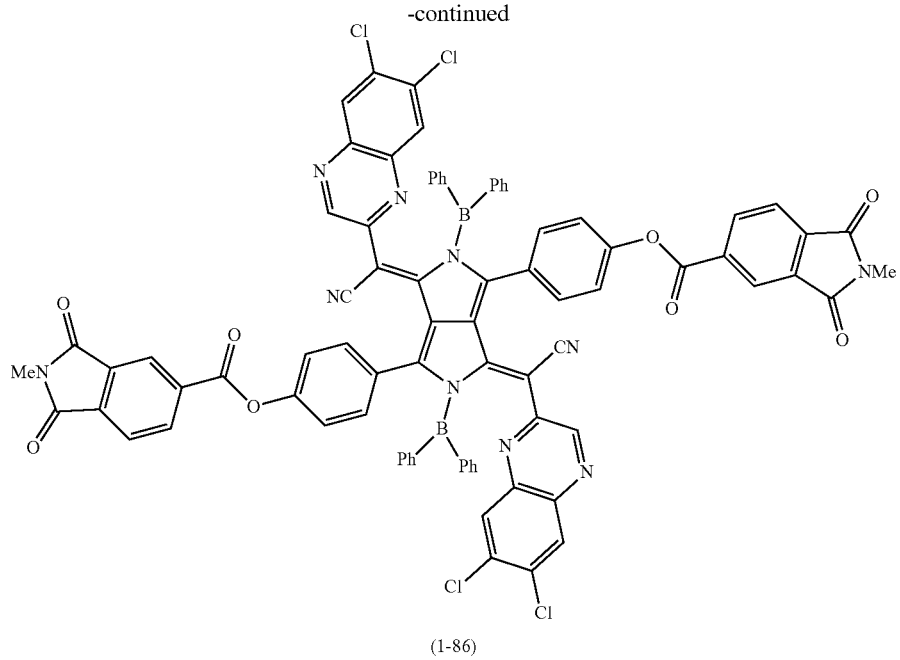

(1-86)

An intermediate C-2 was synthesized according to the following scheme.

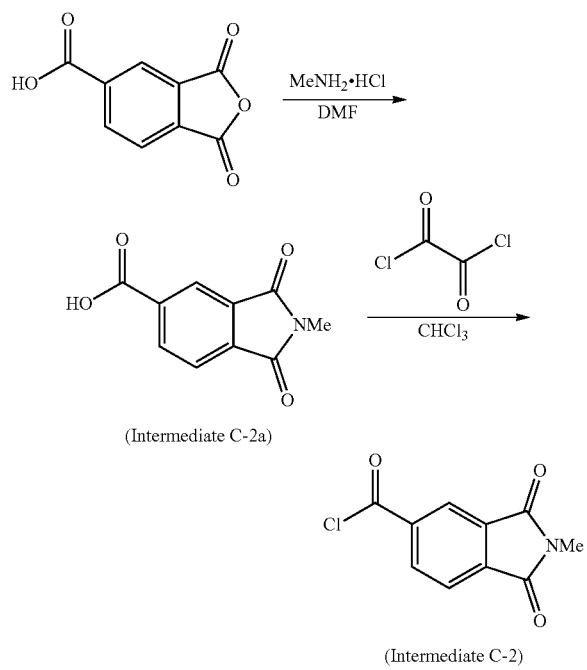

60 parts by mass of trimellitic anhydride was stirred in 400 parts by mass of dimethylformamide (DMF), and 23.2 parts by mass of methylamine hydrochloride was added. 34.7 parts by mass of triethylamine was added dropwise while maintaining the internal temperature at 35° C. or lower. After the dropwise addition, the solution was stirred for 30 minutes and was heated to an outside temperature of 160° C. and was heated to reflux for 3 hours. The reaction solution was cooled to an internal temperature of 30° C., 200 parts by mass of water and 200 parts by mass of ethyl acetate were added, and the organic layer was extracted by liquid separation operation. The organic layer was cleaned with 100 parts by mass of 1 mol/L hydrochloric acid aqueous solution, and then the solvent was removed by distillation under reduced pressure. As a result, 62 parts by mass of an intermediate C-2a was obtained.

50 parts by mass of the intermediate C-2a was stirred in 500 parts by mass of chloroform, and 0.1 parts by mass of dimethylformamide (DMF) and 46 parts by mass of oxalyl chloride were added. The solution was stirred at room temperature for 3 hours, and then the solvent was removed by distillation under reduced pressure. As a result, 54 parts by mass of an intermediate C-2 was obtained.

20 parts by mass of the compound (1-69-c) was stirred in 400 parts by mass of tetrahydrofuran, 22.3 parts by mass of triethylamine and 32.9 parts by mass of the intermediate C-2 were added dropwise in this order, and the solution was heated to an outside temperature of 75° C. and was heated to reflux for 1 hour. The solution was allowed to cool to an internal temperature of 30° C., and crystals were separated by filtration and were cleaned with 200 parts by mass of tetrahydrofuran. 200 parts by mass of methanol was added to the obtained crystals, the solution was heated to reflux for 1 hour and was allowed to cool to 30° C., and crystals were separated by filtration. The obtained crystals were dried by blowing air at 40° C. for 12 hours. As a result, 24 parts by mass of a compound (1-86) was obtained.

$^1$H-NMR (CDCl$_3$): δ=3.27 (s, 6H), 6.39 (d, 4H), 7.00 (d, 4H), 7.20-7.40 (m, 20H), 7.81 (s, 2H), 8.05 (s, 2H), 8.29 (s, 2H), 8.65 (s, 2H), 8.76 (s, 2H), 9.05 (s, 2H) λmax of the compound (1-86) in chloroform was 883 nm.

<Synthesis of Compounds (1-27), (1-28), (1-43), (1-44), (1-51), (1-85), (1-99), (1-100), (1-126), (1-127), (1-139), (1-140), (1-162), (1-163), (1-166), (1-168), (1-176), (1-177), (1-228), (1-229), (1-234), (1-235), (1-256), (1-262), (1-263), (1-267), (1-269), (1-276), (1-315), (1-317), (1-346), (1-349), (1-357), (1-362), (1-363), (1-364), and (1-384)>

Compounds (1-27), (1-28), (1-43), (1-44), (1-51), (1-85), (1-99), (1-100), (1-126), (1-127), (1-139), (1-140), (1-162), (1-163), (1-166), (1-168), (1-176), (1-177), (1-228), (1-229), (1-234), (1-235), (1-256), (1-262), (1-263), (1-267), (1-269), (1-276), (1-315), (1-317), (1-346), (1-349), (1-357), (1-362), (1-363), (1-364), and (1-384) were synthesized using the same method as that of the compound (1-86), except that raw materials were changed.
<Synthesis of Compound (1-232)>
A compound (1-232) was synthesized according to the following scheme.
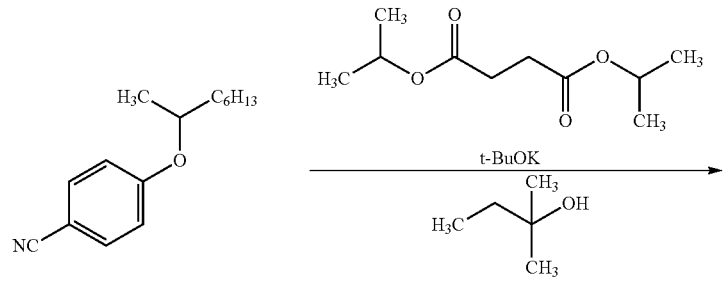
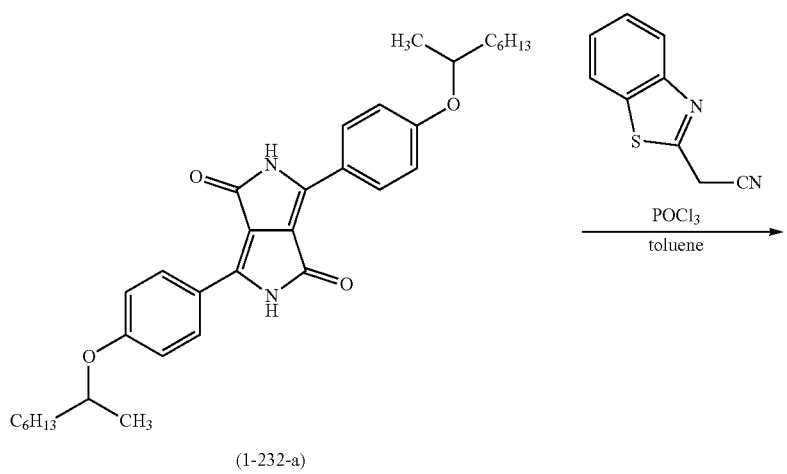
(1-232-a)
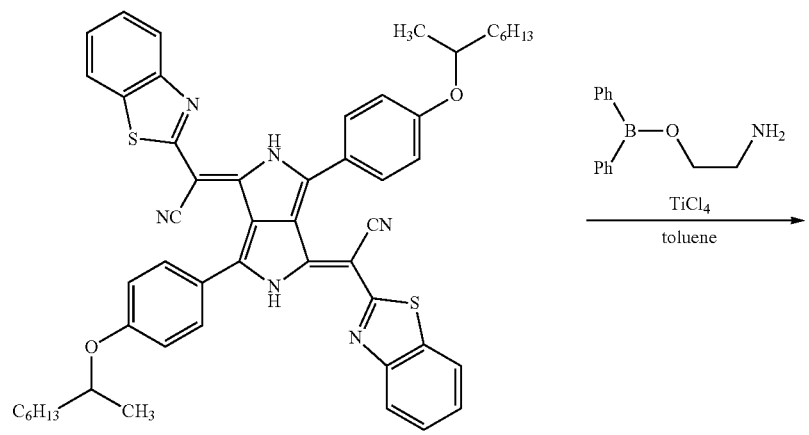
(1-232-b)

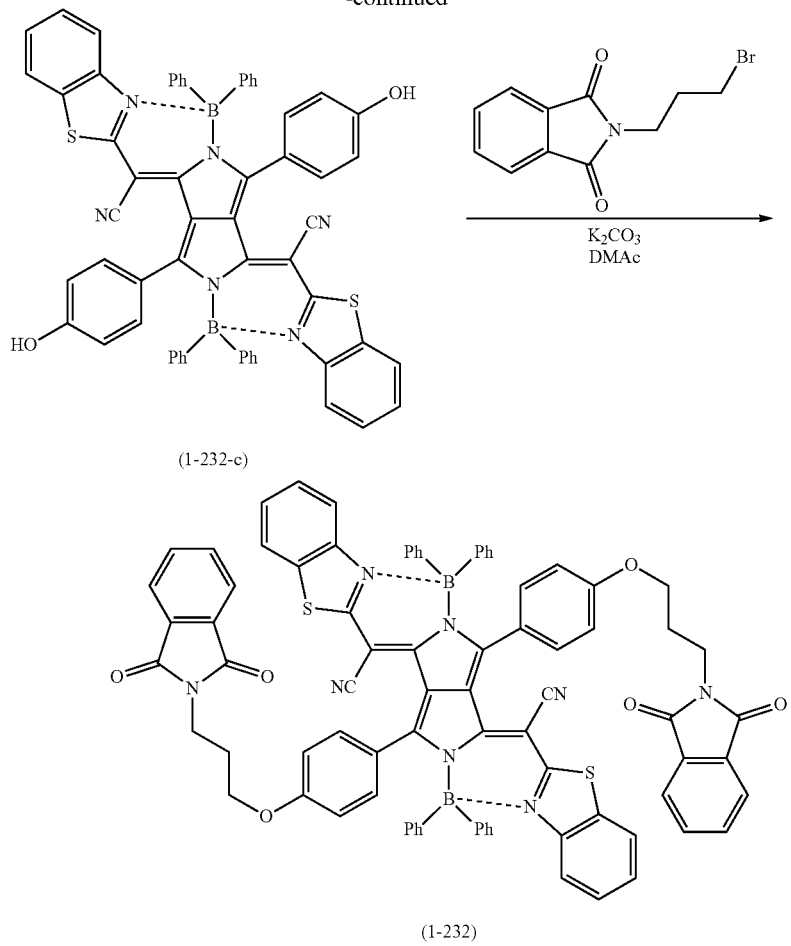

(1-232-c)

(1-232)

A compound (1-232-a) was synthesized from 4-(1-methylheptoxy)benzonitrile using a method described in U.S. Pat. No. 5,969,154A.

$^1$H-NMR (mixed solution as a 28 mass % methanol solution including dimethyl sulfoxide (DMSO) and sodium methoxide at a mass ratio of 95:5 (DMSO:sodium methoxide)); δ=0.82 (t, 6H), 1.15-1.70 (m, 26H), 4.40 (m, 2H), 6.78 (d, 4H), 8.48 (d, 2H) 20.0 parts by mass of the compound (1-232-a) and 15.4 parts by mass of 2-(2-benzothiazolyl)acetonitrile were stirred in 230 parts by mass of toluene, 45.0 parts by mass of phosphorus oxychloride was added dropwise, and the solution was heated to reflux for 3.5 hours. After completion of the reaction, the solution was cooled to an internal temperature of 25° C., and 200 parts by mass of methanol was added dropwise for 60 minutes while maintaining the internal temperature at 30° C. or lower. After completion of the dropwise addition, the solution was stirred at room temperature for 30 minutes. Precipitated crystals were separated by filtration and were cleaned with 100 parts by mass of methanol. 200 parts by mass of methanol was added to the obtained crystals, the solution was heated to reflux for 30 minutes and was allowed to cool to 30° C., and crystals were separated by filtration. The obtained crystals were dried by blowing air at 40° C. for 12 hours. As a result, 8.8 parts by mass of a compound (1-232-b) was obtained.

$^1$H-NMR (CDCl$_3$): δ=0.90-1.90 (m, 32H), 4.54 (m, 2H), 7.12 (d, 4H), 7.20-7.40 (m, 2H), 7.43 (t, 2H), 7.75 (d, 4H), 7.81 (t, 4H)

3.9 parts by mass of diphenylborinic acid 2-aminoethyl ester and 6.0 parts by mass of the compound (1-232-b) were stirred in 60 parts by mass of toluene, 10.6 parts by mass of titanium tetrachloride was added dropwise for 10 minutes at an outside temperature of 40° C., and the solution was stirred for 30 minutes. The solution was heated to an outside temperature of 130° C. and was heated to reflux for 3 hours. The solution was allowed to cool to an internal temperature of 30° C., and 40 parts by mass of methanol was added dropwise while maintaining the internal temperature at 30° C. or lower. After the dropwise addition, the solution was stirred for 30 minutes, and precipitated crystals were separated by filtration and were cleaned with 35 parts by mass of methanol. 50 parts by mass of methanol was added to the obtained crystals, the solution was heated to reflux for 30 minutes and was allowed to cool to 30° C., and crystals were separated by filtration. This operation was repeated twice. The obtained crystals were dried by blowing air at 40° C. for 12 hours. As a result, 4.6 parts by mass of a compound (1-232-c) was obtained.

$^1$H-NMR (DMSO): δ=6.20-6.30 (dd, 8H), 6.91 (d, 2H), 7.12-7.21 (m, 24H), 7.92 (d, 2H), 9.54 (s, 2H)

A peak of molecular weight of 1,090.9 was observed by MALDI-MS, and the obtained compound was identified as the compound (1-232-c).

λmax of the compound (1-232-c) in dimethyl sulfoxide (DMSO) was 782 nm.

4.5 parts by mass of N-(3-bromopropyl)phthalimide, 2.0 parts by mass of the compound (1-232-c), 37.6 parts by mass of DMAc, 4.7 parts by mass of potassium carbonate were added and stirred for 5 minutes. The solution was heated to an outside temperature of 100° C. and was heated for 1 hour. Next, 2.3 parts by mass of N-(3-bromopropyl)phthalimide and 2.5 parts by mass of potassium carbonate were added to the reactor and wee stirred for 6 hours. The solution was allowed to cool to an internal temperature of 30° C., and 40 parts by mass of 1 mol/L sodium hydroxide aqueous solution was added dropwise while maintaining the internal temperature at 30° C. or lower. After the dropwise addition, the solution was stirred for 30 minutes, and precipitated crystals were separated by filtration and were cleaned with 35 parts by mass of distilled water. The obtained crystals were dried by blowing air at 50° C. for 24 hours. As a result, 2.1 parts by mass of a compound (1-232) was obtained. $^1$H-NMR (CDCl$_3$): δ=2.21 (quin, 4H), 3.96 (t, 4H), 4.02 (t, 4H), 6.35 (d, 4H), 6.40 (d, 4H), 7.00-7.25 (m, 28H), 7.73 (m, 4H), 7.89 (m, 4H)

<Synthesis of Compounds (1-32), (1-94), (1-103), and (1-170)>

Compounds (1-32), (1-94), (1-103), and (1-170) were synthesized using the same method as that of the compound (1-232), except that raw materials were changed.

<Synthesis of Colorant Derivative (4-25)>

An intermediate C-3 was synthesized according to the following scheme.

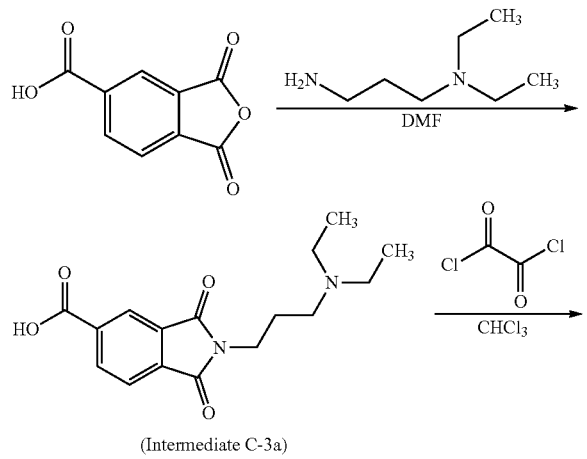

(Intermediate C-3a)

(1-69-c)

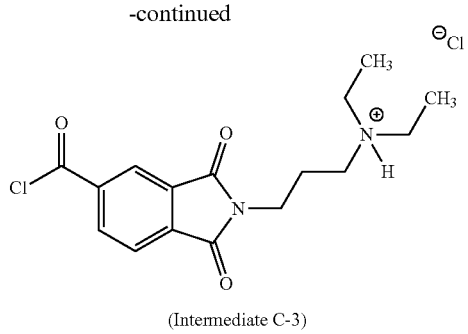

(Intermediate C-3)

60 parts by mass of trimellitic anhydride was stirred in 400 parts by mass of dimethylformamide (DMF), and 42.7 parts by mass of N,N-diethyl-1,3-diaminopropane was added while maintaining the internal temperature at 40° C. or lower. After the dropwise addition, the solution was stirred for 30 minutes and was heated to an outside temperature of 160° C. and was heated to reflux for 4 hours. The solution was allowed to cool to an internal temperature of 30° C., 400 parts by mass of ethyl acetate was added, and the solution was stirred for 30 minutes. Crystals were separated by filtration and were cleaned with 200 parts by mass of ethyl acetate. The obtained crystals were dried by blowing air at 40° C. for 12 hours. As a result, 90 parts by mass of an intermediate C-3a was obtained.

30 parts by mass of the intermediate C-3a was stirred in 300 parts by mass of chloroform, and 0.1 parts by mass of dimethylformamide (DMF) and 19 parts by mass of oxalyl chloride were added. The solution was stirred at room temperature for 3 hours, and then the solvent was removed by distillation under reduced pressure. As a result, 42 parts by mass of an intermediate C-3 was obtained.

A colorant derivative (4-25) was synthesized according to the following scheme.

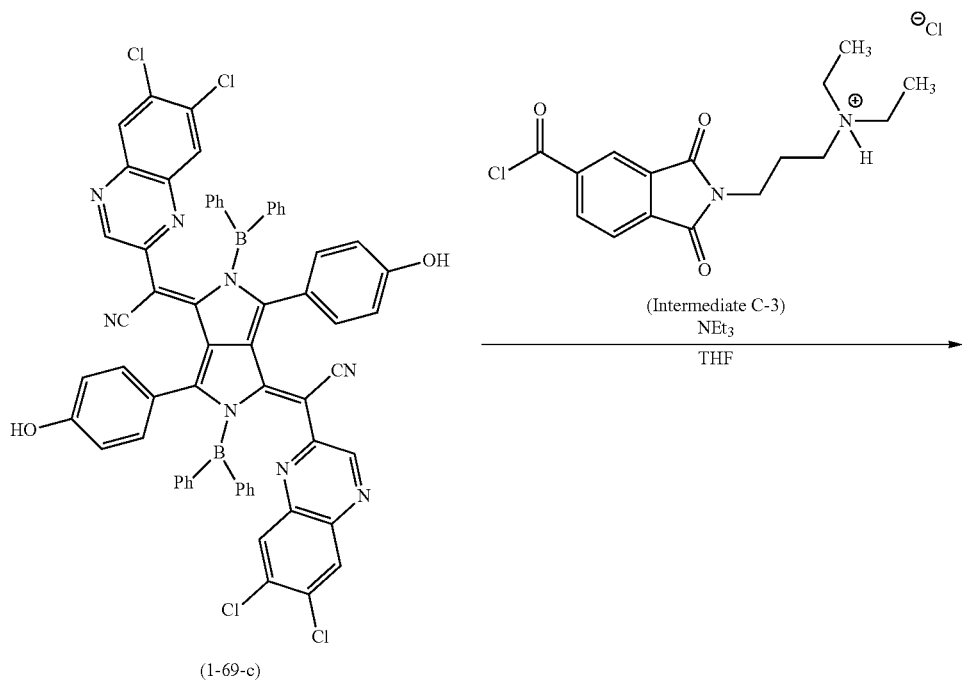

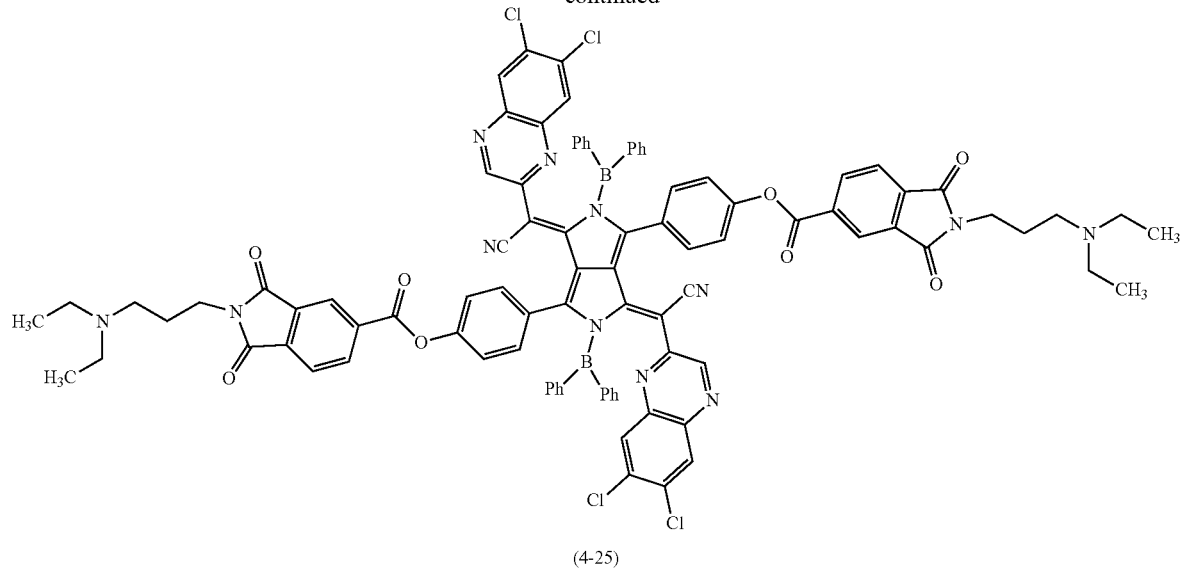

(4-25)

12 parts by mass of the compound (1-69-c) was stirred in 180 parts by mass of tetrahydrofuran, and 20 parts by mass of triethylamine was added. A solution in which 35 parts by mass of the intermediate C-3 was dissolved in 150 parts by mass of chloroform was added dropwise, and the solution was stirred at room temperature for 5 hours. After the reaction, crystals were separated by filtration and were cleaned with 100 parts by mass of tetrahydrofuran. 200 parts by mass of methanol was added to the obtained crystals, the solution was heated to reflux for 1 hour and was allowed to cool to 30° C., and crystals were separated by filtration. The obtained crystals were dried by blowing air at 40° C. for 12 hours. As a result, 15.6 parts by mass of a colorant derivative (4-25) was obtained.

$^1$H-NMR (CDCl$_3$): δ=1.06 (t, 12H), 1.97 (m, 4H), 2.63 (m, 12H), 3.83 (t, 4H), 6.39 (d, 4H), 6.99 (d, 4H), 7.20-7.40 (m, 20H), 7.82 (s, 2H), 8.04 (s, 2H), 8.29 (s, 2H), 8.65 (s, 2H), 8.75 (s, 2H), 9.05 (s, 2H)

λmax of the colorant derivative (4-1) in chloroform was 883 nm.

<Synthesis of Colorant Derivative (4-4)>

A colorant derivative (4-4) was synthesized according to the following scheme.

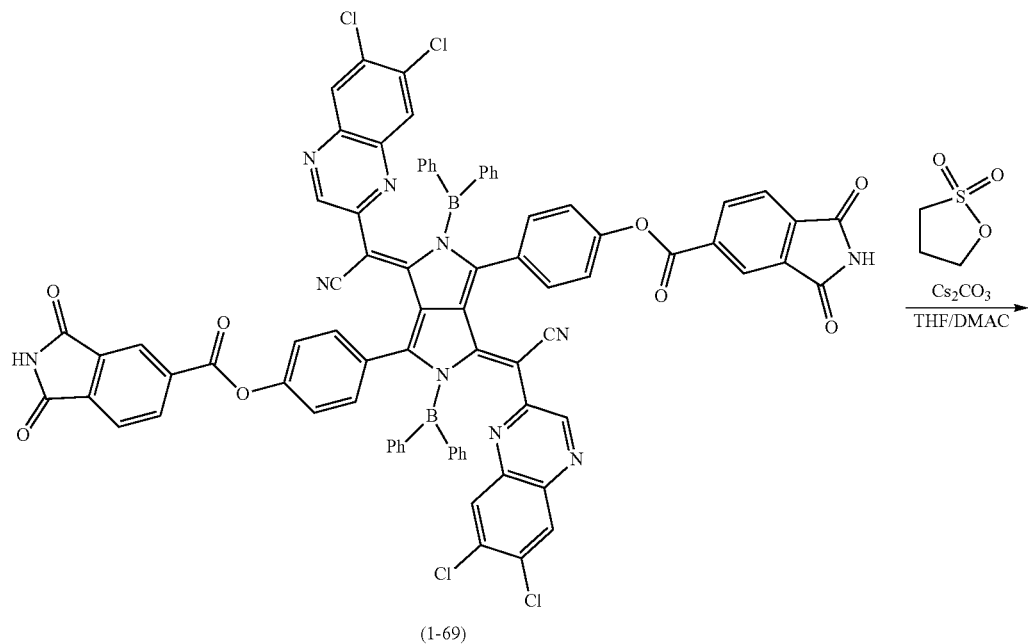

(1-69)

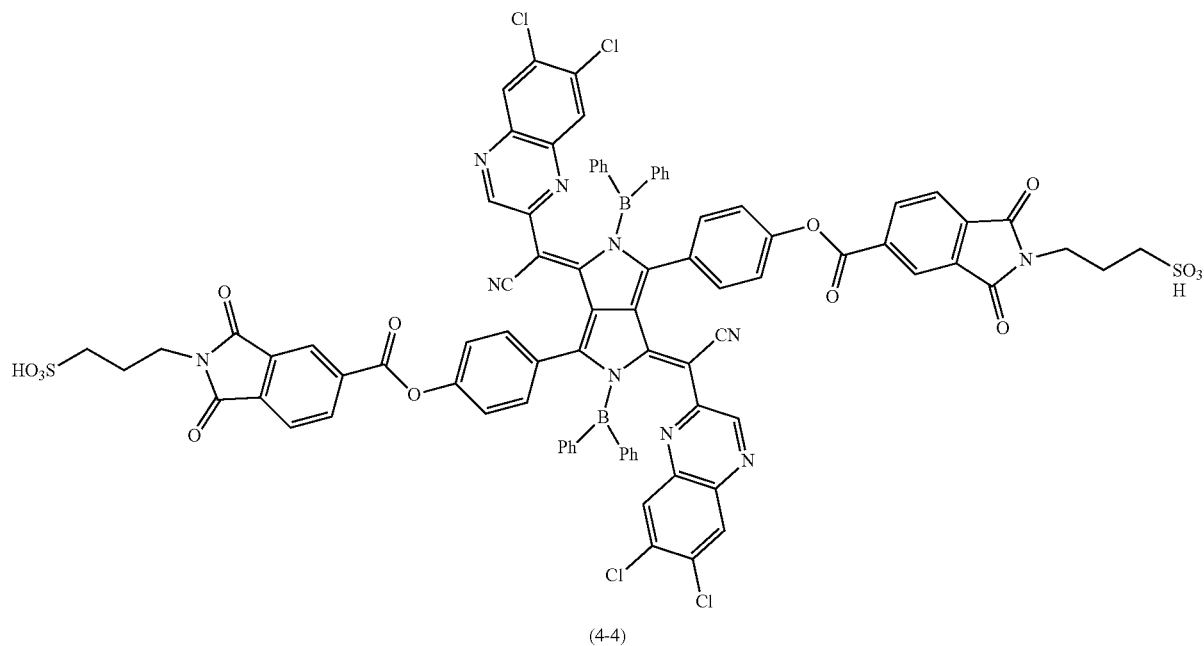

(4-4)

15 parts by mass of the compound (1-69) and 22.5 parts by mass of calcium carbonate were stirred for 10 minutes in 100 parts by mass of dimethylacetamide (DMAC) and 100 parts by mass of tetrahydrofuran. 10 parts by mass of propane sulfone was added, and the solution was heated to an outside temperature of 60° C. and was heated to reflux for 90 minutes.

The solution was allowed to cool to an internal temperature of 30° C., 200 parts by mass of tetrahydrofuran was added, and precipitated crystals were separated by filtration. The obtained crystals were added to 100 parts by mass of 1 mol/L hydrogen chloride ethyl acetate solution, the solution was stirred at room temperature for 30 minutes, and precipitated crystals were separated by filtration. This operation was repeated twice. 75 parts by mass of water was added to the obtained crystals, the solution was stirred at room temperature for 30 minutes, and precipitated crystals were separated by filtration. 300 parts by mass of ethyl acetate was added to the obtained crystals, the solution was heated to reflux for 30 minutes and was allowed to cool to 30° C., and crystals were separated by filtration. The obtained crystals were dried by blowing air at 40° C. for 12 hours. As a result, 9.0 parts by mass of a colorant derivative (4-4) was obtained.

A peak of molecular weight of 1,676.2 was observed by MALDI-MS, and the obtained compound was identified as the colorant derivative (4-2).

<Synthesis of Colorant Derivative (4-44)>

A colorant derivative (4-44) was synthesized using the same synthesis method as that of the colorant derivative (4-4), except that raw materials were changed.

A peak of molecular weight of 1,676.2 was observed by MALDI-MS, and the obtained compound was identified as the colorant derivative (4-44).

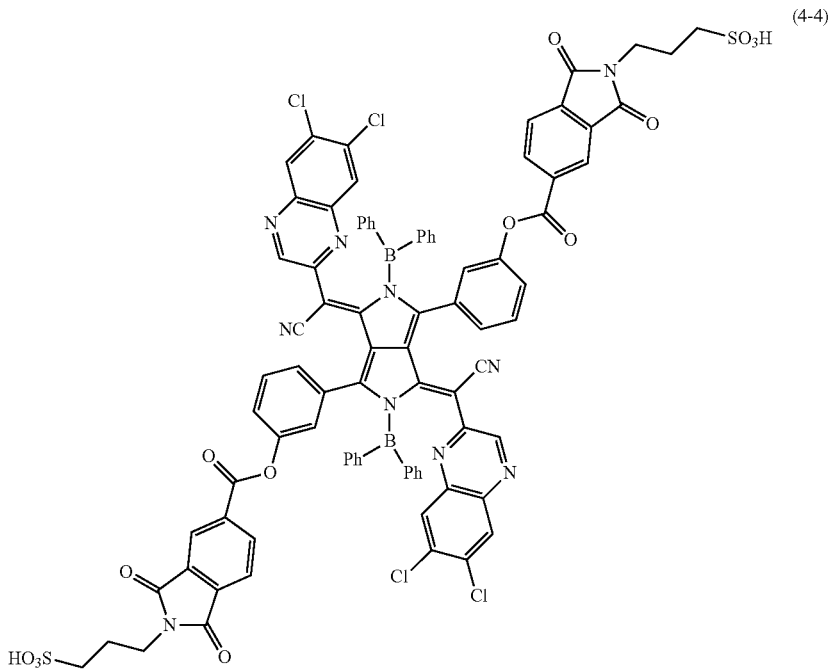 [SMILES: N#C/C(c1cnc2cc(Cl)c(Cl)cc2n1)=c1\c2c(-c3cccc(OC(=O)c4ccc5c(c4)C(=O)N(CCCS(=O)(=O)O)C5=O)c3)n(B(c3ccccc3)c3ccccc3)/c(=C(/C#N)c3cnc4cc(Cl)c(Cl)cc4n3)c2c(-c2cccc(OC(=O)c3ccc4c(c3)C(=O)N(CCCS(=O)(=O)O)C4=O)c2)n1B(c1ccccc1)c1ccccc1]

(4-4)

<Synthesis of Colorant Derivative (4-98)>

A colorant derivative (4-98) was synthesized using the same synthesis method as that of the colorant derivative (4-25), except that raw materials were changed.

A peak of molecular weight of 1,500.6 was observed by MALDI-MS, and the obtained compound was identified as the colorant derivative (4-98).

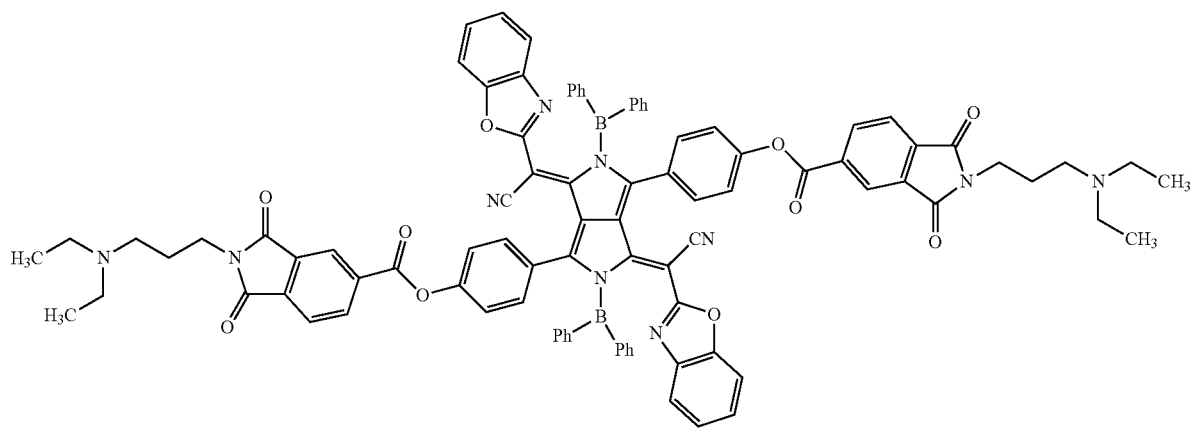

(4-98)

<Synthesis of Colorant Derivative (4-115)>

A colorant derivative (4-115) was synthesized using the same synthesis method as that of the colorant derivative (4-4), except that raw materials were changed.

A peak of molecular weight of 1,412.4 was observed by MALDI-MS, and the obtained compound was identified as the colorant derivative (4-115).

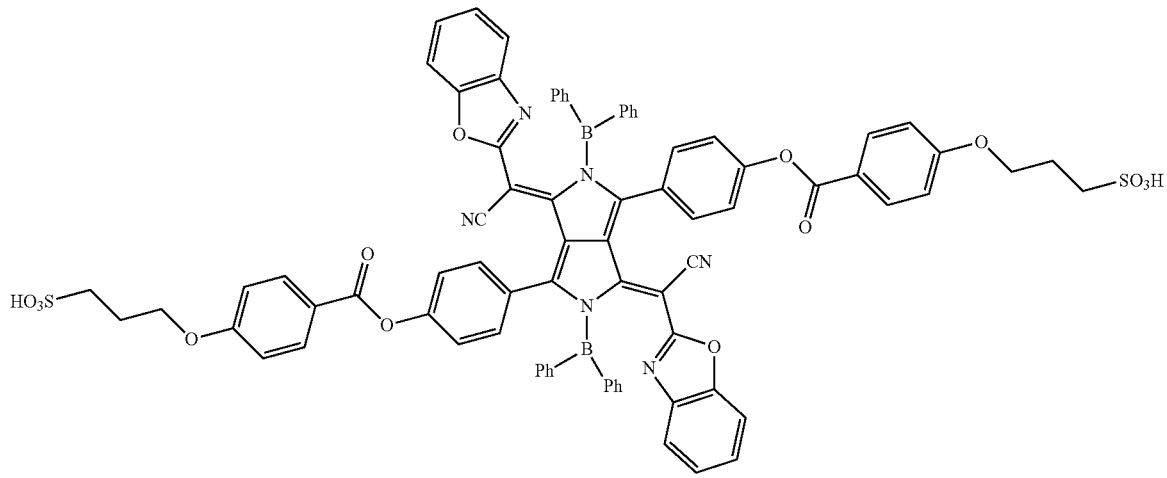

(4-115)

<Synthesis of Colorant Derivative (4-119)>

A colorant derivative (4-119) was synthesized using the same synthesis method as that of the colorant derivative (4-4), except that raw materials were changed.

A peak of molecular weight of 1,412.4 was observed by MALDI-MS, and the obtained compound was identified as the colorant derivative (4-119).

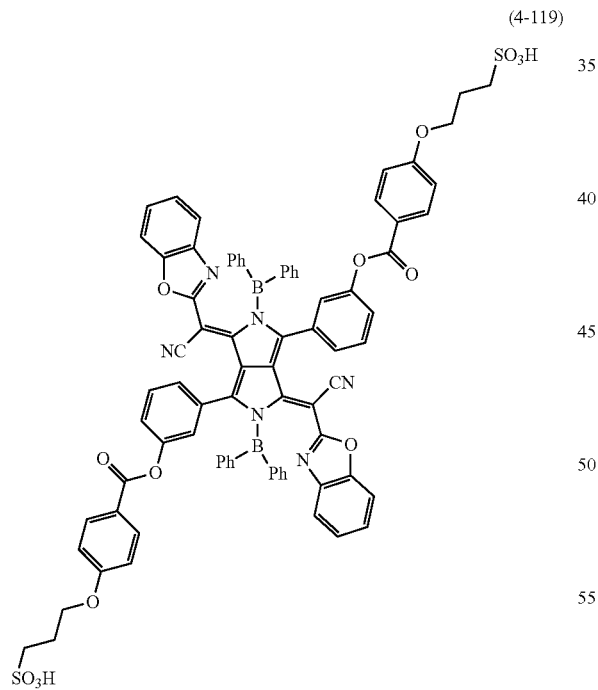

(4-119)

<Synthesis of Colorant Derivative (4-139)>

A colorant derivative (4-139) was synthesized using the same synthesis method as that of the colorant derivative (4-4), except that raw materials were changed.

A peak of molecular weight of 1,550.3 was observed by MALDI-MS, and the obtained compound was identified as the colorant derivative (4-139).

(4-139)

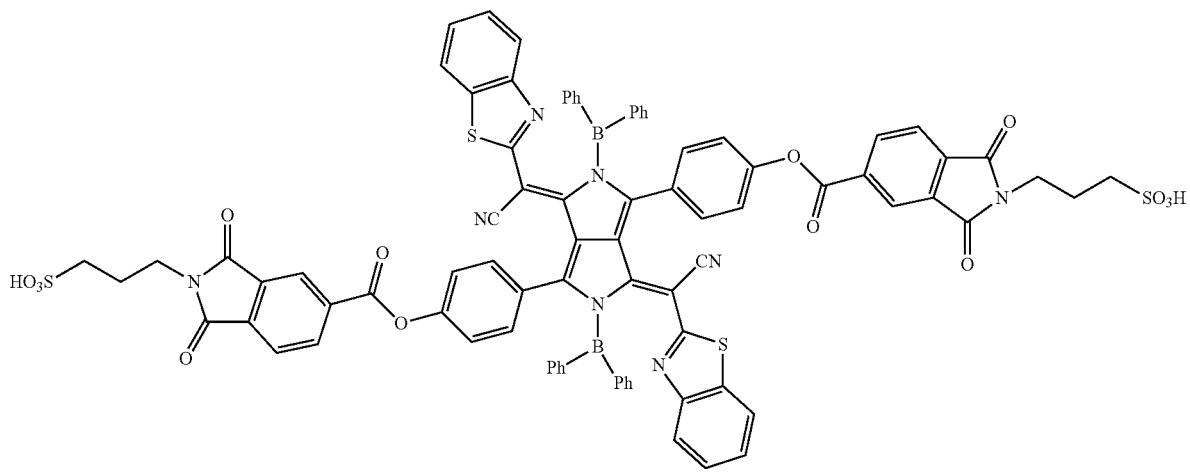

Examples 1 to 73 and Comparative Examples 1 to 5

<Preparation of Composition (Dispersion)>

10 parts by mass of a compound represented by Formula (1) shown in the following Table 7, 7.8 parts by mass of a resin shown in the following Table 7, 150 parts by mass of a solvent shown in the following Table 7, and 230 parts by mass of zirconia beads having a diameter of 0.3 mm were mixed with each other, the mixture was dispersed using a paint shaker for 5 hours, and the beads were separated by filtration. As a result, a composition was manufactured.

In Example 54, 10 parts by mass of a compound 1-162, 10 parts by mass of a compound 1-262, and 15 parts by mass of a resin shown in the following table 5 were used.

In Example 55, 10 parts by mass of the compound 1-162, 10 parts by mass of a compound 1-86, and 15 parts by mass of a resin shown in the following table 5 were used.

In Example 56, 10 parts by mass of a compound 1-228, 10 parts by mass of the compound 1-86, and 15 parts by mass of a resin shown in the following table 5 were used.

In Example 57, 7 parts by mass of the compound 1-86, 7 parts by mass of a compound 1-126, 7 parts by mass of the compound 1-262, and 15 parts by mass of a resin shown in the following table 7 were used.

In Example 58, 3 parts by mass of a colorant derivative 3-1 shown below was further added before a dispersion treatment.

In Example 59, 3 parts by mass of a colorant derivative 3-4 shown below was further added before a dispersion treatment.

In Example 60, 3 parts by mass of a colorant derivative 4-25 shown below was further added before a dispersion treatment.

In Examples 61 and 72, 3 parts by mass of a colorant derivative 4-4 shown below was further added before a dispersion treatment.

In Example 62, 3 parts by mass of a colorant derivative 4-44 shown below was further added before a dispersion treatment.

In Example 63, 3 parts by mass of a colorant derivative 4-98 shown below was further added before a dispersion treatment.

In Example 64, 3 parts by mass of a colorant derivative 4-115 shown below was further added before a dispersion treatment.

In Example 65, 3 parts by mass of a colorant derivative 4-119 shown below was further added before a dispersion treatment.

In Examples 66 and 67.3 part by mass of a colorant derivative 4-139 shown below was further added before a dispersion treatment.

In Example 73, 5 parts by mass of the compound 1-262, 5 parts by mass of a compound A, 2.5 parts by mass of a compound B, and 10 parts by mass of a resin shown in the following Table 7 were used.

(3-1)

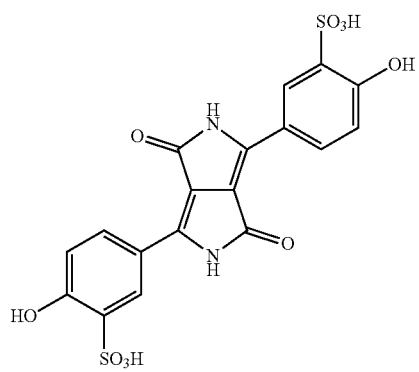

-continued
(3-4)
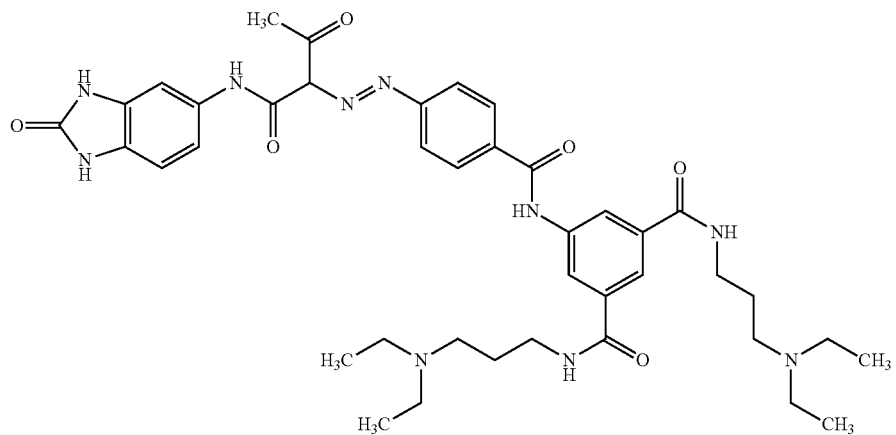
(4-4)
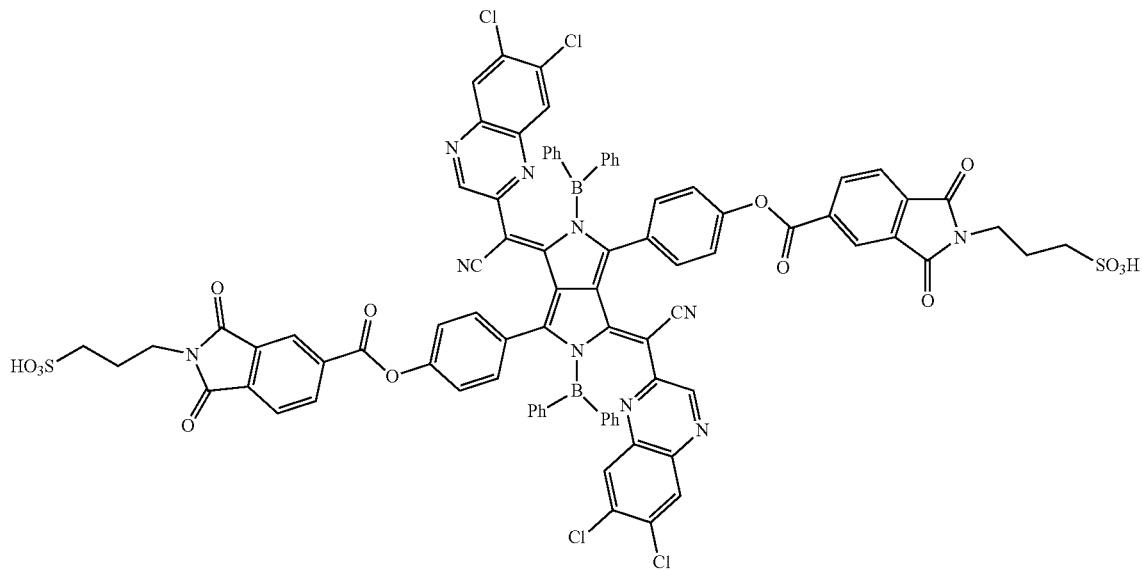
(4-25)
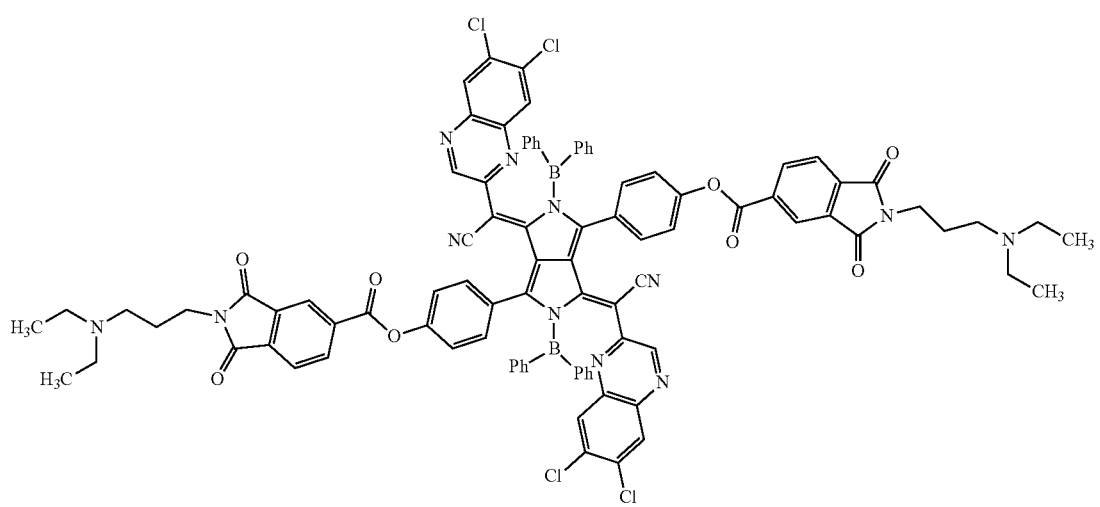

-continued
(4-44)
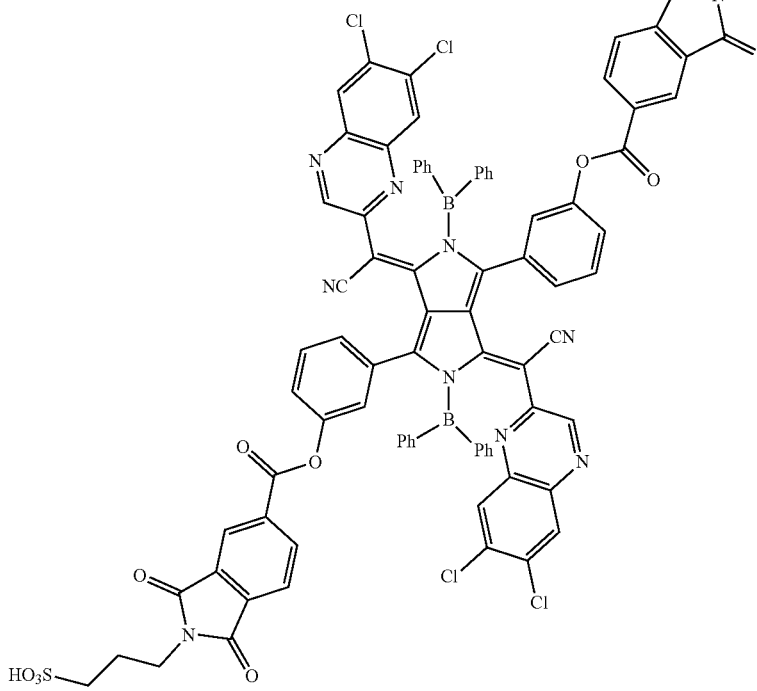
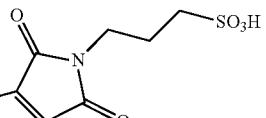
(4-98)
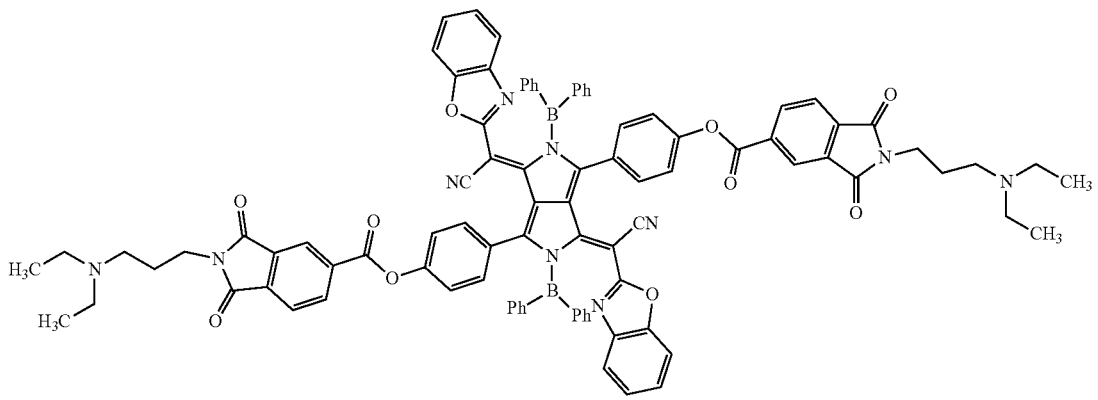
(4-115)
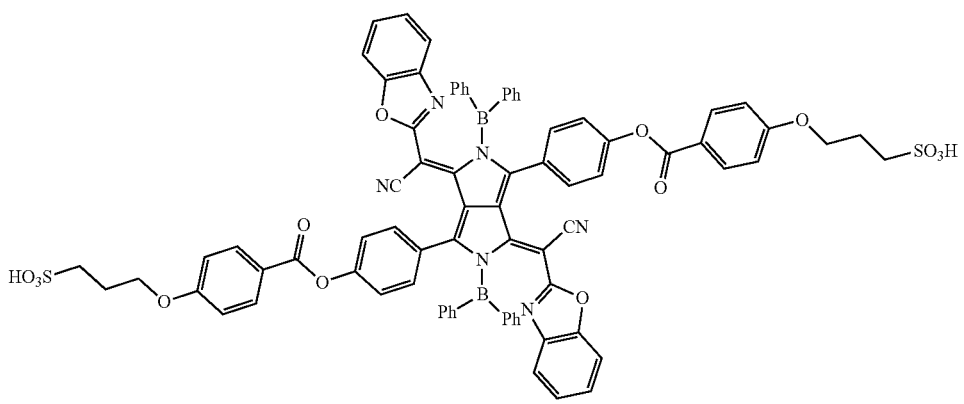

-continued
(4-119)
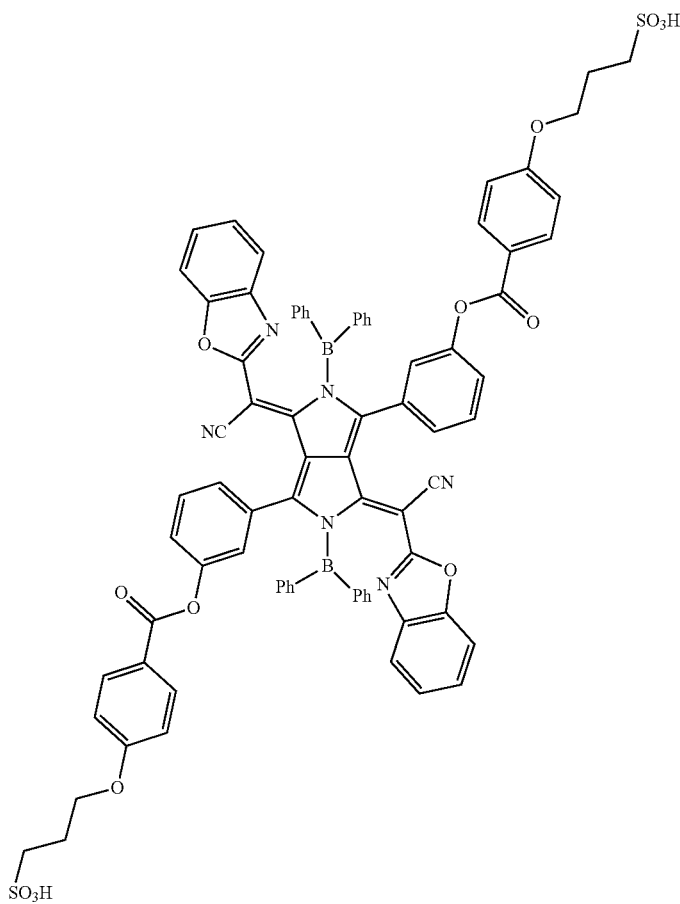
(4-139)
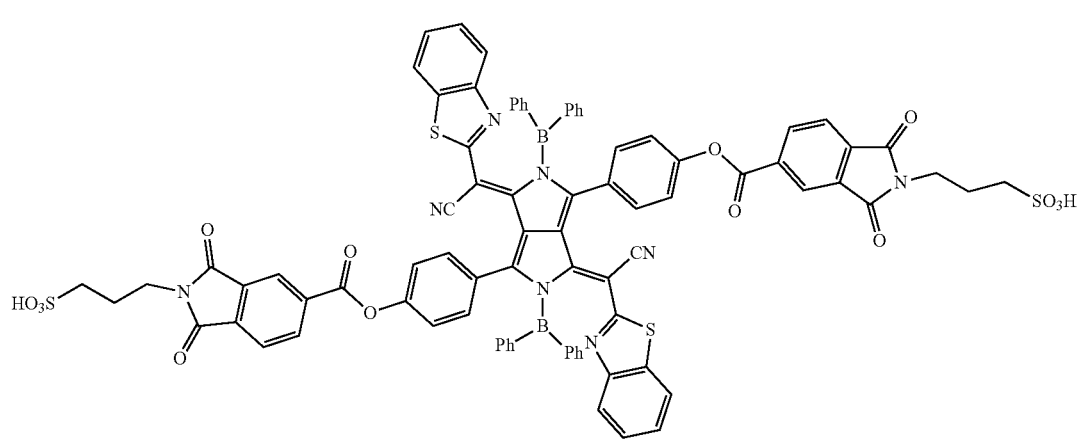

-continued

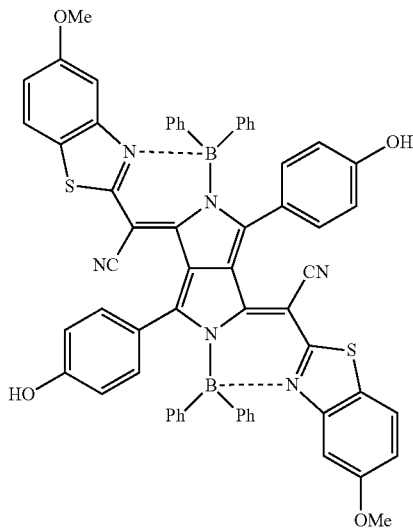
Compound A

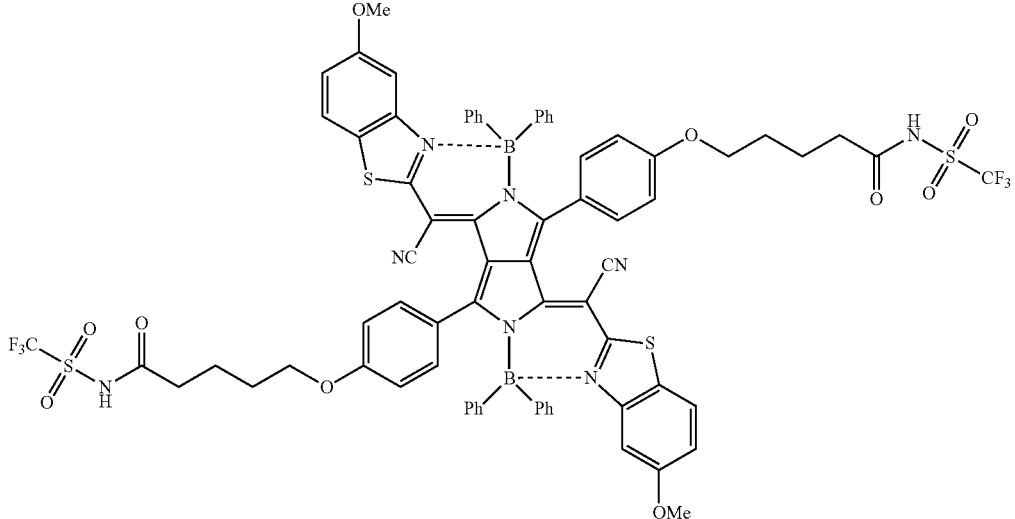
Compound B

| | TABLE 7 | | | | TABLE 7-continued | | |
|---|---|---|---|---|---|---|---|
| | Compound represented by Formula (1) | Solvent | Resin | | Compound represented by Formula (1) | Solvent | Resin |
| Example 1 | 1-69 | C-1 | D-1 | Example 22 | 1-140 | C-1 | D-1 |
| Example 2 | 1-70 | C-1 | D-1 | Example 23 | 1-148 | C-1 | D-1 |
| Example 3 | 1-81 | C-1 | D-1 | Example 24 | 1-159 | C-1 | D-1 |
| Example 4 | 1-85 | C-1 | D-1 | Example 25 | 1-162 | C-1 | D-1 |
| Example 5 | 1-86 | C-1 | D-1 | Example 26 | 1-163 | C-1 | D-1 |
| Example 6 | 1-92 | C-2 | D-1 | Example 27 | 1-166 | C-2 | D-1 |
| Example 7 | 1-94 | C-1 | D-1 | Example 28 | 1-168 | C-1 | D-1 |
| Example 8 | 1-99 | C-1 | D-1 | Example 29 | 1-169 | C-1 | D-1 |
| Example 9 | 1-100 | C-1 | D-1 | Example 30 | 1-170 | C-1 | D-1 |
| Example 10 | 1-103 | C-1 | D-1 | Example 31 | 1-176 | C-1 | D-1 |
| Example 11 | 1-21 | C-1 | D-1 | Example 32 | 1-177 | C-1 | D-1 |
| Example 12 | 1-27 | C-1 | D-1 | Example 33 | 1-221 | C-1 | D-1 |
| Example 13 | 1-28 | C-1 | D-1 | Example 34 | 1-228 | C-1 | D-1 |
| Example 14 | 1-32 | C-1 | D-1 | Example 35 | 1-229 | C-1 | D-1 |
| Example 15 | 1-37 | C-1 | D-1 | Example 36 | 1-232 | C-1 | D-1 |
| Example 16 | 1-43 | C-1 | D-1 | Example 37 | 1-234 | C-1 | D-1 |
| Example 17 | 1-44 | C-1 | D-1 | Example 38 | 1-235 | C-1 | D-1 |
| Example 18 | 1-51 | C-1 | D-1 | Example 39 | 1-245 | C-1 | D-1 |
| Example 19 | 1-126 | C-1 | D-1 | Example 40 | 1-256 | C-1 | D-1 |
| Example 20 | 1-127 | C-1 | D-1 | Example 41 | 1-257 | C-1 | D-1 |
| Example 21 | 1-139 | C-1 | D-1 | Example 42 | 1-262 | C-1 | D-1 |

TABLE 7-continued

| | Compound represented by Formula (1) | Solvent | Resin |
|---|---|---|---|
| Example 43 | 1-263 | C-1 | D-1 |
| Example 44 | 1-267 | C-1 | D-1 |
| Example 45 | 1-269 | C-1 | D-1 |
| Example 46 | 1-276 | C-1 | D-1 |
| Example 47 | 1-346 | C-1 | D-1 |
| Example 48 | 1-349 | C-1 | D-1 |
| Example 49 | 1-357 | C-1 | D-1 |
| Example 50 | 1-362 | C-2 | D-1 |
| Example 51 | 1-363 | C-1 | D-1 |
| Example 52 | 1-364 | C-1 | D-1 |
| Example 53 | 1-384 | C-1 | D-1 |
| Example 54 | 1-162/1-262 | C-1 | D-1 |
| Example 55 | 1-162/1-86 | C-1 | D-1 |
| Example 56 | 1-228/1-86 | C-1 | D-1 |
| Example 57 | 1-86/1-126/1-262 | C-1 | D-1 |
| Example 58 | 1-86 | C-1 | D-2 |
| Example 59 | 1-162 | C-1 | D-1 |
| Example 60 | 1-86 | C-1 | D-3 |
| Example 61 | 1-86 | C-1 | D-2 |
| Example 62 | 1-100 | C-1 | D-2 |
| Example 63 | 1-126 | C-1 | D-3 |
| Example 64 | 1-126 | C-1 | D-2 |
| Example 65 | 1-140 | C-1 | D-2 |
| Example 66 | 1-126 | C-1 | D-2 |
| Example 67 | 1-262 | C-1 | D-2 |
| Example 68 | 1-315 | C-1 | D-1 |

TABLE 7-continued

| | Compound represented by Formula (1) | Solvent | Resin |
|---|---|---|---|
| Example 69 | 1-317 | C-1 | D-1 |
| Example 70 | 1-319 | C-1 | D-1 |
| Example 71 | 1-321 | C-1 | D-1 |
| Example 72 | 1-86 | C-1 | D-4 |
| Example 73 | 1-262/Compound A/ Compound B | C-1 | D-4 |
| Comparative Example 1 | Comparative Compound A | C-1 | D-1 |
| Comparative Example 2 | Comparative Compound B | C-1 | D-1 |
| Comparative Example 3 | Comparative Compound C | C-1 | D-1 |
| Comparative Example 4 | Comparative Compound D | C-1 | D-1 |
| Comparative Example 5 | Comparative Compound E | C-1 | D-1 |

The raw materials shown above in Table 7 are as follows.

Compounds (1-1) to (1-385) are the same as the compounds (1-1) to (1-385) described above.

In addition, the compounds (1-21) to (1-321) are compounds having a solubility of 0 g/L to 0.1 g/L in propylene glycol monomethyl ether acetate at 5° C. and having a maximum absorption wavelength in a wavelength range of 700 nm to 1,200 nm.

Comparative Compound A

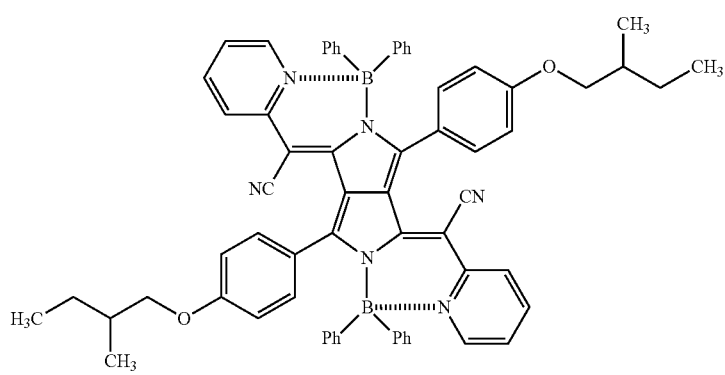

SP Value: 8.85 $(cal/cm^3)^{1/2}$

Comparative Compound B

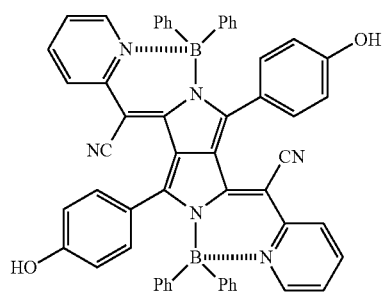

SP Value: 12.07 $(cal/cm^3)^{1/2}$

Comparative Compound C

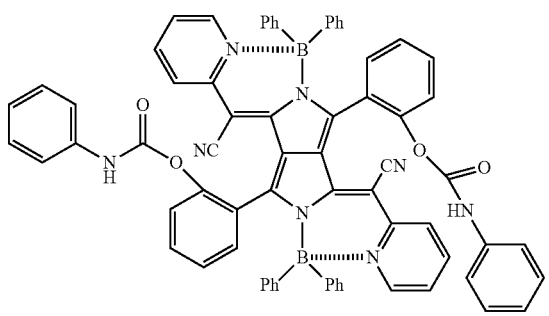

SP Value: 13.95 $(cal/cm^3)^{1/2}$

Comparative Compound D

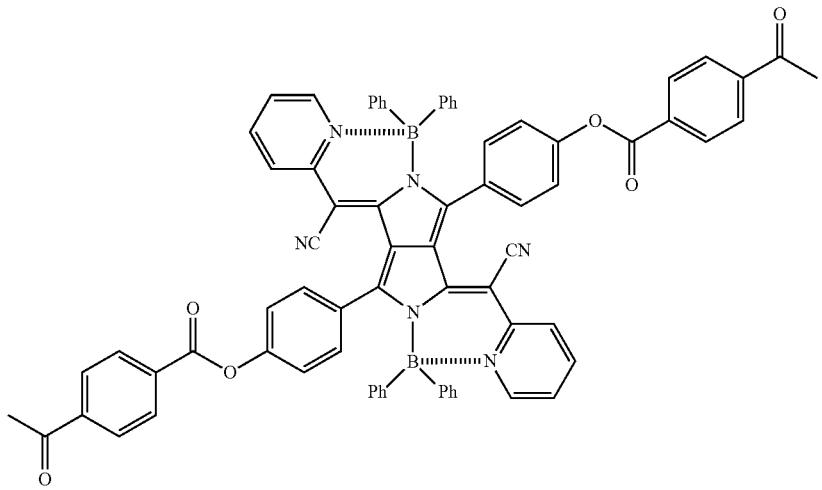

SP Value: 11.62 (cal/cm$^3$)$^{1/2}$

Comparative Compound E

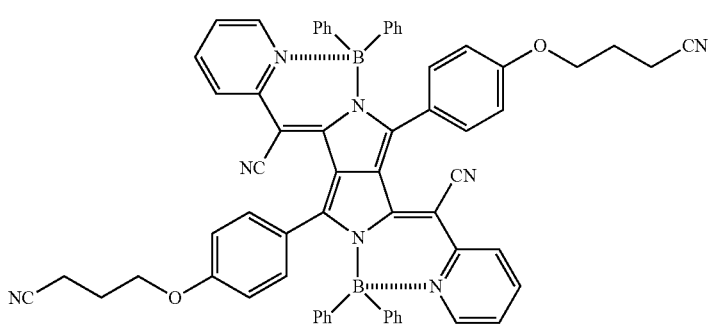

SP Value: 11.14 (cal/cm$^3$)$^{1/2}$

The SP value refers to the SP value of R$^1$ and R$^2$ in Formula (1) or a group at a position corresponding thereto.

(Resin)

D-1: a resin having the following structure (acid value=105 mgKOH/g, weight-average molecular weight=8,000; a numerical value added to a main chain represents a molar ratio of a repeating unit; a numerical value added to a side chain represents the number of repeating units)

D-2: a resin having the following structure (acid value=32.3 mgKOH/g, amine value=45.0 mgKOH/g, weight-average molecular weight=22,900; a numerical value added to a main chain represents a molar ratio of a repeating unit; a numerical value added to a side chain represents the number of repeating units)

D-3: a resin having the following structure (acid value=100 mgKOH/g, weight-average molecular weight=37,600; a numerical value added to a main chain represents a molar ratio of a repeating unit; a numerical value added to a side chain represents the number of repeating units)

D-4: a resin having the following structure (acid value=36.0 mgKOH/g, amine value=47.0 mgKOH/g, weight-average molecular weight=20,900; a numerical value added to a main chain represents a molar ratio of a repeating unit; a numerical value added to a side chain represents the number of repeating units)

(D-1)

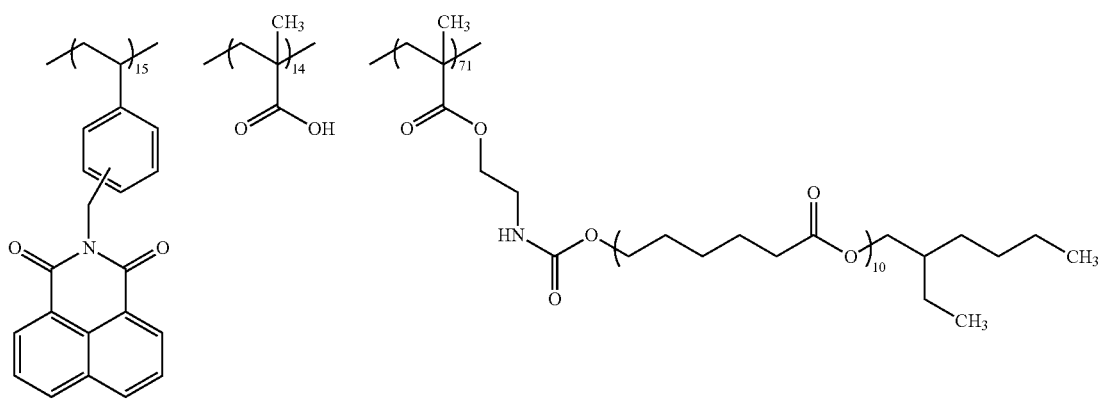

-continued

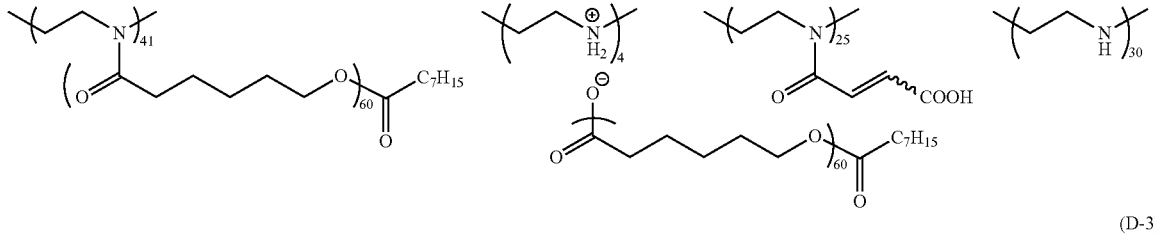
(D-2)

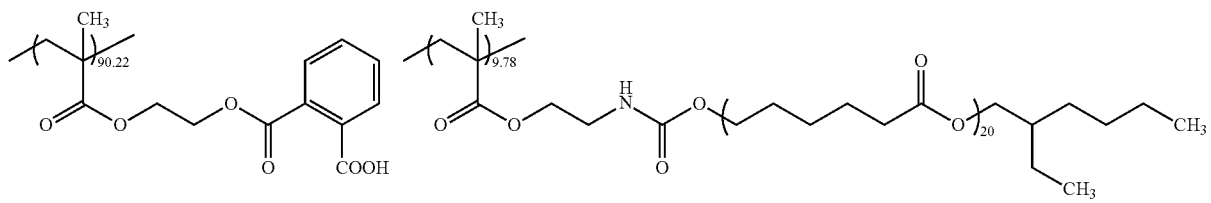
(D-3)

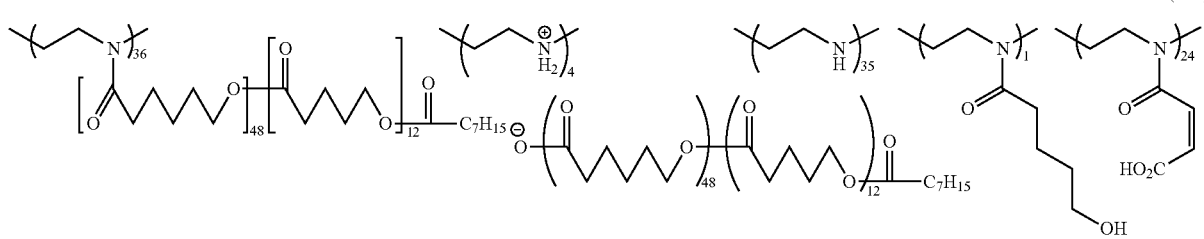
(D-4)

(Solvent)

C-1: propylene glycol monomethyl ether acetate (PG-MEA)

C-2: propylene glycol monomethyl ether (PGME)

Examples 101 to 171 and Comparative Examples 101 to 105

<Composition A>

The following components were mixed with each other to prepare a composition.

The composition (dispersion) obtained as described above: 55 parts by mass

Alkali-Soluble Resin (ACRYBASE FF-426, manufactured by Nippon Shokubai Co., Ltd.): 7.0 parts by mass Polymerizable compound (ARONIX M-305, a mixture of pentaerythritol triacrylate and pentaerythritol tetraacrylate, containing 55 mass % to 63 mass % of pentaerythritol triacrylate, manufactured by Toagosei Co., Ltd.): 4.5 parts by mass Photopolymerization initiator (IRGACURE OXE02, manufactured by BASF SE): 0.8 parts by mass Polymerization inhibitor (p-methoxyphenol): 0.001 parts by mass Surfactant W1 (the following mixture (Mw=14,000); in the following formula, "%" (62% and 38%) representing the proportion of a constitutional unit is mol %): 0.03 parts by mass Ultraviolet absorber (UV-503, manufactured by Daito Chemical Co., Ltd.): 1.3 parts by mass Solvent (propylene glycol monomethyl ether acetate): 31 parts by mass

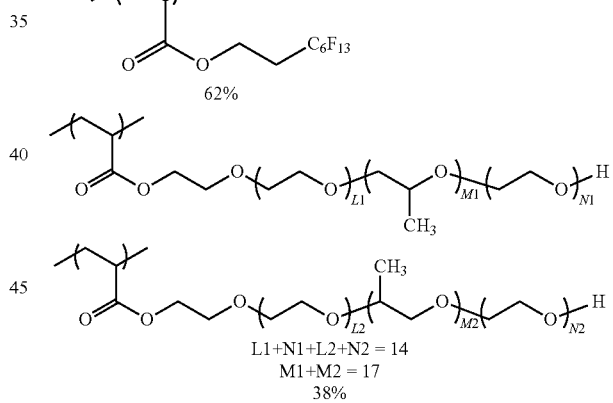

Examples 172

<Composition B>

The following components were mixed with each other to prepare a composition.

Composition (dispersion) obtained in Example 72: 55 parts by mass

Alkali-soluble resin (a resin having the following structure (a numerical value added to a main chain represents a molar ratio; Mw=40,000, acid value=100 mgKOH/g): 4.14 parts by mass Polymerizable Compound 1 (NK-ESTER A-TMMT, pentaerythritol tetraacrylate, manufactured by Shin-Nakamura Chemical Co., Ltd.): 4.18 parts by mass Polymerizable compound 2 (ARONIX M-510, manufactured by Toagosei Co., Ltd.): 4.18 parts by mass Photopolymerization initiator (IRGACURE OXE01, manufactured by BASF SE): 4.31 parts by mass
Polymerization inhibitor (p-methoxyphenol): 0.02 parts by mass
Surfactant W1: 0.12 parts by mass
Ultraviolet absorber UV1 (a diketone compound having the following structure): 8.0 parts by mass
Antioxidant (ADEKA STAB AO-80, manufactured by Adeka Corporation): 8.0 parts by mass
Solvent (propylene glycol monomethyl ether acetate): 31 parts by mass

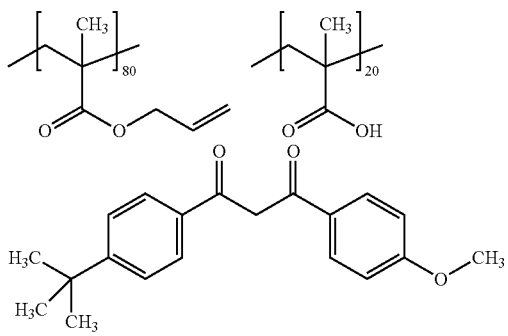

Example 173

In Example 172, a composition was prepared using the composition (dispersion) obtained in Example 73 instead of the composition (dispersion) obtained in Example 72.

<Preparation of Cured Film>

The composition was applied to a glass substrate using a spin coating method and then was heated using a hot plate at 100° C. for 2 minutes. As a result, a coating layer was obtained. The obtained coating layer was exposed using an i-ray stepper or an aligner at an exposure dose of 500 mJ/cm². Next, a curing treatment was further performed on the exposed coating layer using a hot plate at 220° C. for 5 minutes. As a result, a cured film having a thickness of 0.7 μm was obtained.

<Evaluation of Dispersibility>

(Viscosity)

Using an E-type viscometer, the viscosity of the composition (dispersion) at 25° C. was measured at a rotation speed of 1,000 rpm and was evaluated based on the following criteria.

As the viscosity decreases, the dispersibility becomes higher.

A: 1 mPa·s to 10 mPa·s
B: higher than 10 mPa·s and 50 mPa·s or lower
C: higher than 50 mPa·s and 200 mPa·s or lower
D: higher than 200 mPa·s (Particle Size)

The volume average particle size of the compound represented by Formula (1) in the composition (dispersion) was measured using MICROTRAC UPA 150 (manufactured by Nikkiso Co., Ltd.). As the average particle size decreases, the dispersibility becomes higher.

A: 5 nm to 50 nm
B: higher than 50 nm and 100 nm or lower
C: higher than 100 nm and 500 nm or lower
D: higher than 500 nm <Evaluation of Infrared Shielding Properties>

The transmittance of each of the cured films was measured using a spectrophotometer U-4100 (manufactured by Hitachi High-Technologies Corporation). The infrared shielding properties were evaluated based on the following criteria.

A: an average transmittance in a maximum absorption wavelength λmax±10 nm in a wavelength range of 700 nm to 1,000 nm was 10% or lower B: an average transmittance in a maximum absorption wavelength λmax±10 nm in a wavelength range of 700 nm to 1,000 nm was higher than 10% and 25% or lower C: an average transmittance in a maximum absorption wavelength λmax±10 nm in a wavelength range of 700 nm to 1,000 nm was higher than 25%

<Evaluation of Photolithographic Properties>

The composition obtained as described above was applied to a silicon wafer with an undercoat layer using a spin coating method such that the thickness after the application was 0.7 μm, and then was heated using a hot plate at 100° C. for 2 minutes. As a result, a composition layer was obtained. Next, using an i-ray stepper exposure device FPA-3000 i5+(manufactured by Canon Corporation), the obtained composition layer was exposed (an optimum exposure dose was selected such that the line width was 1.1 μm) through a mask having a 1.1 μm×1.1 μm Bayer pattern. Next, puddle development was performed on the exposed composition layer at 23° C. for 60 seconds using a tetramethylammonium hydroxide (TMAH) 0.3 mass % aqueous solution. Next, the silicon wafer was rinsed by spin showering and was cleaned with pure water. As a result, a pattern was obtained. The amount of residues remaining on the underlayer of the obtained pattern was evaluated by binarization of the image based on the following criteria.

A: the amount of the residues was lower than 1.5% with respect to the total area of the underlayer B: the amount of the residues was higher than 1.5% and 5% or lower with respect to the total area of the underlayer C: the amount of the residues was higher than 5% with respect to the total area of the underlayer The evaluation results are collectively shown in Table 8.

TABLE 8

| | | Dispersibility | | Infrared Absorbing Properties | Photolithographic Properties |
|---|---|---|---|---|---|
| | Composition Used | Viscosity | Particle Size | | |
| Example 101 | Example 1 | B | B | B | A |
| Example 102 | Example 2 | C | B | B | A |
| Example 103 | Example 3 | B | B | B | A |
| Example 104 | Example 4 | B | B | A | A |
| Example 105 | Example 5 | B | B | A | A |
| Example 106 | Example 6 | B | B | A | A |
| Example 107 | Example 7 | B | B | A | A |
| Example 108 | Example 8 | B | B | A | A |
| Example 109 | Example 9 | B | B | A | A |
| Example 110 | Example 10 | C | B | A | A |
| Example 111 | Example 11 | B | B | B | A |
| Example 112 | Example 12 | B | B | A | A |

TABLE 8-continued

| Composition Used | | Dispersibility | | Infrared Absorbing Properties | Photolithographic Properties |
|---|---|---|---|---|---|
| | | Viscosity | Particle Size | | |
| Example 113 | Example 13 | B | B | A | A |
| Example 114 | Example 14 | B | B | A | A |
| Example 115 | Example 15 | B | B | B | A |
| Example 116 | Example 16 | B | B | A | A |
| Example 117 | Example 17 | B | B | A | A |
| Example 118 | Example 18 | B | B | A | A |
| Example 119 | Example 19 | B | B | A | A |
| Example 120 | Example 20 | B | B | A | A |
| Example 121 | Example 21 | B | B | A | A |
| Example 122 | Example 22 | B | B | A | A |
| Example 123 | Example 23 | B | B | B | A |
| Example 124 | Example 24 | B | B | B | A |
| Example 125 | Example 25 | B | B | A | A |
| Example 126 | Example 26 | B | B | A | A |
| Example 127 | Example 27 | B | B | A | A |
| Example 128 | Example 28 | B | B | A | A |
| Example 129 | Example 29 | C | B | A | A |
| Example 130 | Example 30 | B | B | A | A |
| Example 131 | Example 31 | B | B | A | A |
| Example 132 | Example 32 | B | B | A | A |
| Example 133 | Example 33 | B | B | B | A |
| Example 134 | Example 34 | B | B | A | A |
| Example 135 | Example 35 | B | B | A | A |
| Example 136 | Example 36 | B | B | A | A |
| Example 137 | Example 37 | B | B | A | A |
| Example 138 | Example 38 | B | B | A | A |
| Example 139 | Example 39 | B | B | B | A |
| Example 140 | Example 40 | B | B | B | A |
| Example 141 | Example 41 | B | B | B | A |
| Example 142 | Example 42 | B | B | A | A |
| Example 143 | Example 43 | B | B | A | A |
| Example 144 | Example 44 | C | B | A | A |
| Example 145 | Example 45 | C | B | A | A |
| Example 146 | Example 46 | B | B | A | A |
| Example 147 | Example 47 | B | B | A | A |
| Example 148 | Example 48 | B | B | A | A |
| Example 149 | Example 49 | B | B | A | A |
| Example 150 | Example 50 | B | B | A | A |
| Example 151 | Example 51 | B | B | A | A |
| Example 152 | Example 52 | B | B | A | A |
| Example 153 | Example 53 | B | B | A | A |
| Example 154 | Example 54 | B | B | A | A |
| Example 155 | Example 55 | B | B | A | A |
| Example 156 | Example 56 | B | B | A | A |
| Example 157 | Example 57 | B | B | A | A |
| Example 158 | Example 58 | B | A | A | A |
| Example 159 | Example 59 | B | A | A | A |
| Example 160 | Example 60 | A | A | A | A |
| Example 161 | Example 61 | A | A | A | A |
| Example 162 | Example 62 | A | A | A | A |
| Example 163 | Example 63 | A | A | A | A |
| Example 164 | Example 64 | A | A | A | A |
| Example 165 | Example 65 | A | A | A | A |
| Example 166 | Example 66 | A | A | A | A |
| Example 167 | Example 67 | A | A | A | A |
| Example 168 | Example 68 | B | B | B | A |
| Example 169 | Example 69 | B | B | B | A |
| Example 170 | Example 70 | B | B | A | A |
| Example 171 | Example 71 | C | B | B | A |
| Example 172 | Example 72 | A | A | A | A |
| Example 173 | Example 73 | A | A | A | A |
| Comparative Example 101 | Comparative Example 1 | D | D | B | C |
| Comparative Example 102 | Comparative Example 2 | D | D | B | B |
| Comparative Example 103 | Comparative Example 3 | D | D | B | B |
| Comparative Example 104 | Comparative Example 4 | D | D | B | B |
| Comparative Example 105 | Comparative Example 5 | D | D | B | B |

Examples 174 and 175

In Example 105, even in a case where 2 parts by mass of the following compound C was further added to the composition according to Example 5, the same effects as those of Example 105 were obtained. (Example 174)

In addition, in Example 125, even in a case where 2 parts by mass of the following compound D was further added to the composition according to Example 25, the same effects as those of Example 125 were obtained. (Example 175)

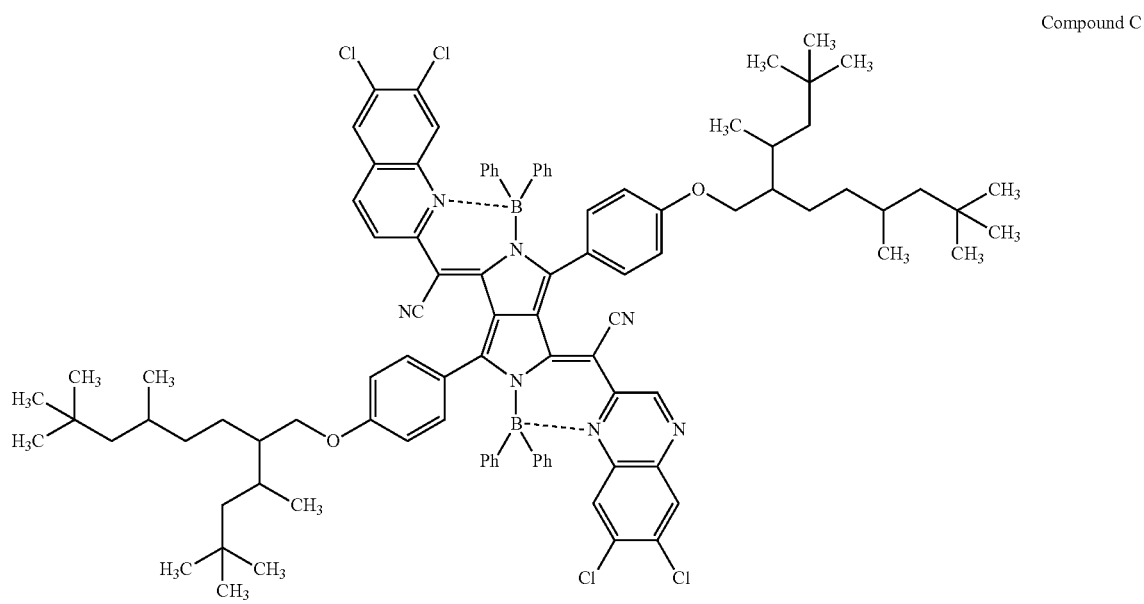

Compound C

-continued

Compound D

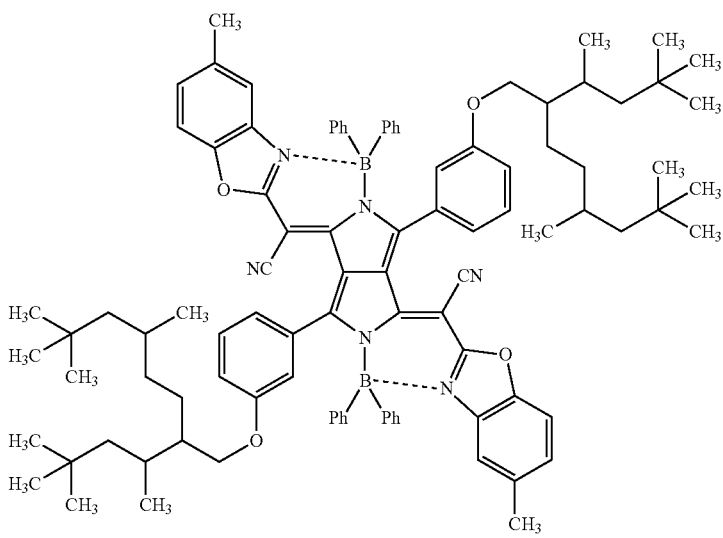

Example 176

In Example 173, even in a case where the following compound was used instead as the photopolymerization initiator, the same effects were obtained.

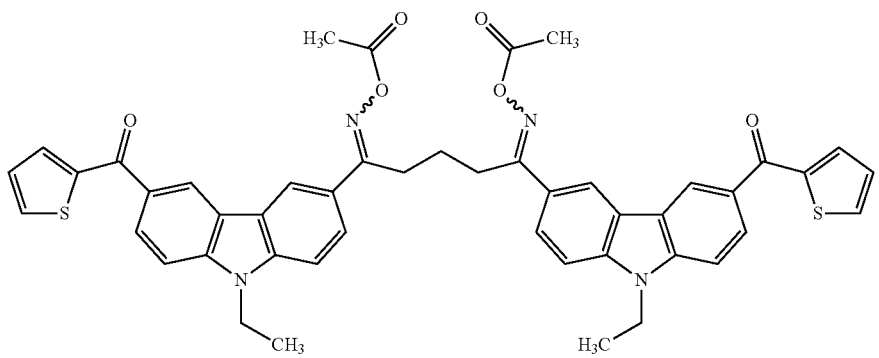 [SMILES: CCn1c2ccc(C(=O)c3cccs3)cc2c2cc(C(CCCC(=NOC(C)=O)c3ccc4c(c3)c3cc(C(=O)c5cccs5)ccc3n4CC)=NOC(C)=O)ccc21]

Example 201

(Preparation of Composition 1 for Forming Infrared Transmitting Filter)
The following composition was mixed and stirred, and the obtained mixture was filtered through a nylon filter (manufactured by Pall Corporation) having a pore size of 0.45 μm to prepare a composition 1 for forming an infrared transmitting filter.
(Composition 201)
Pigment dispersion 10-1: 46.5 parts by mass
Pigment dispersion 10-2: 37.1 parts by mass
Polymerizable compound 201: 1.8 parts by mass
Resin 201: 1.1 parts by mass
Photopolymerization initiator 201: 0.9 parts by mass
Surfactant 101: 4.2 parts by mass
Polymerization inhibitor (para-methoxyphenol): 0.001 parts by mass
Silane coupling agent 201: 0.6 parts by mass
PGMEA: 7.8 parts by mass (Pigment Dispersion 10-1)
A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a pigment dispersion 10-1 was prepared.
A mixed pigment including a red pigment (C.I. Pigment Red 254) and a yellow pigment (C.I. Pigment Yellow 139): 11.8 parts by mass
Resin (Disperbyk-111, manufactured by BYK Chemie): 9.1 parts by mass
PGMEA: 79.1 parts by mass
(Pigment Dispersion 10-2)
A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a pigment dispersion 10-2 was prepared.
A mixed pigment including a blue pigment (C.I. Pigment Blue 15:6) and a violet pigment (C.I. Pigment Violet 23): 12.6 parts by mass Resin (Disperbyk-111, manufactured by BYK Chemie): 2.0 parts by mass
Resin 202: 3.3 parts by mass
Cyclohexanone: 31.2 parts by mass
PGMEA: 50.9 parts by mass
Polymerizable compound 201: the following structure (a mixture in which a molar ratio between a left compound and a right compound is 7:3)

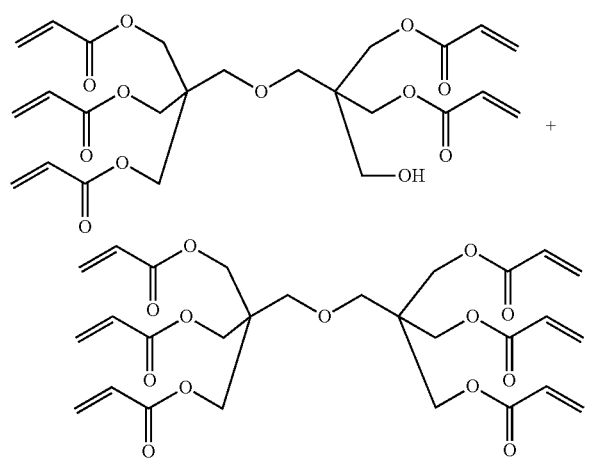

Resin 201: a resin having the following structure (acid value: 70 mgKOH/g, Mw=1 1,000; a ratio in each constitutional unit is a molar ratio)

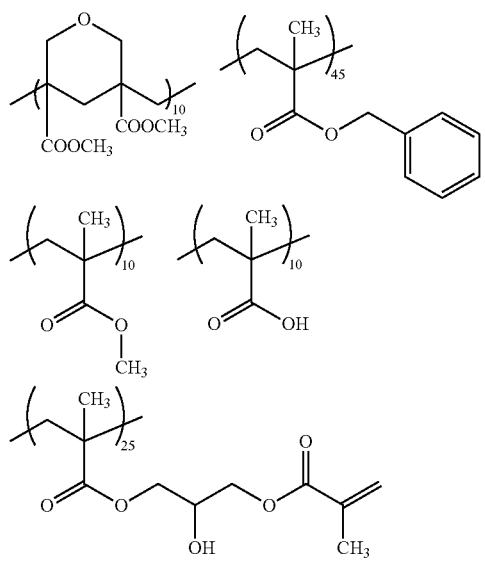

Resin 202: a resin (Mw: 14,000) having the following structure

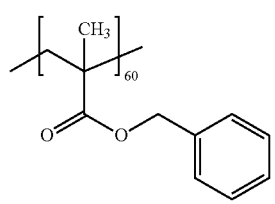

Photopolymerization initiator 201: a compound having the following structure

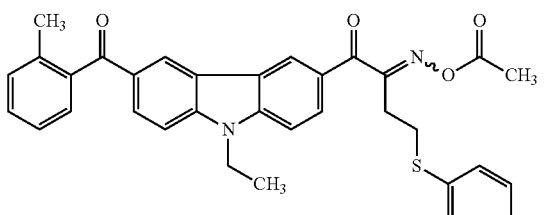

Silane coupling agent 201: a compound having the following structure

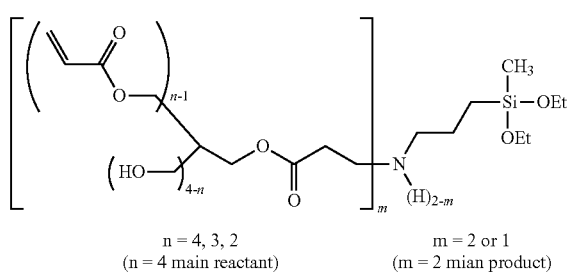

n = 4, 3, 2
(n = 4 main reactant)

m = 2 or 1
(m = 2 mian product)

(Pattern Formation 1)

The composition according to Example 142 was applied to a silicon wafer using a spin coating method such that the thickness of the formed film was 1.0 μm, was heated using a hot plate at 100° C. for 2 minutes, and then was heated using a hot plate at 200° C. for 5 minutes. Next, a 2 μm Bayer pattern (infrared cut filter) was formed using a dry etching method.

The Bayer pattern refers to a pattern in which color filter elements including one Red element, two Green elements, and one Blue element were repeated in a 2×2 array as disclosed in U.S. Pat. No. 3,971,065A. In the example, color filter elements including one Red element, one Green element, one Blue element, and one infrared transmitting filter element were repeated in a 2×2 array to form a Bayer pattern.

Next, the Red composition was applied to the Bayer pattern of the infrared cut filter using a spin coating method such that the thickness of the formed film was 1.0 μm. Next, the coating film was heated using a hot plate at 100° C. for 2 minutes. Next, using an i-ray stepper exposure device FPA-3000 i5+(manufactured by Canon Corporation), a 2 μm dot pattern was exposed through a mask at 1,000 mJ/cm². Next, puddle development was performed at 23° C. for 60 seconds using a tetramethylammonium hydroxide (TMAH) 0.3 mass % aqueous solution. Next, the silicon wafer was rinsed by spin showering, was cleaned with pure water, and was heated using a hot plate at 200° C. for 5 minutes. As a result, a cured film of the Red composition was patterned on the Bayer pattern of the infrared cut filter. Likewise, a cured film of the Green composition and a cured film of the Blue composition were sequentially patterned to form red, blue, and green color patterns.

Next, the composition 1 for forming an infrared transmitting filter having the composition 201 was applied to the pattern-formed film using a spin coating method such that the thickness of the formed film was 2.0 μm. Next, the coating film was heated using a hot plate at 100° C. for 2 minutes. Next, using an i-ray stepper exposure device FPA-3000 i5+(manufactured by Canon Corporation), a 2 μm Bayer pattern was exposed through a mask at 1,000 mJ/cm$^2$. Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the infrared transmitting filter was patterned on a portion of the Bayer pattern of the infrared cut filter where the color pattern was not formed. This filter was incorporated into a solid image pickup element using a well-known method The obtained solid image pickup element was irradiated with light having an emission wavelength of 850 nm emitted from an infrared light emitting diode (infrared LED) light source in a low-illuminance environment (0.001 Lux) to obtain an image. The image as the subject was able to be clearly recognized on the image.

Example 202

In the composition 201, even in a case where the following compound was used instead as the photopolymerization initiator 201, the same effects were obtained.

factured by Pall Corporation) having a pore size of 0.45 μm to prepare a composition 2 for forming an infrared transmitting filter.

(Composition 203)
Colorant dispersion 1: 1000 parts by mass
Dipentaerythritol hexaacrylate: 50 parts by mass
PGMEA solution (concentration of solid contents: 35 mass %) of resin E-1: 17 parts by mass
1-[4-(phenylthio)]-1,2-octanedione-2-(O-benzoyloxime): 10 parts by mass
PGMEA: 174 parts by mass Synthesis Example of Resin E-1

In a reaction vessel, 14 parts of benzyl methacrylate, 12 parts of N-phenylmaleimide, 15 parts of 2-hydroxyethyl methacrylate, 10 parts of styrene, and 20 parts of methacrylic acid were dissolved in 200 parts of propylene glycol monomethyl ether acetate, and 3 parts of 2,2'-azoisobutyronitrile and 5 parts of α-methylstyrene dimer were further put thereinto. After nitrogen purge, the inside of the reaction vessel was heated at 80° C. for 5 hours under stirring and nitrogen bubbling. As a result, a solution (concentration of solid contents: 35 mass %) including an alkali-soluble polymer (resin E-1) was obtained. In this polymer, the weight-average molecular weight in terms of polystyrene was 9,700, the number-average molecular weight was 5,700, and Mw/Mn was 1.70.

<Preparation of Colorant Dispersion 1>
60 parts of C.I. Pigment Black 32, 20 parts of C.I. Pigment Blue 15:6, 20 parts of C.I. Pigment Yellow 139, 80 parts by mass of SOLSPERSE 76500 (manufactured by Lubrication Technology Inc., concentration of solid contents: 50 mass

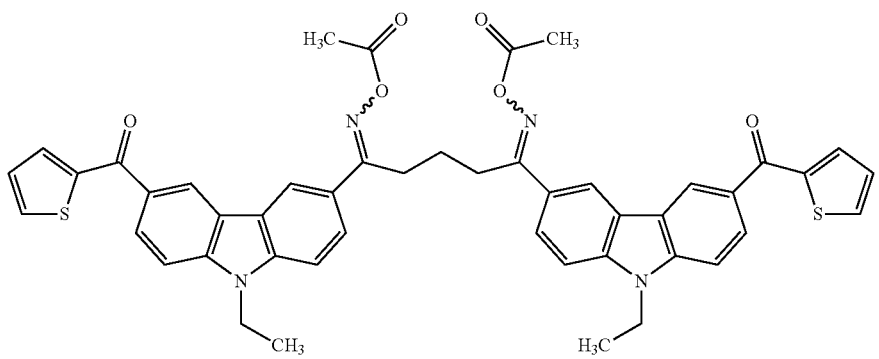 [SMILES: CCn1c2ccc(C(=O)c3cccs3)cc2c2cc(C(CCCC(=NOC(C)=O)c3ccc4c(c3)c3cc(C(=O)c5cccs5)ccc3n4CC)=NOC(C)=O)ccc21]

Example 203

(Pattern Formation 2)

A solid image pickup element was prepared using the same method as that of Example 201, except that a composition 2 for forming an infrared transmitting filter of the following composition 203 was used instead of the composition 1 for forming an infrared transmitting filter of the composition 201. Using the same method as that of Example 201, an image was acquired, and the image as the subject was able to be clearly recognized.

(Preparation of Composition 2 for Forming Infrared Transmitting Filter)

The following composition was mixed and stirred, and the obtained mixture was filtered through a nylon filter (manu- %), 120 parts (concentration of solid contents: 35 mass %) of the solution including the resin E-1, and 700 parts of propylene glycol monomethyl ether acetate were mixed with each other, and the obtained mixture was dispersed using a paint shaker for 8 hours. As a result, a colorant dispersion 1 was obtained.

Example 204

(Preparation of Composition 3 for Forming Infrared Transmitting Filter)

The following components were mixed and stirred, and the obtained mixture was filtered through a nylon filter (manufactured by Pall Corporation) having a pore size of 0.45 μm to prepare a curable composition 3 for forming an infrared transmitting filter.

Composition (dispersion) obtained in Example 73: 30.66 parts by mass
Dispersion B: 53.70 parts by mass
Alkali-soluble resin (a resin having the following structure; a numerical value added to a main chain represents a molar ratio; Mw=40,000, acid value=100 mgKOH/g): 1.39 parts by mass
Polymerizable Compound 1 (NK-ESTER A-TMMT, pentaerythritol tetraacrylate, manufactured by Shin-Nakamura Chemical Co., Ltd.): 2.94 parts by mass
Epoxy resin (EPICLON N-685, manufactured by DIC Corporation): 0.59 parts by mass The following components were mixed and stirred, and the obtained mixture was filtered through a nylon filter (manufactured by Pall Corporation) having a pore size of 0.45 μm to prepare a Red composition.
Red Pigment Dispersion: 51.7 parts by mass
Resin 102 (40% PGMEA solution): 0.6 parts by mass
Polymerizable compound 102: 0.6 parts by mass
Photopoiymerization initiator (IRGACURE OXE01, manufactured by BASF SE): 0.3 parts by mass
Surfactant 101: 4.2 parts by mass
PGMEA: 42.6 parts by mass
Polymerizable compound 102: the following compound

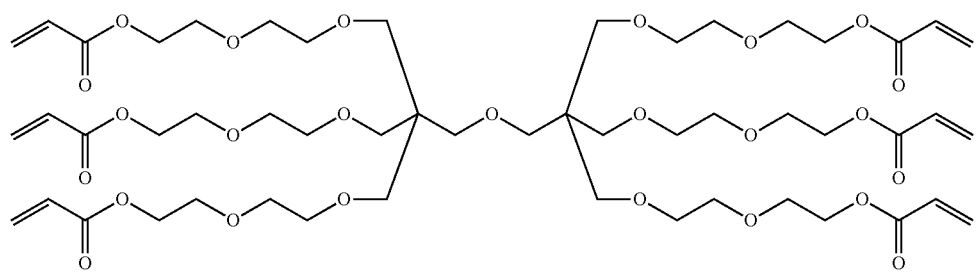

Photopolymerization initiator (IRGACURE OXE03, manufactured by BASF SE): 1.20 parts by mass
Polymerization inhibitor (para-methoxyphenol): 0.01 parts by mass
Surfactant W1: 0.05 parts by mass
Solvent (propylene glycol monomethyl ether acetate): 5.17 parts by mass

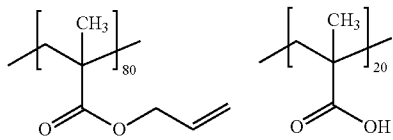

<Preparation of Dispersion B>
15.44 parts by mass of PR254, 15.44 parts by mass of PB15:6, 7.68 parts by mass of PY139, 16.8 parts by mass of a resin (D-4) shown in the following Table 5, 160 parts by mass of PGMEA, and 230 parts by mass of zirconia beads having a diameter of 0.3 mm were mixed with each other, the mixture was dispersed using a paint shaker for 5 hours, and the beads were separated by filtration. As a result, the dispersion B was manufactured.

<Preparation of Red Composition>
9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2,000 kg/cm³ at a flow rate of 500 g/min. This dispersing treatment was repeated 10 times.
As a result, a Red pigment dispersion was obtained.

Resin 102: a resin having the following structure (acid value=70 mgKOH/g, Mw=11,000, a numerical value added to a main chain represents a mass ratio of a repeating unit)

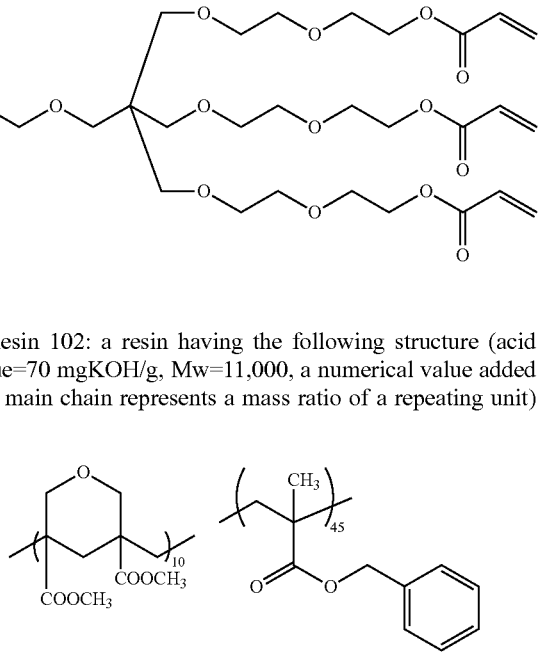

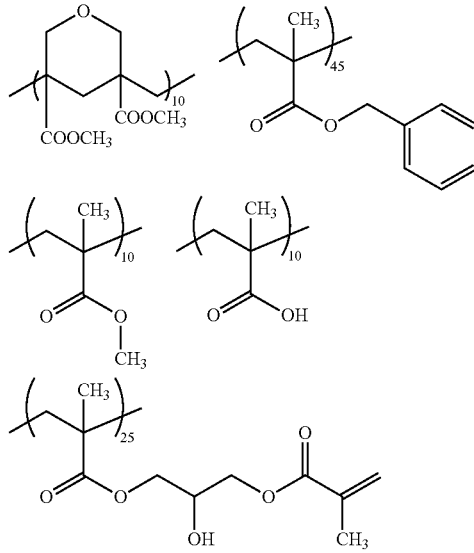

<Preparation of Green Composition>
6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2,000 kg/cm³ at a flow rate of 500 g/min.

This dispersing treatment was repeated 10 times. As a result, a Green pigment dispersion was obtained.

The following components were mixed and stirred, and the obtained mixture was filtered through a nylon filter (manufactured by Pall Corporation) having a pore size of 0.45 µm to prepare a Green composition.

Green pigment dispersion: 73.7 parts by mass
Resin 102 (40% PGMEA solution): 0.3 parts by mass
Polymerizable compound (KAYARAD DPHA, manufactured by Nippon Kayaku Co., Ltd.): 1.2 parts by mass
Photopolymerization initiator (IRGACURE OXE01, manufactured by BASF SE): 0.6 parts by mass
Surfactant 101: 4.2 parts by mass
Ultraviolet absorber (UV-503, manufactured by Daito Chemical Co., Ltd.): 0.5 parts by mass
PGMEA: 19.5 parts by mass <Preparation of Blue Composition>

9.7 parts by mass of C.I. Pigment Blue 15:6, 2.4 parts by mass of C.I. Pigment Violet 23, 5.5 parts by mass of a dispersant (Disperbyk-161 (manufactured by BYK Chemie)), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2,000 kg/cm³ at a flow rate of 500 g/min. This dispersing treatment was repeated 10 times.

As a result, a Blue pigment dispersion was obtained.

The following components were mixed and stirred, and the obtained mixture was filtered through a nylon filter (manufactured by Pall Corporation) having a pore size of 0.45 µm to prepare a Blue composition.

Blue pigment dispersion: 44.9 parts by mass
Resin 102 (40% PGMEA solution): 2.1 parts by mass
Polymerizable compound (KAYARAD DPHA, manufactured by Nippon Kayaku Co., Ltd.): 1.5 parts by mass
Polymerizable compound 102: 0.7 parts by mass
Photopolymerization initiator (IRGACURE OXE01, manufactured by BASF SE): 0.8 parts by mass
Surfactant 101: 4.2 parts by mass
PGMEA: 45.8 parts by mass <Pattern Formation>

The curable composition according to Example 61 was applied to a silicon wafer using a spin coating method such that the thickness of the formed film was 1.0 µm, was heated using a hot plate at 100° C. for 2 minutes, and then was heated using a hot plate at 200° C. for 5 minutes. Next, a 2 µm Bayer pattern (near infrared cut filter) was formed using a dry etching method.

In the example, filter elements including one Red element, one Green element, one Blue element, and one infrared transmitting filter element were repeated in a 2×2 array to form a Bayer pattern.

Next, the Red composition was applied to the Bayer pattern of the near infrared cut filter using a spin coating method such that the thickness of the formed film was 1.0 m. Next, the coating film was heated using a hot plate at 100° C. for 2 minutes. Next, using an i-ray stepper exposure device FPA-3000 i5+(manufactured by Canon Corporation), a 2 µm dot pattern was exposed through a mask at 1,000 mJ/cm². Next, puddle development was performed at 23° C. for 60 seconds using a tetramethylammonium hydroxide (TMAH) 0.3 mass % aqueous solution. Next, the silicon wafer was rinsed by spin showering, was cleaned with pure water, and was heated using a hot plate at 200° C. for 5 minutes. As a result, a cured film of the Red composition was patterned on the Bayer pattern of the near infrared cut filter. Likewise, a cured film of the Green composition and a cured film of the Blue composition were sequentially patterned to form red, blue, and green color patterns.

Next, the curable composition 3 for forming an infrared transmitting filter was applied to the pattern-formed film using a spin coating method such that the thickness of the formed film was 2.0 m. Next, the coating film was heated using a hot plate at 100° C. for 2 minutes. Next, using an i-ray stepper exposure device FPA-3000 i5+(manufactured by Canon Corporation), a 2 m Bayer pattern was exposed through a mask at 1,000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the infrared transmitting filter was patterned on a portion of the Bayer pattern of the near infrared cut filter where the color pattern was not formed. This filter was incorporated into a solid image pickup element using a well-known method Using the obtained solid image pickup element, a subject was irradiated with light having an emission wavelength of 940 nm emitted from an infrared light emitting diode (infrared LED) light source in a low-illuminance environment (0.001 Lux) to obtain an image. The object was able to be clearly recognized on the image.

The disclosure of Japanese Patent Application No. 2017-039706 filed on Mar. 2, 2017 is incorporated herein in its entirety.

All publications, patent applications, and technical standards mentioned in this specification are herein incorporated by reference to the same extent as if each individual publication, patent application, or technical standard was specifically and individually indicated to be incorporated by reference.

EXPLANATION OF REFERENCES

110: solid image pickup element
111: infrared cut filter
112: color filter
114: infrared transmitting filter
115: microlens
116: planarizing layer

What is claimed is:

1. A composition comprising:
a compound represented by the following Formula (1); and
at least one selected from the group consisting of a curable compound and a resin,

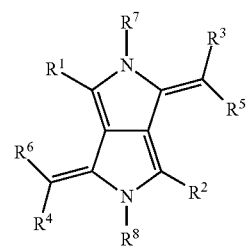

(1)

wherein, in Formula (1), $R^1$ and $R^2$ each independently represent a group represented by the following Formula (2) and having a solubility parameter of 12.2 (cal/cm$^3$)$^{1/2}$ or higher as a whole, $R^3$ to $R^6$ each independently represent a cyano group, an acyl group, an alkoxycarbonyl group, an alkyl group, an arylsulfinyl group, or a heteroaryl group, $R^7$ and $R^8$ each independently represent a hydrogen atom, an alkyl group, an aryl group, a heteroaryl group, —$BR^9R^{10}$, or a metal atom, at least one of $R^7$ or $R^8$ and at least one of $R^1$ to $R^4$ may form a covalent bond or a coordinate bond, $R^9$ and $R^{10}$ each independently represent a hydrogen atom, a halogen atom, an alkyl group, an aryl group, a heteroaryl group, an alkoxy group, an aryloxy group, or a heteroaryloxy group, and $R^9$ and $R^{10}$ may be bonded to each other to form a ring, and

  (2)

in Formula (2), $X^1$ represents a m-phenylene group, a p-phenylene group, a divalent fused polycyclic aromatic ring group in which two or more aromatic rings are fused, or a divalent heteroaromatic ring group, $L^1$ represents a single bond or a divalent linking group, $Y^1$ represents a polar group, and * represents a linking site to a pyrrolopyrrole ring in Formula (1).

2. The composition according to claim 1, wherein $Y^1$ represents a group having at least one structure selected from the group consisting of an N-substituted imide structure, an acid anhydride structure, a cyano group, an alkylsulfone group, an arylsulfone group, an alkylsulfoxide group, an arylsulfoxide group, an N-disubstituted sulfonamide group, and an N-disubstituted amide group.

3. The composition according to claim 1, further comprising:
a colorant derivative other than the compound represented by Formula (1).

4. The composition according to claim 1, wherein a viscosity at 25° C. is 1 mPa·s to 100 mPa·s.

5. The composition according to claim 1, wherein the compound represented by Formula (1) is in the form of particles.

6. The composition according to claim 5, wherein a volume average particle size of the compound represented by Formula (1) is 5 nm to 500 nm.

7. The composition according to claim 1, comprising:
a resin having a polyester chain as the resin.

8. The composition according to claim 1, comprising:
an alkali-soluble resin as the resin.

9. The composition according to claim 1, comprising:
the curable compound.

10. The composition according to claim 9, further comprising:
a polymerization initiator.

11. A film which is formed using the composition according to claim 1.

12. A film that is formed by curing the composition according to claim 9.

13. An infrared cut filter comprising:
the film according to claim 11.

14. A solid image pickup element comprising:
the film according to claim 11.

15. An infrared sensor comprising:
the film according to claim 11.

16. A camera module comprising:
a solid image pickup element; and
the infrared cut filter according to claim 13.

17. A compound represented by the following Formula (1),

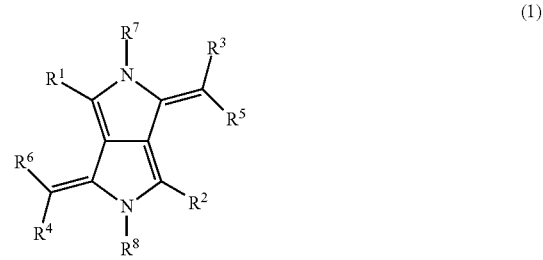  (1)

wherein, in Formula (1), $R^1$ and $R^2$ each independently represent a group represented by the following Formula (2) and having a solubility parameter of 12.2 (cal/cm$^3$)$^{1/2}$ or higher as a whole, $R^3$ to $R^6$ each independently represent a cyano group, an acyl group, an alkoxycarbonyl group, an alkyl group, an arylsulfinyl group, or a heteroaryl group, $R^7$ and $R^8$ each independently represent a hydrogen atom, an alkyl group, an aryl group, a heteroaryl group, —$BR^9R^{10}$, or a metal atom, at least one of $R^7$ or $R^8$ and at least one of $R^1$ to $R^4$ may form a covalent bond or a coordinate bond, $R^9$ and $R^{10}$ each independently represent a hydrogen atom, a halogen atom, an alkyl group, an aryl group, a heteroaryl group, an alkoxy group, an aryloxy group, or a heteroaryloxy group, and $R^9$ and $R^{10}$ may be bonded to each other to form a ring, and

  (2)

in Formula (2), $X^1$ represents a m-phenylene group, a p-phenylene group, a divalent fused polycyclic aromatic ring group in which two or more aromatic rings are fused, or a divalent heteroaromatic ring group, $L^1$ represents a single bond or a divalent linking group, $Y^1$ represents a polar group, and * represents a linking site to a pyrrolopyrrole ring in Formula (1).

* * * * *